(12) United States Patent
Balseanu et al.

(10) Patent No.: US 7,732,342 B2
(45) Date of Patent: Jun. 8, 2010

(54) METHOD TO INCREASE THE COMPRESSIVE STRESS OF PECVD SILICON NITRIDE FILMS

(75) Inventors: Mihaela Balseanu, Sunnyvale, CA (US); Li-Qun Xia, Santa Clara, CA (US); Vladimir Zubkov, Mountain View, CA (US); Mei-Yee Shek, Mountain View, CA (US); Isabelita Rolfox, Union City, CA (US); Hichem M'Saad, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 11/398,146

(22) Filed: Apr. 5, 2006

(65) Prior Publication Data

US 2006/0269692 A1    Nov. 30, 2006

Related U.S. Application Data

(60) Provisional application No. 60/685,365, filed on May 26, 2005, provisional application No. 60/701,854, filed on Jul. 21, 2005.

(51) Int. Cl.
*H01L 21/302* (2006.01)
(52) U.S. Cl. ............... 438/724; 438/706; 438/763; 427/535; 134/1.2
(58) Field of Classification Search ............ 438/706, 438/710, 712, 720, 724, 763; 427/535, 579; 134/1.2

See application file for complete search history.

(56) References Cited

U.S. PATENT DOCUMENTS

| 5,242,530 A | 9/1993 | Batey et al. |
| 5,817,562 A * | 10/1998 | Chang et al. ............ 438/305 |
| 6,387,207 B1 | 5/2002 | Janakirman et al. |

(Continued)

FOREIGN PATENT DOCUMENTS

JP          63-261571          10/1998

(Continued)

OTHER PUBLICATIONS

"Atomic layer controlled deposition of silicon nitride with self-limiting mechanism", Applied Physics Letters, AIP, American Institute of Physics, Melville NY, vol. 6, No. 23, Jun. 3, 1996, pp. 3257-3259.

(Continued)

*Primary Examiner*—Lan Vinh
(74) *Attorney, Agent, or Firm*—Townsend and Townsend and Crew

(57) ABSTRACT

Compressive stress in a film of a semiconductor device may be controlled utilizing one or more techniques, employed alone or in combination. A first set of embodiments increase silicon nitride compressive stress by adding hydrogen to the deposition chemistry, and reduce defects in a device fabricated with a high compressive stress silicon nitride film formed in the presence of hydrogen gas. A silicon nitride film may comprise an initiation layer formed in the absence of a hydrogen gas flow, underlying a high stress nitride layer formed in the presence of a hydrogen gas flow. A silicon nitride film formed in accordance with an embodiment of the present invention may exhibit a compressive stress of 2.8 GPa or higher.

13 Claims, 45 Drawing Sheets

U.S. PATENT DOCUMENTS

| | | | |
|---|---|---|---|
| 6,720,097 | B2 | 4/2004 | Ohwawa et al. |
| 6,759,100 | B2 | 7/2004 | Fukuda et al. |
| 6,808,991 | B1 * | 10/2004 | Tung .......................... 438/275 |
| 6,919,282 | B2 | 7/2005 | Sakama et al. |
| 6,929,831 | B2 * | 8/2005 | Patel et al. .................. 427/579 |
| 6,953,609 | B2 * | 10/2005 | Carollo ....................... 427/579 |
| 2002/0016084 | A1 * | 2/2002 | Todd ........................... 438/791 |
| 2002/0040847 | A1 * | 4/2002 | Ohmi et al. ............ 204/192.22 |
| 2002/0164890 | A1 | 11/2002 | Kwan et al. |
| 2002/0168828 | A1 * | 11/2002 | Cheng et al. ................ 438/303 |
| 2003/0228770 | A1 | 12/2003 | Lee et al. |
| 2004/0029323 | A1 | 2/2004 | Shimizu et al. |
| 2004/0175883 | A1 * | 9/2004 | Kim ............................ 438/244 |
| 2004/0266083 | A1 * | 12/2004 | Hareland et al. ............ 438/199 |
| 2006/0105106 | A1 | 5/2006 | Balseanu et al. |
| 2007/0007548 | A1 | 1/2007 | Conti et al. |

FOREIGN PATENT DOCUMENTS

| | | |
|---|---|---|
| JP | 2000-339837 | 12/2000 |
| WO | WO 2005-043623 A | 5/2005 |

OTHER PUBLICATIONS

Patil et al. "Deposition of Silicon films in presence of nitrogen plasma feasibility study", Bulletin of Materials Science Indian Acad. Sci. India, vol. 25, No. 5, Oct. 2002, pp. 399-402.

Saito et al. "A study of low temperature formation of stress-free silicon nitride films", Record of Electrical and Communication Engineering Converazione Tohoku University, Tokuku Univ. Japan, vol. 72, No. 1, Nov. 2003, pp. 302-303.

Dharmadhikari et a). "UV-assisted processing for advanced dielectric films", Solid State Technology, Mar. 2005 pp. 43-44,46,48.

Banerjee et al., "Characterization of CVD Deposited Amorphous Fluorocarbons for Low k Interlayer Dielectrics", 1 *Electrochem. Soc..* 146, 2219 (1999).

Charles, "Role of ions in SiO 2 deposition with pulsed and continuous helicon plasma", Pure And Applied Chemistry, 2002 -vol. 74, No. 3, pp. 401-405, 2002. IUPAC 401.

Cruden et al., "Thermal Decomposition of Low-k Pulsed Plasma Fluorocarbon Films. I. Effects of Precursors and Substrate Temperature", J. Electrochem. Soc. 146,4590 (1999).

Cruden et al., "Thermal Decomposition of Low-k Pulsed Plasma Fluorocarbon Films. II. Effect of Post-Deposition Annealing and Ambients", J. Electrochem. Soc. 146,4597 (1999).

Labelle et al., "Pulsed Plasma Enhanced Chemical Vapor Deposition from CH2F2, C2H2F4, and CHClF/" *T. Vac. Sci. Techno!. A,* 17,445 (1999).

Labelle et al., "Fourier Transform Infrared Spectroscopy of Effluents from Pulsed Plasmas of 1,I,2,2-Tetrafluoroethane, Hexafluoropropylene, and Difluoromethane", *T. Vac. Sci. Techno!. A.* 76, 3419 (1999).

Lau et al., "'Solid-State NMR of Low Dielectric Constant Films from Pulsed Hydrofluorocarbon Plasmas", *T. Electrochem. Soc..* 146,2652 (1999).

Limb et al.," Molecular Design of Fluorocarbon Film Architecture by Pulsed Plasma Enhanced and Pyrolytic Chemical Vapor Deposition", *Plasmas and Polymers* 4(1),21 (1999).

Ma et al. "Investigation on processing of industrial set-up plasma enhanced chemical vapor deposition with pulsed d.c. power", *Surface and Coatings Technology,* vol. 131, No. 1, Sep. 1, 2000, pp. 131-135(5).

Ma et al. "Parametric effects of residual stress in pulsed d.c. plasma enhanced CVD TiN coatings", *Surface & Coatings Technology,* vol. 142, 2001, pp. 1023-1027.

Pedrow "Deposition of Plasma-Polymerized Acetylene by an Intense Pulsed RF Plasma Source", IEEE Transactions on Plasma Science, 1990 vol. 18, No. 6. December 1990.

Smith, "Mechanism of $SiN_xH_y$ deposition from $N_2$-$SiH_4$ plasma" Journal of Vacuum Science & Technology B: Microelectronics and Nanometer Structures—May 1990—vol. 8, Issue 3, pp. 551-557.

U.S. Appl. No. 11/055,936 Tensile and Comp Ressive Stressed Materials for Semiconductor filed on Feb. 11, 2005.

* cited by examiner

Wafer Temperature = 430°C
(Heater Set-point = 500°C)

1. Gate stack deposition (gate dielectric and poly)

2. Litho to define the NMOS gate

3. NMOS poly pre-am orphization Ge implant/growth
- recess NMOS poly gate followed by selective SiGe deposition (may require oxide mask)
- b. Ge implantation in NMOS Poly 4. Gate etch/S/D Ext and Halo implant; Sacrificial spacer removal 5. Tensile nitride dep (pre-RTP)

6. Litho and Etch to remove the nitride from the PMOS side

7. Selective removal over PMOS

8. RTP spike or soak anneal / DSA to activate dopants; re-crystalize poly-silicon and increase the nitride stress to 2.0GPa (any other annealing method)

9. Spacer nitride deposition (neutral or compressive stress) with or w/o a pre-oxide layer 10. Litho and etch to remove the nitride from NMOS side 11. Nitride etch from NMOS side (only last layer - compressive or neutral)

12. Spacer etch

13. Dual stresses layer integration from this point on

METHOD TO INCREASE THE COMPRESSIVE STRESS OF PECVD SILICON NITRIDE FILMS

CROSS-REFERENCE TO RELATED APPLICATION

This instant nonprovisional application claims priority to commonly assigned U.S. patent application Ser. No. 60/685,365, filed on May 26, 2005 and U.S. patent application Ser. No. 60/701,854, filed on Jul. 21, 2005, the entire disclosure of which is incorporated herein by reference.

BACKGROUND OF THE INVENTION

In the processing of a substrate to fabricate circuits and displays, the substrate is typically exposed to an energized process gas capable of depositing or etching material on the substrate. In chemical vapor deposition (CVD) processes, process gas energized by a high frequency voltage or microwave energy is used to deposit material on the substrate, which may be a layer, a filling of contact holes, or other selective deposition structures. The deposited layer can be etched or otherwise processed to form active and passive devices on the substrate, such as for example, metal-oxide-semiconductor field effect transistors (MOSFETs) and other devices. A MOSFET typically has a source region, a drain region, and a channel region between the source and drain. In the MOSFET device, a gate electrode is formed above and separated from the channel by a gate dielectric to control conduction between the source and drain.

The performance of such devices can be improved by, for example, reducing supply voltage, gate dielectric thickness, or channel length. However, such conventional methods face mounting problems as the size and spacing of the devices become ever smaller. For example, at very small channel lengths, the advantages of reducing channel length to increase the number of transistors per unit area and saturation current are offset by undesirable carrier velocity saturation effects. Similar benefits which are obtained from reducing gate dielectric thickness, such as decreased gate delay, are limited in small devices by increased gate leakage current and charge tunneling through the dielectric which can damage the transistor over time. Reducing supply voltage allows lower operating power levels but such reductions are also limited by the threshold voltage of the transistor.

In a relatively newly developed method of enhancing transistor performance, the atomic lattice of a deposited material is stressed to improve the electrical properties of the material itself, or of underlying or overlying material that is strained by the force applied by a stressed deposited material. Lattice strain can increase the carrier mobility of semiconductors, such as silicon, thereby increasing the saturation current of the doped silicon transistors to thereby improve their performance. For example, localized lattice strain can be induced in the channel region of the transistor by the deposition of component materials of the transistor which have internal compressive or tensile stresses. For example, silicon nitride materials used as etch stop materials and spacers for the silicide materials of a gate electrode can be deposited as stressed materials which induce a strain in the channel region of a transistor. The type of stress desirable in the deposited material depends upon the nature of the material being stressed. For example, in CMOS device fabrication, negative-channel (NMOS) doped regions are covered with a tensile stressed material having positive tensile stress; whereas positive channel MOS (PMOS) doped regions are covered with a compressive stressed material having negative stress values.

Thus, it is desirable to form stressed materials that have predetermined types of stresses, such as tensile or compressive stresses. It is further desirable to control the level of stress generated in the deposited material. It is also desirable to deposit such stressed materials to generate uniform localized stresses or strains in the substrate. It is also desirable to have a process that can form stressed materials over active or passive devices on the substrate without damaging the devices. It is still further desirable that the deposited films be highly conformal to underlying topography.

BRIEF SUMMARY OF THE INVENTION

A plurality of techniques may be employed alone or in combination, to form stressed films having desirable properties. Compressive stress in a film of a semiconductor device may be controlled utilizing one or more techniques, employed alone or in combination. A first set of embodiments increase silicon nitride compressive stress by adding hydrogen to the deposition chemistry, and reduce defects in a device fabricated with a high compressive stress silicon nitride film formed in the presence of hydrogen gas. A silicon nitride film may comprise an initiation layer formed in the absence of a hydrogen gas flow, underlying a high stress nitride layer formed in the presence of a hydrogen gas flow. A silicon nitride film formed in accordance with an embodiment of the present invention may exhibit a compressive stress of 2.8 GPa or higher.

An embodiment of a method in accordance with the present invention for forming silicon nitride, comprises, disposing a workpiece including a surface in a processing chamber, exposing the surface to a plasma in the absence of deposition conditions to remove contamination, and depositing a silicon nitride layer over the plasma-treated surface in the presence of a hydrogen gas flow.

An alternative embodiment of a method in accordance with the present invention for forming silicon nitride, comprises, disposing a workpiece including a surface in a processing chamber, forming a buffer layer over the surface, and depositing a silicon nitride layer over the buffer layer in the presence of a hydrogen gas flow.

Another alternative embodiment of a method in accordance with the present invention for forming silicon nitride, comprises, disposing a workpiece including a surface in a processing chamber, and depositing on the surface a film stack comprising a silicon nitride initiation layer formed in the absence of the hydrogen gas flow, followed by a high compressive stress silicon nitride layer formed in the presence of the hydrogen gas flow.

An embodiment of a method in accordance with the present invention for preventing defects in a device, comprises, treating a surface with a plasma, and depositing a silicon nitride layer on the treated surface in the presence of a flow of hydrogen gas.

An alternative embodiment of a method in accordance with the present invention for preventing defects in a device, comprises, depositing a buffer layer on a surface, and depositing a silicon nitride layer on the buffer layer in the presence of a flow of hydrogen gas.

Another alternative embodiment of a method in accordance with the present invention for preventing defects in a device, comprises, depositing a silicon nitride initiation layer on a surface in the absence of a flow of hydrogen gas, and depositing a high compressive stress silicon nitride layer on the initiation layer in a presence of a flow of hydrogen gas.

An embodiment of a film stack in accordance with the present invention comprises an oxide buffer layer, and an overlying silicon nitride layer deposited in the presence of hydrogen gas and exhibiting a high compressive stress.

Another embodiment of a film stack in accordance with the present invention comprises a silicon nitride initiation layer interposed between a oxide buffer layer and a high compressive stress silicon nitride layer, the initiation layer exhibiting a lower compressive stress than the overlying silicon nitride layer.

A further understanding of the objects and advantages of the present invention can be made by way of reference to the ensuing detailed description taken in conjunction with the accompanying drawings.

DETAILED DESCRIPTION OF THE INVENTION

A plurality of techniques may be employed alone or in combination, to enhance conformality and stress in a film formed by chemical vapor deposition (CVD). Embodiments in accordance with the present invention are particularly suited for forming conformal layers exhibiting tensile or compressive stress which impose strain on an underlying silicon lattice.

Figure 1:
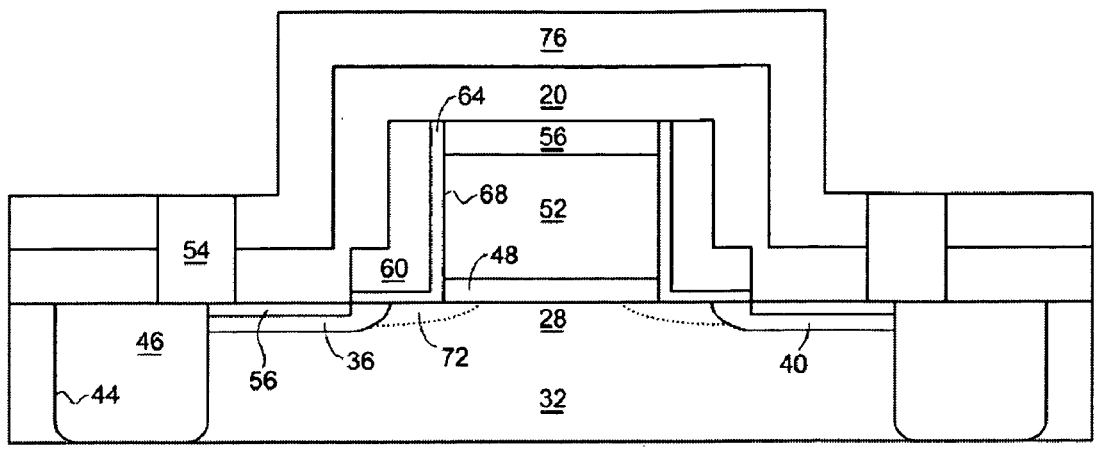
FIG. 1 is a simplified cross-sectional view of a substrate showing a partial view of a transistor structure with an overlying deposited tensile stressed silicon nitride material.

In one exemplary application, the tensile or compressive stressed silicon nitride material is formed on a substrate or workpiece 32 in the fabrication of a MOSFET structure 392—which is illustrated in the simplified cross-sectional diagram of FIG. 1. The relatively high internal stress of the deposited and treated silicon nitride material 20 induces a strain in a channel region 28 of the transistor 24. The induced strain improves carrier mobility in the channel region 28 which improves transistor performance, such as for example, by increasing the saturation current of the transistor 24. The silicon nitride material 20 can also have other uses within the MOSFET 24, for example, as an etch stop material. The highly stressed silicon nitride material 20 is also useful in other structures, such as other transistors including without limitation, bipolar junction transistors, capacitors, sensors, and actuators. The substrate or workpiece can be a silicon wafer or can be made from other materials such as germa-nium, silicon germanium, gallium arsenide and combinations thereof. The substrate or workpiece 32 can also be a dielectric, such as glass, which is used in the fabrication of displays.

The transistor 24 illustrated in FIG. 1 is a negative channel, or n-channel, MOSFET (NMOS) having source and drain regions 36, 40 that are formed by doping the substrate 32 with a Group VA element to form an n-type semiconductor. In the NMOS transistor, the substrate 32 outside of the source and drain regions 36, 40 is typically doped with a Group IIIA element to form a p-type semiconductor. For the NMOS channel regions, the overlying stressed silicon nitride material is fabricated to have a tensile stress.

In another version, the MOSFET transistor 24 comprises a positive channel or p-channel MOSFET (PMOS), (not shown) which has source and drain regions that are formed by doping the substrate with a Group IIIA element to form a p-type semiconductor. In a PMOS transistor, the transistor 24 may comprise a substrate 32 comprising an n-type semiconductor or may have a well region (not shown) comprising an n-type semiconductor formed on a substrate or workpiece 32 comprising a p-type semiconductor. The PMOS channel regions are covered with a compressive stressed silicon nitride.

In the version shown, the transistor 24 comprises a trench 44 to provide isolation between transistors 24 or groups of transistors 24 on the substrate 32, a technique known as shallow trench isolation. The trench 44 is typically formed prior to the source and drain regions 36, 40 by an etch process. A trench side wall liner material (not shown) may be formed in the trench 44 by, for example, a rapid thermal oxidation in an oxide/oxinitride atmosphere, which may also round sharp corners on the trench 44 (and elsewhere). In one version, the trench 44 may be filled with material 46 having a tensile stress, which can also be used to provide a tensile stress to the channel region 28. The deposition of the trench material 46 which may include the use of a High Aspect Ratio Process (HARP), which may include using an $O_3$/tetraethoxy silane (TEOS) based sub-atmospheric chemical vapor deposition (SACVD) process. Excess trench material 46 may be removed by, for example, chemical mechanical polishing.

The transistor comprises a gate oxide material 48 and a gate electrode 52 on top of the channel region 28 between the source and drain regions 36, 40. In the version shown, the transistor 24 also comprises silicide materials 56 on top of the source and drain regions 36, 40 as well as the gate electrode 52. The silicide materials 56 are highly conductive compared to the underlying source and drain regions 36, 40 and gate electrode 52, and facilitate the transfer of electric signals to and from the transistor 24 through metal contacts 54. Depending on the materials and formation processes used, the silicide materials 56 may also comprise a tensile stress and produce tensile strain in the channel region 28. The transistor shown also comprises spacers 60 and oxide-pad materials 64 which may be located on opposite sidewalls 68 of the gate electrode 52 to keep the silicide materials 56 separated during a silicidation process to form the silicide materials 56. During silicidation, a continuous metal material (not shown) is deposited over the oxide-containing source and drain regions 36, 40 and gate electrode 52, as well as the nitride containing spacers 60. The metal reacts with the underlying silicon in the source and drain regions 36, 40 and gate electrode 52 to form metal-silicon alloy silicide materials, but are less reactive with the nitride materials in spacers 60. Thus, the spacers 60 allow the overlying, unreacted metal to be etched away while not affecting the metal alloy in silicide materials 56.

The length of the channel region 28 is shorter than the length of the gate oxide material 48. The length of the channel region 28 measured between the edges of the source region 36 and the drain region 40 may be about 90 nm or less, for example, from about 90 nm to about 10 nm. As the length of channel region 28 gets smaller, implants 72, also known as halos, may be counter-doped into the channel region 28 to prevent charge carriers from uncontrollably hopping from the source region 36 to the drain region 40 and vice versa.

In the version shown in FIG. 1, the silicon nitride material 20 is formed above the silicide materials 56. The silicon nitride material 20 typically acts as a contact-etch stop material as well as providing strain to the channel region 28. The silicon nitride material 20 is capable of being deposited to have a stress values ranging from compressive to tensile stresses. Selection of stress in the silicon nitride material 20 selects the type of strain provided to the channel region 28 of the transistor 24.

As just described, film stress and conformality are two key characteristics of a film that is designed to impose strain on an underlying silicon lattice. Incorporated by reference herein for all purposes is U.S. nonprovisional patent application No. 11/055,936, filed Feb. 11, 2005 and entitled "TENSILE AND COMPRESSIVE STRESSED MATERIALS FOR SEMICONDUCTORS". This previously-filed patent application describes a number of techniques which may be employed to control stress of a deposited film.

The instant provisional application describes additional techniques for controlling stress and conformality of a film formed by chemical vapor deposition (CVD). It has been discovered that both types of stress, namely tensile or compressive, and the stress value of the deposited silicon nitride stressed material can be set in the deposited material by controlling processing parameters or by treating the deposited material, as described below. The processing parameters are described separately or in particular combinations; however, the invention should not be limited to the exemplary separate or combinations described herein, but may include other separate or combinations of parameters as would be apparent to one of ordinary skill in the art.

The following sections address controlling over compressive film stress, tensile film stress, and film conformality, respectively.

I. Compressive Stressed Materials

Deposition process and treatment conditions can be tailored to deposit a compressive stressed material on the substrate or to treat a material during or after deposition to increase its compressive stress value. Without being limited by the explanation, it has been discovered that a silicon nitride stressed material having higher compressive stress values can be obtained by increasing the RF bombardment to achieve higher film density by having more Si—N bonds in the deposited material and reducing the density of Si—H and N—H bonds. Higher deposition temperatures and RF power improved the compressive stress levels of the deposited film. In addition, higher compressive stresses levels were obtained in the deposited material at higher kinetic energy levels of plasma species. It is believed that bombardment of energetic plasma species, such as plasma ions and neutrals, generates compressive stresses in the deposited material because film density increases.

The process gas used to deposit compressive stressed silicon nitride includes the silicon-containing and nitrogen-containing gases described below in connection with the formation of tensile stressed materials. Also the general deposition process conditions, such as radio frequency type and power levels, gas flow rates and pressure, substrate temperature and other such process are about the same as those used for the deposition of tensile stressed materials, unless otherwise specified.

To deposit a compressive stressed silicon nitride material, the process gas introduced into the chamber comprises a first component that includes a silicon-containing gas, a second component that includes a nitrogen-containing gas, and a third component containing carbon, boron, or germanium. The silicon-containing compound can be, for example, silane, disilane, trimethylsilyl (TMS), tris(dimethylamino)silane (TDMAS), bis(tertiary-butylamino)silane (BTBAS), dichlorosilane (DCS), and combinations thereof. The carbon-containing compound can be, in addition to the compounds mentioned above, ethylene ($C_2H_2$), propylene ($C_3H_6$), toluene ($C_7H_8$), and combinations thereof. The boron and germanium containing compounds can be dibhorane ($B_2H_6$), boron chlorides ($B_2C_{14}$), and germane ($GeH_4$), respectively. For example, a suitable silane flow rate is from about 10 to about 200 sccm. The nitrogen-containing gas can be, for example, ammonia, nitrogen, and combinations thereof. A suitable ammonia flow rate is from about 50 to about 600 sccm. The process gas can also include a diluent gas that is provided in a much larger volume than the reactive gas components. The diluent gas can also serve both as a diluent and at least partially as a reactant nitrogen-containing gas, for example, nitrogen in a flow rate of from about 500 to about 20,000 sccm. Other gases that can be included can be inert gases, such as for example, helium or argon, in a flow rate of from about 100 to about 5,000 sccm. The process gas may also contain additional gases such as an oxygen-containing gas, for example, oxygen, when depositing silicon oxy-nitride materials. Unless otherwise specified, in these processes, the electrode power level is typically maintained at from about 100 to about 400 Watts; electrode spacing is from about 5 mm (200 mils) to about 12 mm (600 mils); process gas pressure is from about 1 Torr to about 4 Torr; and substrate temperature is from about 300 to about 600° C.

It has been discovered that the introduction of $H_2$ gas into the deposition chemistry may substantially increase compressive stress in the resulting films that are formed. Table I below lists three separate conditions for deposition of silicon nitride films.

TABLE I

| FILM # | $SiH_4$ (sccm) | $NH_3$ (sccm) | $N_2$ (L) | Ar (L) | $H_2$ (L) |
|--------|----------------|---------------|-----------|--------|-----------|
| 1 | 60 | 30 | 1 | 3 | 0 |
| 2 | 60 | 30 | 1 | 3 | 1 |
| 3 | 60 | 30 | 0 | 3 | 1 |

Figure 2:
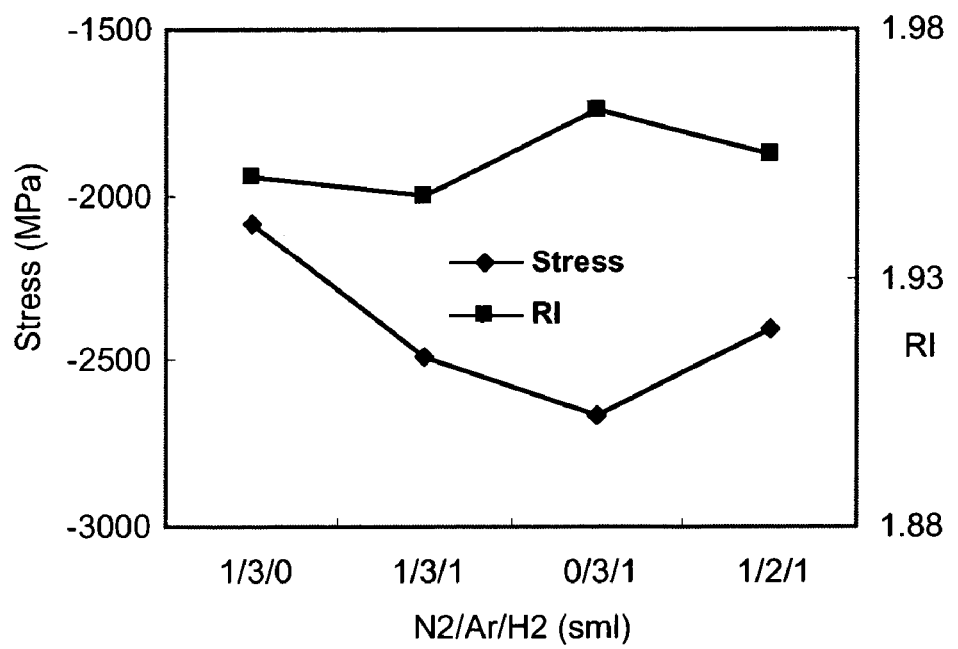
FIG. 2 plots compressive stress and refractive index for CVD SiN films formed under a number of different process conditions.

FIG. 2 plots film stress and refractive index for SiN films deposited under the three separate deposition conditions listed above in Table I. FIG. 2 shows the effect of adding $H_2$ upon the compressive stress exhibited by the resulting film. FIG. 2 shows that the highest compressive stress is achieved when the $SiH_4/NH_3$ ratio is optimized for given $H_2$ and Ar flows, with an $N_2/Ar/H_2$ ratio of 0/3/1.

Figure 3:
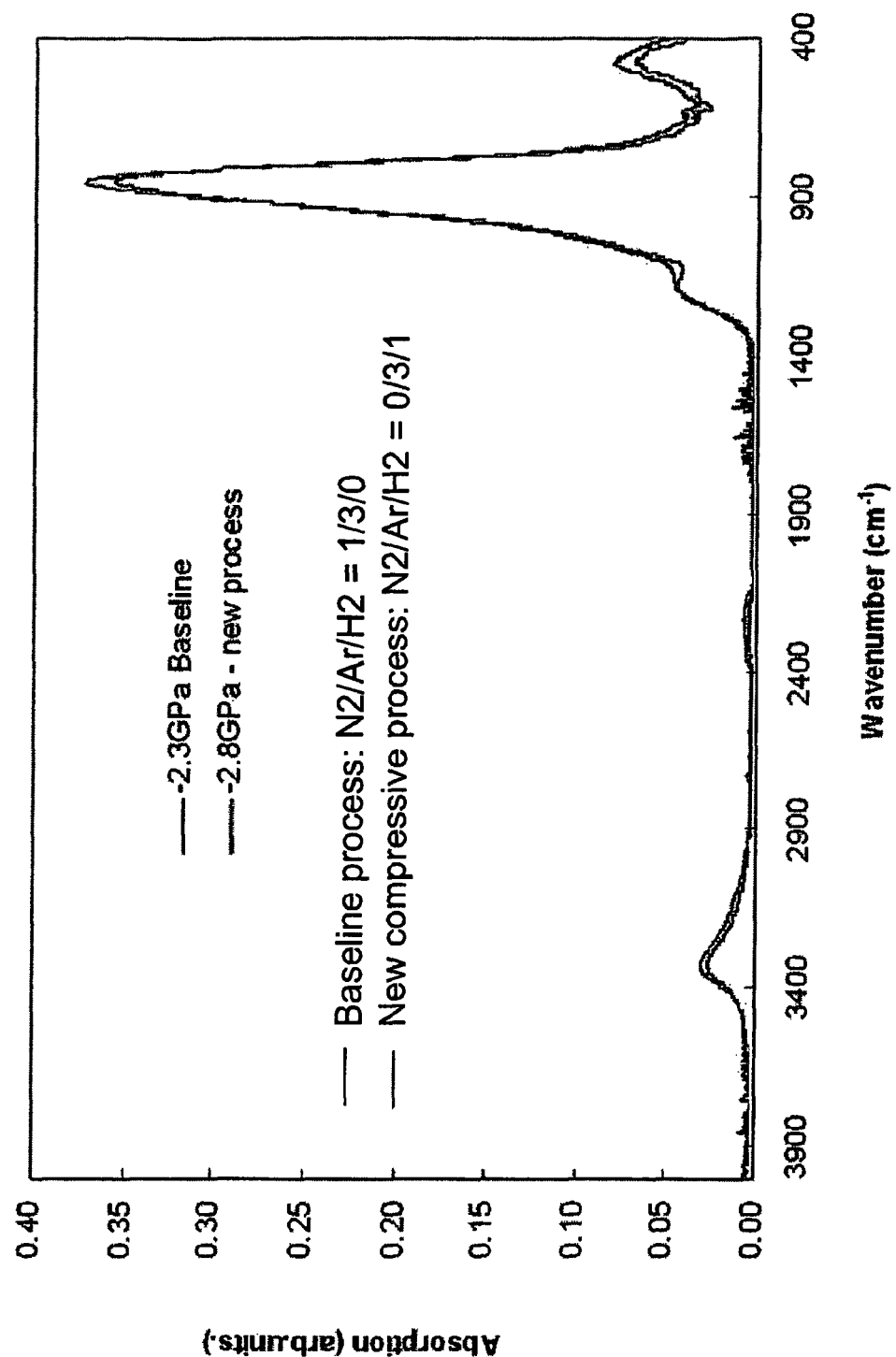
FIG. 3 shows FT-IR spectra for CVD SiN films formed under a number of different process conditions.

FIG. 3 plots FT-IR absorption spectra for silicon nitride film #'s 1 and 3 listed above in Table I. The FT-IR spectrum for CVD SiN film #3 may fairly be contrasted with that of CVD SiN film #1. The spectra of FIG. 2 indicate that the nitride film #3 deposited in the presence of hydrogen gas, exhibits an increase in intensity at about wavenumber 3330 $cm^{-1}$. This region of the spectrum corresponds to N—H deformation characteristic of tensile stress, indicating an increase in compressive stress.

Within given relative ratios of process gases, other parameters can be varied to further enhance compressive stress. For example, SiN films were deposited by CVD at the 0/3/1 $N_2/Ar/H_2$ flow rate ratio just described, under different flow rates of $SiH_4$ and $NH_3$. These experiments revealed a center point of maximum compressive stress (G~−2.8 GPa) with a $SiH_4$ flow rate of 60 sccm, and a $NH_3$ flow rate of 150 sccm.

Figure 4A:
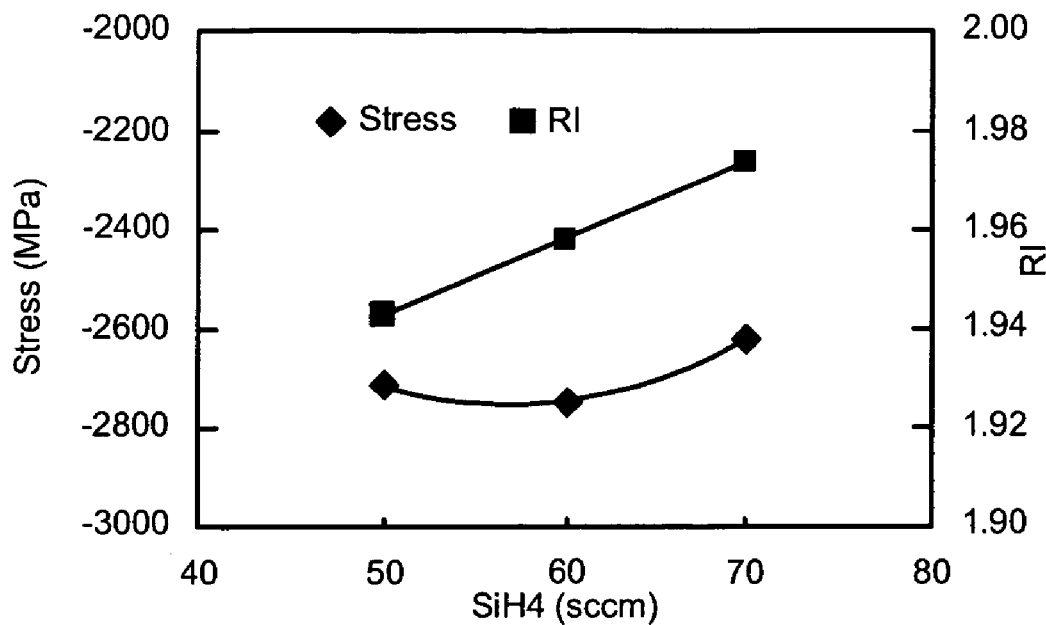
FIG. 4A plots compressive stress and refractive index for CVD SiN films deposited with different silane flow rates.

FIGS. 4A-D indicate that the level of compressive stress in the deposited film can be further enhanced to above about −2.8 GPa by varying other process parameters. For example, FIG. 4A plots stress and refractive index for CVD SiN films deposited at three different $SiH_4$ flow rates. FIG. 4A shows that $SiH_4$ flow rate may be optimized to enhance compressive stress.

Figure 4B:
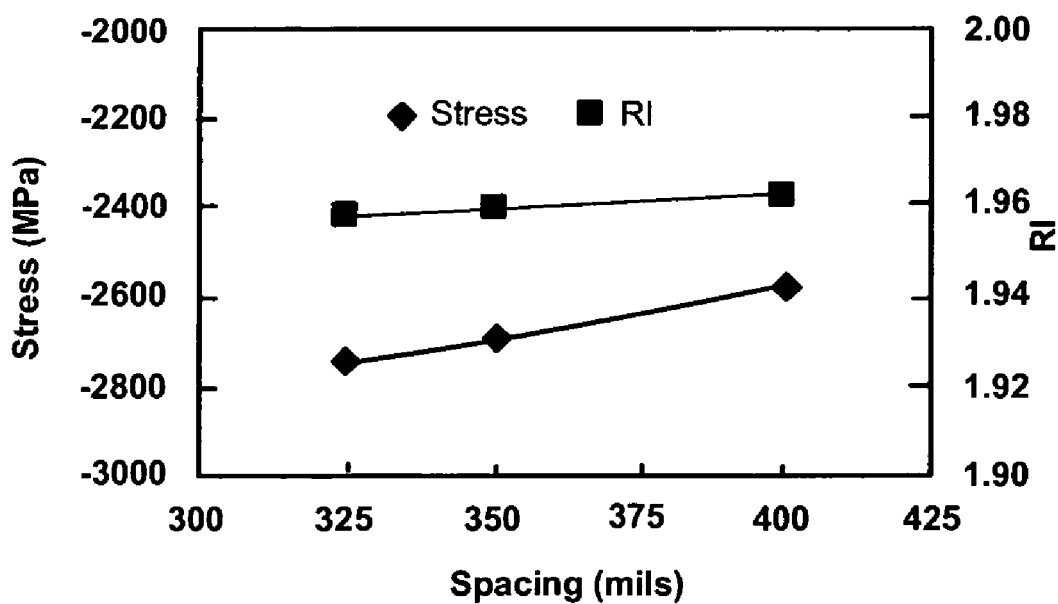
FIG. 4B plots compressive stress and refractive index for CVD SiN films deposited with different faceplate-to-wafer spacings.

FIG. 4B plots stress and refractive index for CVD SiN films deposited at three different wafer-to-faceplate spacing distances. FIG. 4B also shows that this spacing difference may be optimized to enhance compressive stress.

Figure 4C:
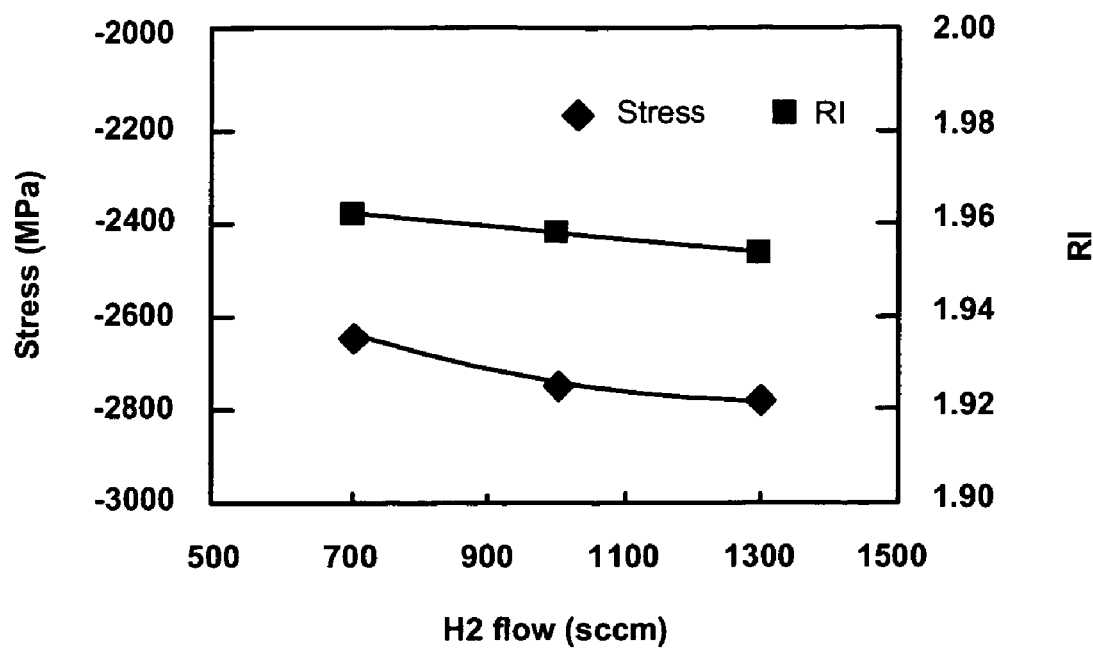
FIG. 4C plots compressive stress and refractive index for CVD SiN films deposited with different hydrogen gas flow rates.

FIG. 4C plots stress and refractive index for CVD SiN films deposited at three different $H_2$ flow rates. FIG. 4C shows that the $H_2$ flow rate parameter may be optimized to enhance compressive stress.

Figure 4D:
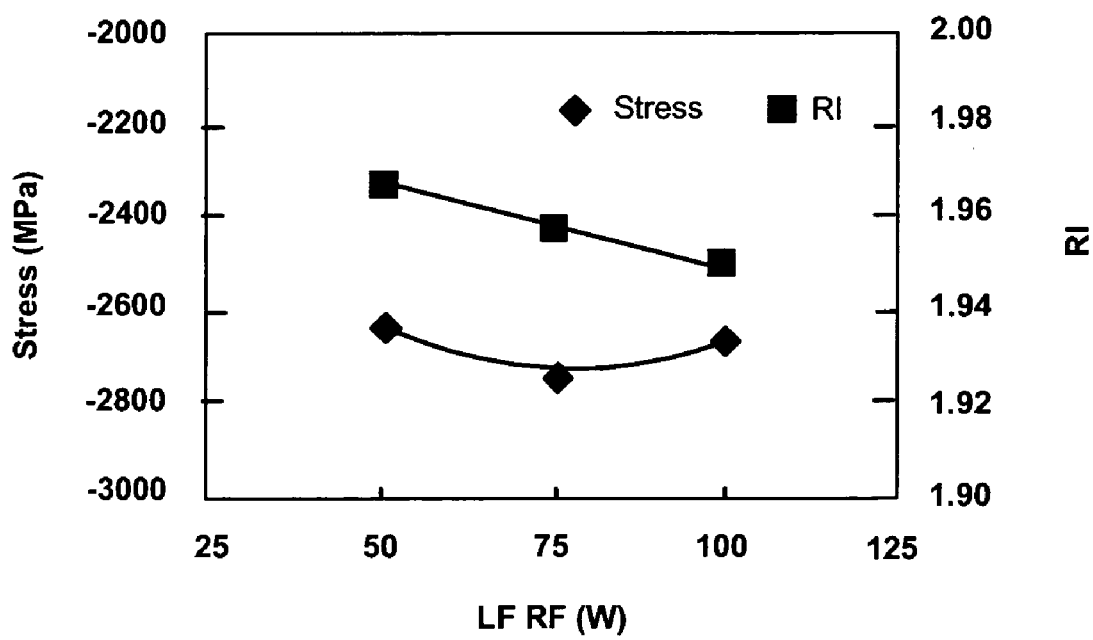
FIG. 4D plots compressive stress and refractive index for CVD SiN films deposited at different applied power levels.

FIG. 4D plots stress and refractive index for CVD SiN films deposited at three different RF powers. FIG. 4D shows that a maximum compressive stress may be achieved by controlling this process parameter.

Figure 5A:
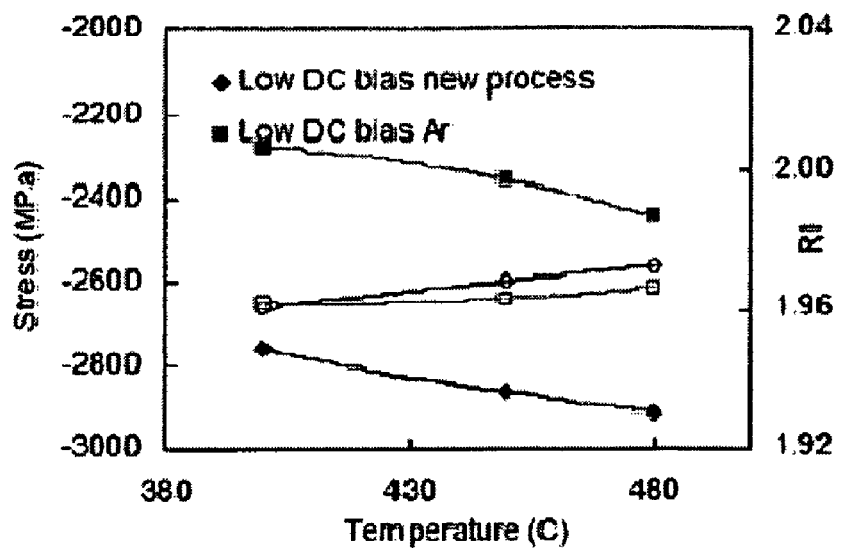
FIG. 5A plots compressive stress and refractive index for CVD SiN films deposited with and without hydrogen gas.
Figure 5B:
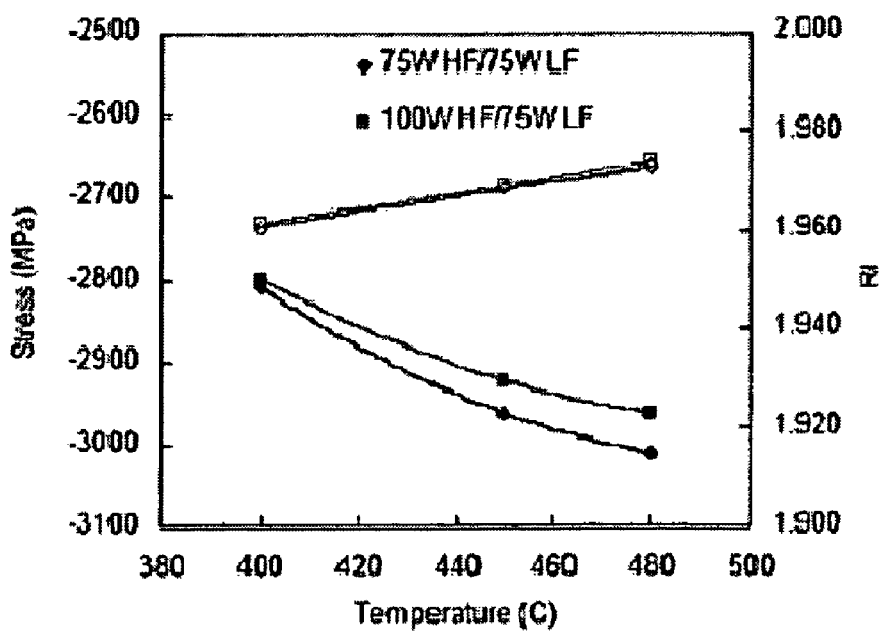
FIG. 5B plots compressive stress and refractive index for CVD SiN films deposited at different powers and at different temperatures.

FIGS. 5A and 5B show that variation of a number of process parameters in combination, may allow for a CVD SiN film to exhibit a compressive stress approaching −3.0 GPa. Specifically, FIG. 5A plots stress and refractive index of SiN films deposited with and without hydrogen gas, at three different temperatures. FIG. 5A shows that the film deposited at 480° C. with hydrogen gas, exhibited a compressive film stress approaching −3 GPa. 5B plots stress and refractive index for SiN film deposited with $H_2$ and Ar at 480° C, with a high frequency power of either 75W or 100W. FIG. 5B shows that the film deposited with a low frequency of 75W achieved a compressive stress of −3 GPa. For this combination of gases/pressure/spacing, the optimum power of 75W resulted in a film having the highest compressive stress.

As just described, deposition of silicon nitride in the presence of hydrogen gas can produce a desirable enhancement in the compressive stress exhibited by the resulting SiN film. However, it is well known that hydrogen gas can easily diffuse through dielectric materials. Moreover, the penetration of such hydrogen into semiconducting regions can degrade reliability of the device, especially at the transistor level. This phenomenon is even more pronounced when high stress films are used as etch stop layers.

It has also been observed that hydrogen may accumulate at the nitride/device (NiSix) interface, and this accumulated hydrogen can also create physical defects, such as blistering and delamination during subsequent processing steps. An analysis of the residue at the delamination site revealed a presence of Zn and Na, typical metal contaminants. The probability of such physical defects increases with the level of compressive stress, and is more pronounced when the nitride film is deposited at a lower temperature.

In accordance with various embodiments of the present invention, three approaches may be utilized alone or in combination, to eliminate the occurrence of defects and thus improve the device reliability when high compressive stress nitride films are formed by deposition in the presence of hydrogen gas. In accordance with one embodiment, defects may be reduced by pre-deposition plasma treatment of the surface that is to receive the high compressive stress silicon nitride. In accordance with another embodiment, defects may be reduced by forming a buffer layer over the surface that this to receive the high compressive stress nitride layer, prior to deposition of that nitride layer. In accordance with still a further embodiment of the present invention, defects may be reduced by forming a SiN layer in the absence of hydrogen, prior to deposition of an overlying high stress SiN film in the presence of hydrogen gas. Each of these approaches is now discussed in turn below.

In accordance with the first embodiment just mentioned, a plasma pre-treatment step prior to deposition of silicon nitride in the presence of hydrogen can be employed. This pre-deposition plasma treatment cleans the wafer surface, removing contamination that could render the surface susceptible to penetration by hydrogen, such as residual silane or metallic contaminants such as Zn and Na. The plasma utilized for this pre-treatment step may be formed from a number of different ambients, including but not limited to $N_2O$, $O_2$ and $NH_3$-containing plasmas which have been successfully used to reduce the number of defects of the nitride film post anneal. The pre treatment may be applied in the same or in a different processing chamber in which the SiN is deposited. The plasma treatment may conclude prior to the subsequent deposition step, or may be continuous and extend into the SiN deposition step. The specific parameters of this plasma pre-treatment, such as duration, power, temperature, and ambient, may vary according to the particular application in order to achieve the desired effects.

In accordance with the second embodiment of the present invention mentioned above, defects can be reduced and reliability improved, by forming a buffer layer on the surface that is to receive the high compressive stress nitride. Such a buffer layer, typically comprising oxide, will then be located at the nitride/NiSix interface. This oxide serves as a buffer layer, blocking hydrogen diffusing through the deposited SiN film. Atomic hydrogen reaching the oxide buffer will attempt to combine with other hydrogen atoms to form molecular hydrogen, but will be unsuccessful in doing so owing to the strength of the Si—N, Si—H, and N—H bonds. Specifically, hydrogen diffuses by hopping from one Si—H or N—H bond to another. To migrate out of the nitride layer into the oxide layer, and Si—O bond needs to break and an Si—N bond will form. This reaction id not energetically favorable, so the hydrogen will remain trapped in the nitride layer. In this manner, the oxide buffer layer acts as a wall, preventing gas accumulation at the Si/SiN interface, and decreasing blistering and post anneal delamination.

Figure 33:
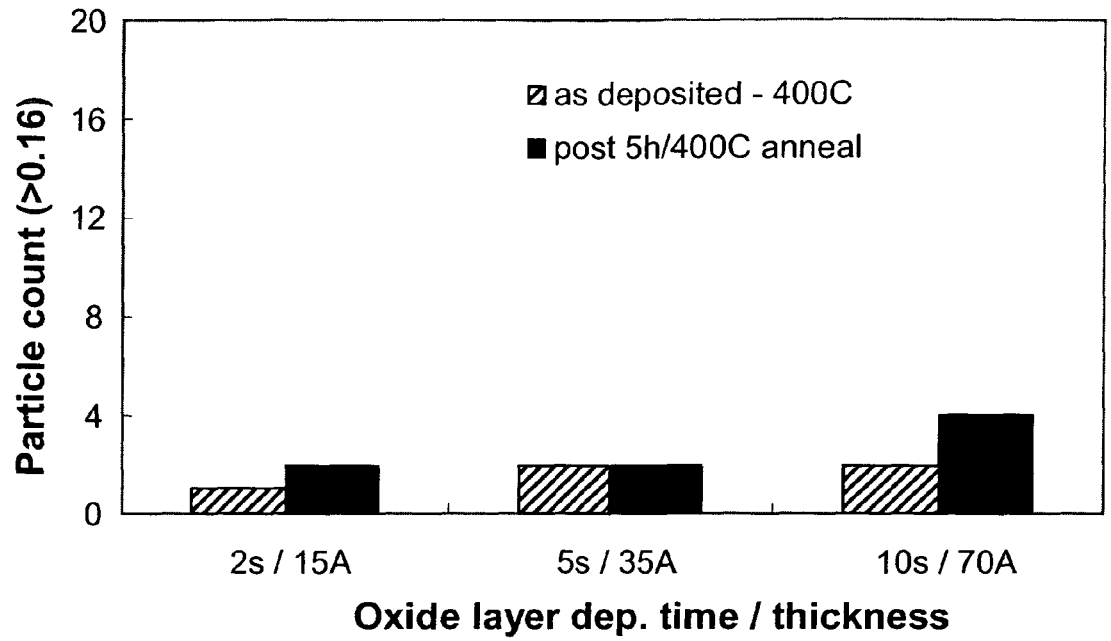
FIG. 33 is a bar graph showing deposited and post annealed particle performance with the addition of an oxide layer.

FIG. 33 compares contamination exhibited by high compressive stress silicon nitride layers deposited over oxide buffer layers of three different thicknesses. FIG. 33 shows that even the use of a very thin oxide buffer layers results in a post-anneal area count of about 2 adders (defects per wafer) or less.

In accordance with the third embodiment of the present invention mentioned above, defect count may be reduced, and reliability enhanced, by forming an initiation layer prior to introduction of the hydrogen gas utilized to form the high compressive stress nitride layer. As described above, the desired high compressive stress characteristic of the nitride layer derives from the presence of hydrogen gas during deposition. In accordance with this third embodiment, the penetration of this hydrogen gas may be reduced by performing the initial stages of the deposition in the absence of hydrogen, such that the resulting silicon nitride initiation layer does not exhibit high compressive stress. Once the initiation layer is formed, hydrogen gas is introduced into the deposition gas mixture to imbue the overlying silicon nitride with the desired level of compressive stress.

The role of the initiation layer is to protect the devices from the potential surges of electrons occurring in the plasma during the deposition of the high compressive stress. Proper adjustment of the initiation layer thickness can also allow it to serve as a barrier for hydrogen diffusion. The initiation layer essentially forms a barrier which aids in eliminating hydrogen accumulation.

Figure 34A:
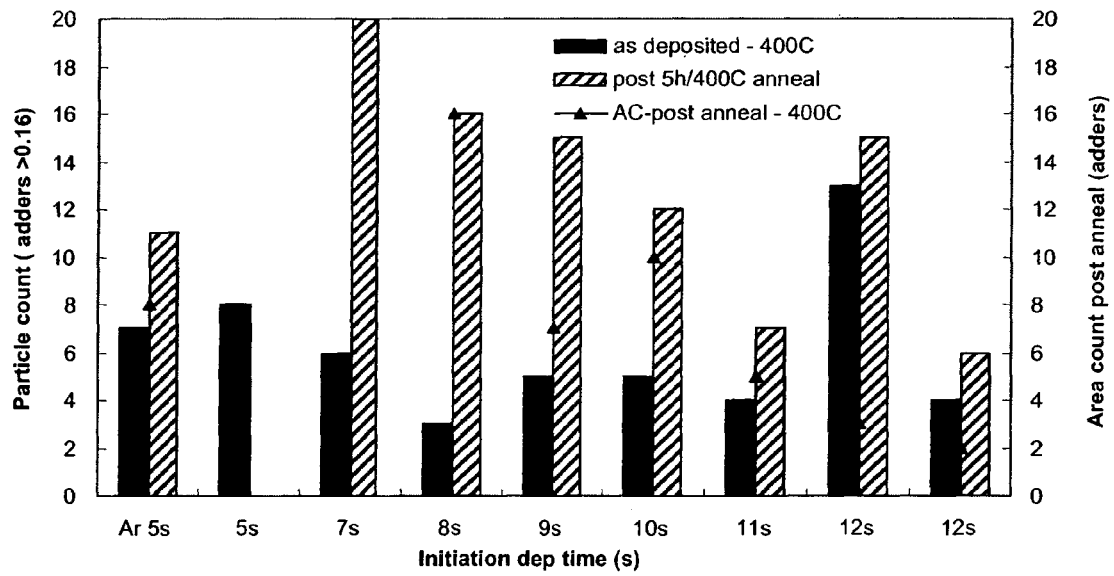
FIGS. 34A-C are graphs showing deposited and post annealed particle performance when an increased initiation layer is used.

FIG. 34A shows the number of adders observed by a high compressive stress silicon nitride layer is formed at 400° C. and annealed for 5 hours at 400° C., over initiation layers of different thicknesses. FIG. 34A shows that use of a thicker initiation layer improves particle performance post-anneal. FIG. 34A also shows that the post-anneal area count decreases to less than about 3 adders only for initiation layer thicknesses larger than about 90 Å (deposited for 12 sec), as compared with initiation layers having a thickness of about 35 Å (deposited for 5 sec).

Figures 34B, 34C:
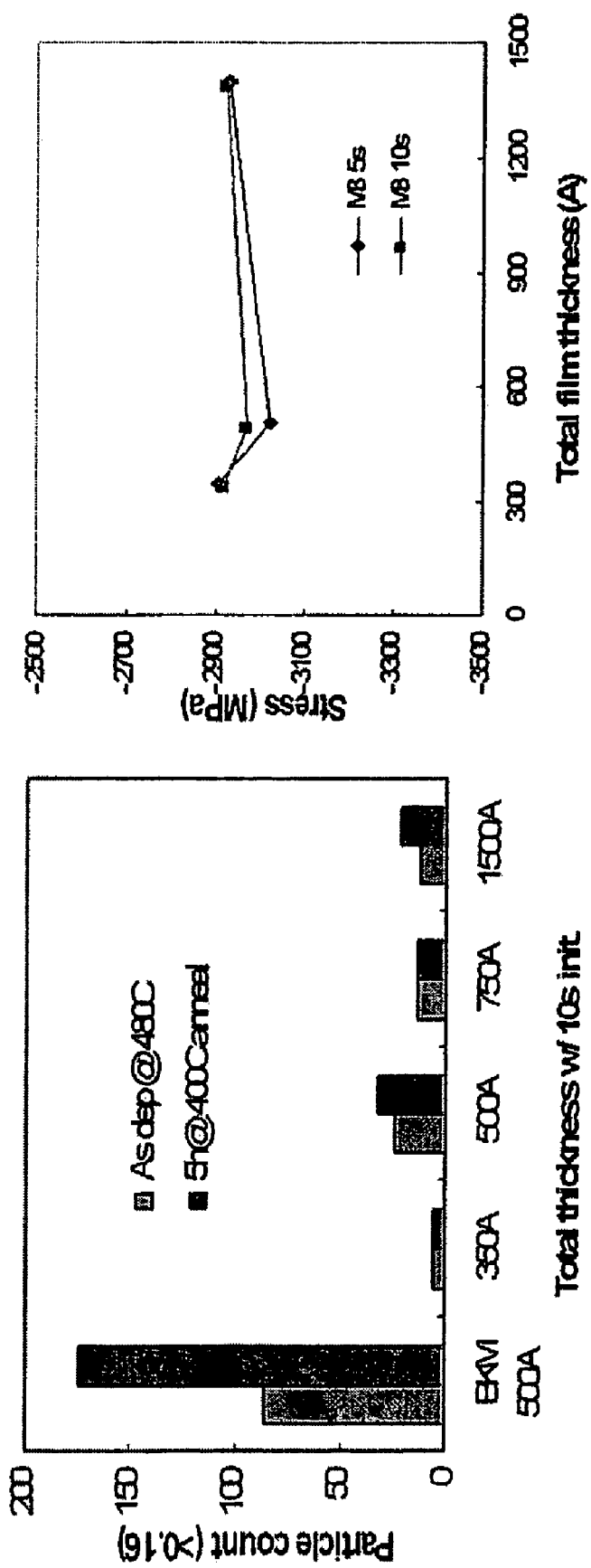

FIG. 34B shows particle performance of high compressive stress films of varying thicknesses formed at 480° C., over an initiation layer of the same thickness (deposited for 10 seconds). FIG. 34B shows that deposition of an initiation layer for 10 seconds improved particle performance for films up to at least 1500 Å in thickness.

FIG. 34C plots film stress versus film thickness for high compressive stress films including an initiation layer deposited for 5 seconds or 10 seconds. FIG. 34C reveals that increasing the initiation from 5 seconds to 10 seconds does not significantly change the stress for film having a thickness of greater than about 350 Å.

Figure 35:
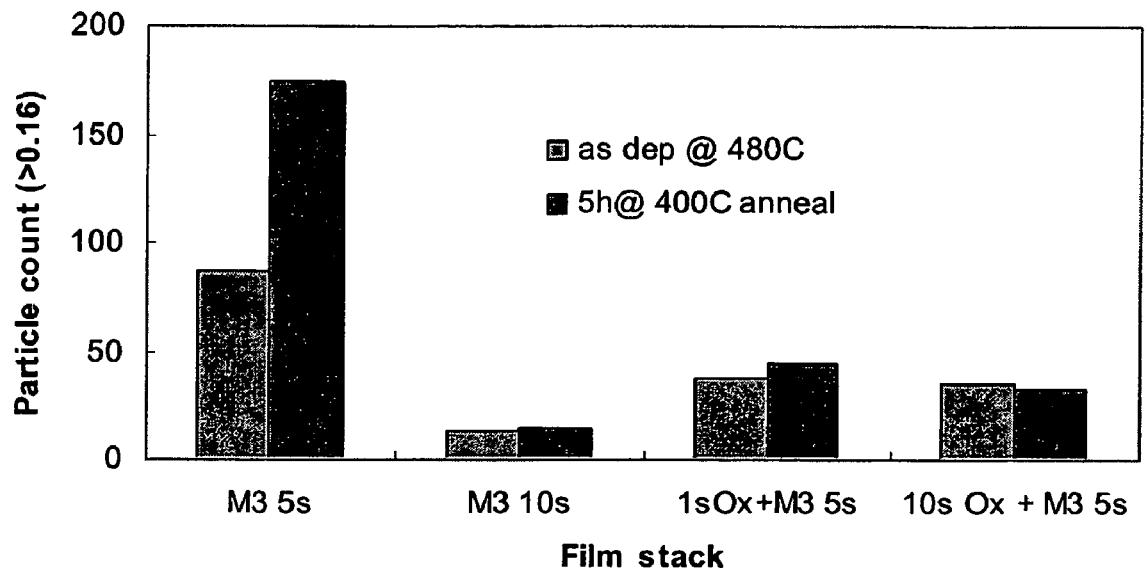
FIG. 35 is a bar graph showing deposited and post annealed particle performance when an oxide layer is used in combination with an increased initiation layer.
Figure 36:
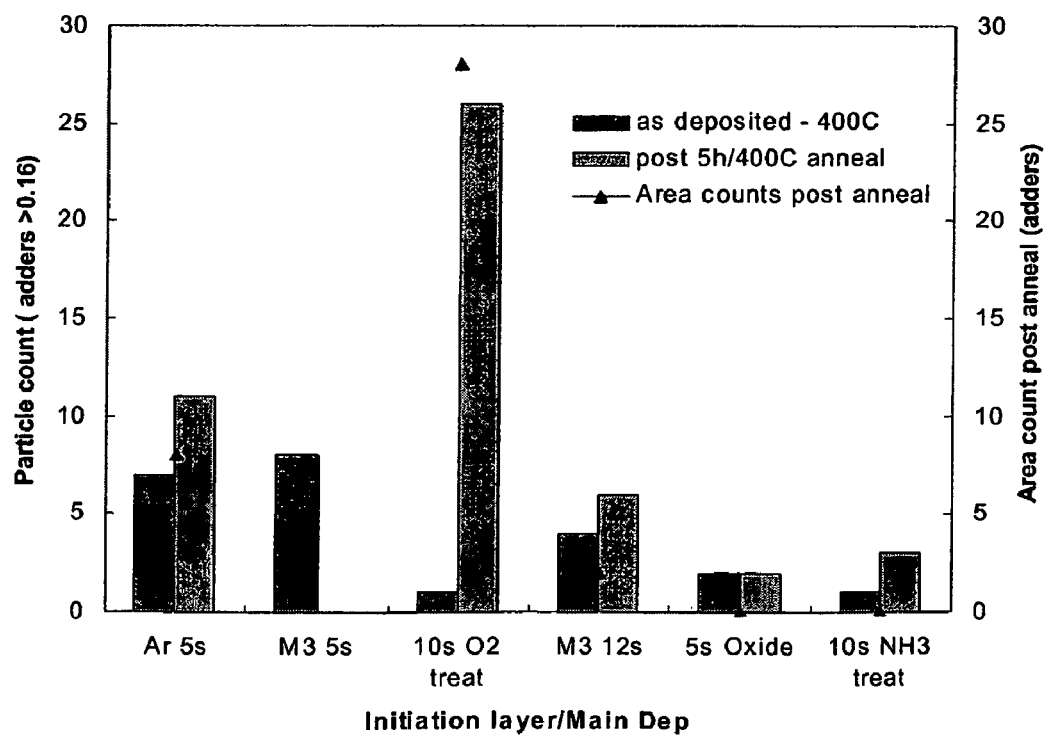
FIG. 36 is a bar graph showing deposited and post annealed particle performance when various approaches are used to improve compressive stress reliability.
Figure 37A:
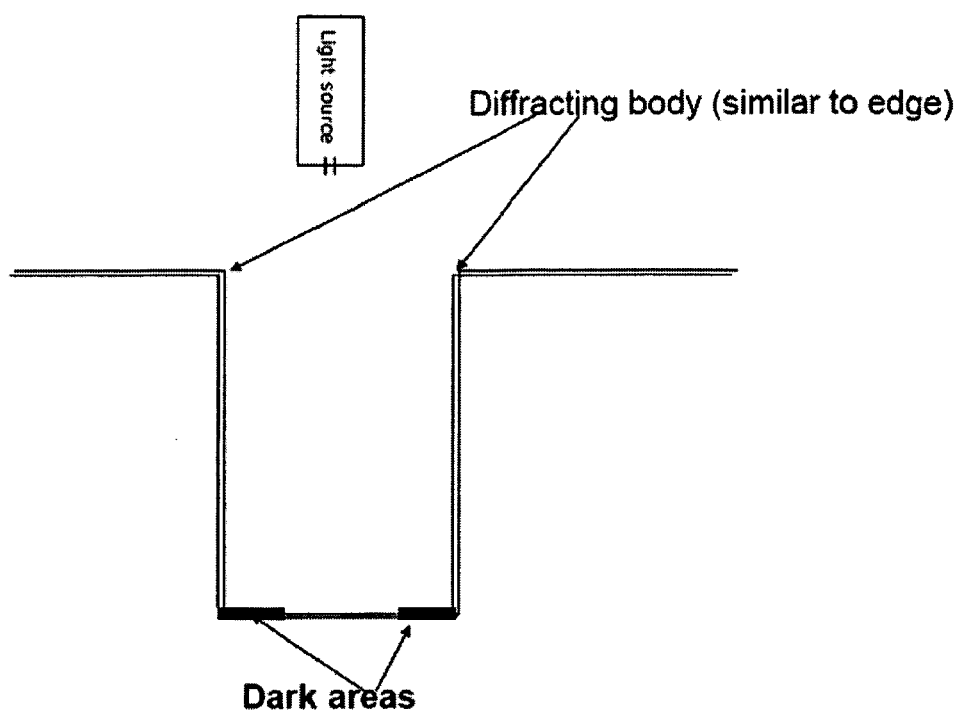
FIG. 37A is a drawing highlighting the Fresnel Principle.
Figure 37B:
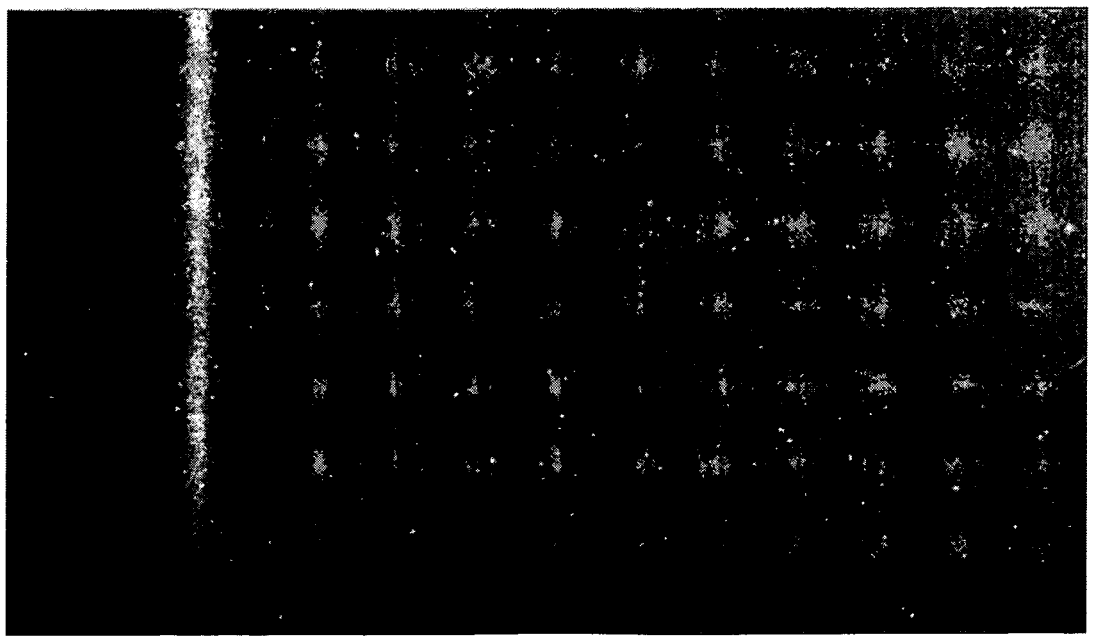
FIG. 37B is a cross sectional micrograph illustrating the Fresnel Principle.
Figure 38A:
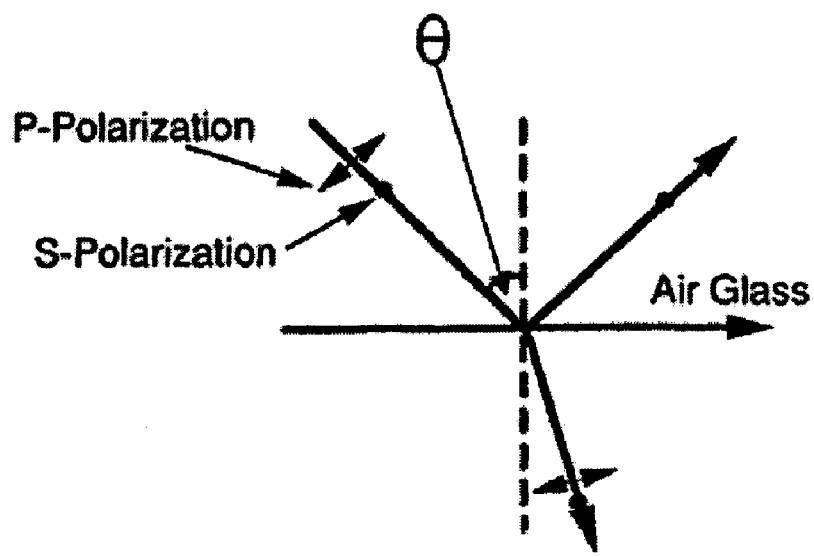
FIG. 38A-B are graphs showing the Brewster angle theory.
Figure 38B:
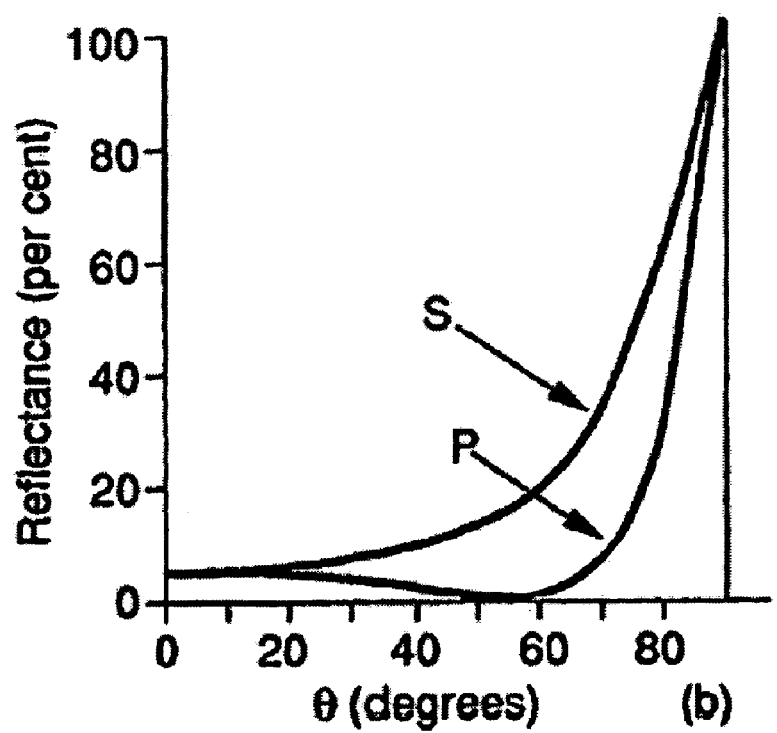

Though the three aforementioned approaches for increasing compressive stress reliability have been explained separately, they may also be used in various combinations with one another. For example, FIG. 35 plots particle count for four different high compressive stress silicon nitride film stacks deposited at 480° C. and then annealed for 5 hours at 400° C. The first and second film stacks include initiation layers deposited for 5 and 10 seconds, respectively. The third and fourth films include initiation layers formed over oxide layers deposited for the times indicated.

FIG. 35 shows that use of the thicker initiation layer resulted in good particle performance in the "as deposited" film. FIG. 35 shows that film stacks utilizing an oxide buffer layer (having a thickness of 30-50 Å) under the initiation layer, also exhibited improved particle performance.

FIG. 35 plots particle count and area count for high compressive stress silicon nitride layers formed under a variety of different conditions. FIG. 35 shows that pre-deposition plasma treatment with ammonia (NH3) is the most efficient technique for improving resistance to blistering. The use of an oxide buffer layers and initiation layers also showed good results.

The three embodiments of the present invention just described, can be employed to solve integration-related issues with other dielectric films such as low-k dielectrics and high tensile stress silicon nitride using hydrogen or deuterium in the deposition. In accordance with still other embodiments of the present invention, Deuterium can also be utilized instead of hydrogen during deposition, in order to form silicon nitride films with compressive stress greater than 3 GPa.

Post Deposition NF$_3$ Etch-back Process

As described above, silicon nitride dielectric films may be used as a barrier or etch stop layer for various applications. The film thickness non-uniformity across the wafer (e.g., bottom vs. top vs. sidewall thickness) can negatively impact the drive current improvement from one device to another. PECVD dielectric films may suffer from a high deposition rate in isolated areas as well as at the poly-gate upper corner (e.g., bread-loafing). Modulating process parameters may not significantly improve step coverage or pattern loading.

In accordance with one embodiment of the present invention, an NF$_3$ etch-back process modulates a PECVD nitride step coverage and pattern loading. Diluted NF$_3$ plasma can be used to etch back the nitride film after deposition to modulate the step coverage profile. This etch-back process results in a low etch rate and desired etch uniformity. The etch-back profile may be similar to that of a PECVD deposition profile. In one embodiment, the NF$_3$ etch-back process is performed in the same chamber as the deposition process and can be run at the end of the deposition. Alternatively, the etch-back process can be run in a deposition/etch sequence. NF$_3$ process parameters may be adjusted so that the etch profile can be modulated to match the deposition profile.

Figure 41:
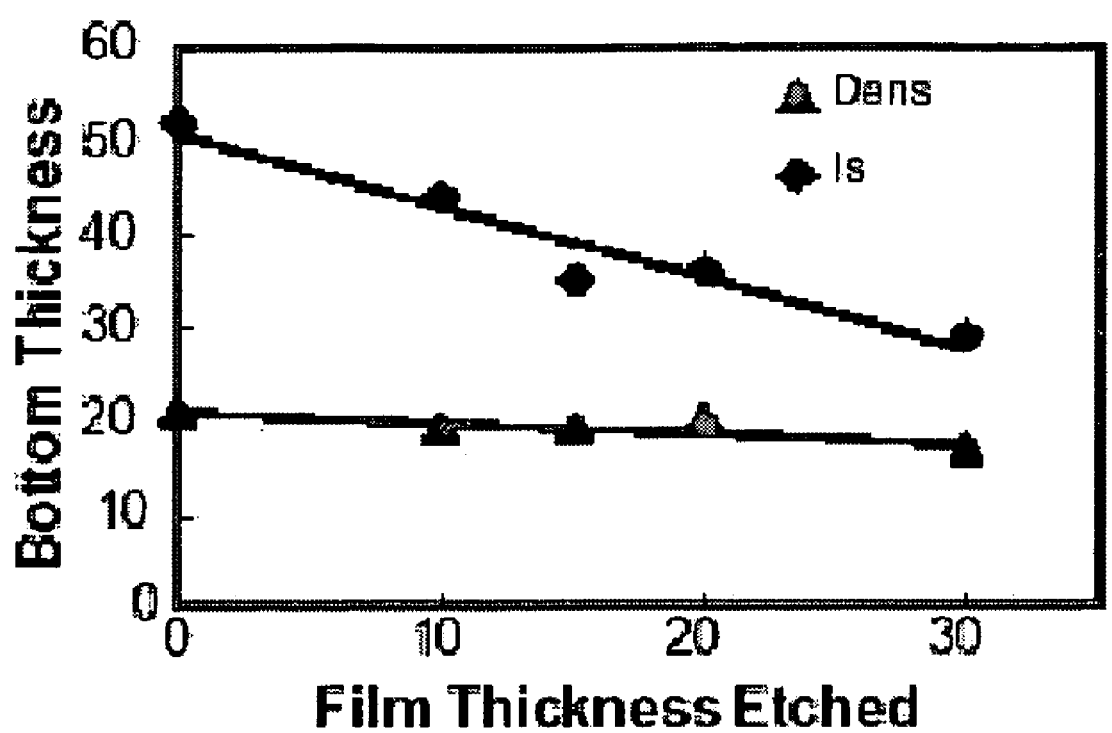
FIG. 41 is graph showing a higher etch rate on isolated areas for a post deposition $NF_3$ etch-back process.

FIG. 41 illustrates results of a post deposition NF$_3$ etch-back process. In FIG. 41, a higher etch rate is shown for the isolated areas. Furthermore, a diluted NF$_3$ etch-back reduces bottom coverage loading by about 30% without affecting film stress. This can potentially be used to modulate the step coverage for other PECVD dielectric films.

Figure 42:
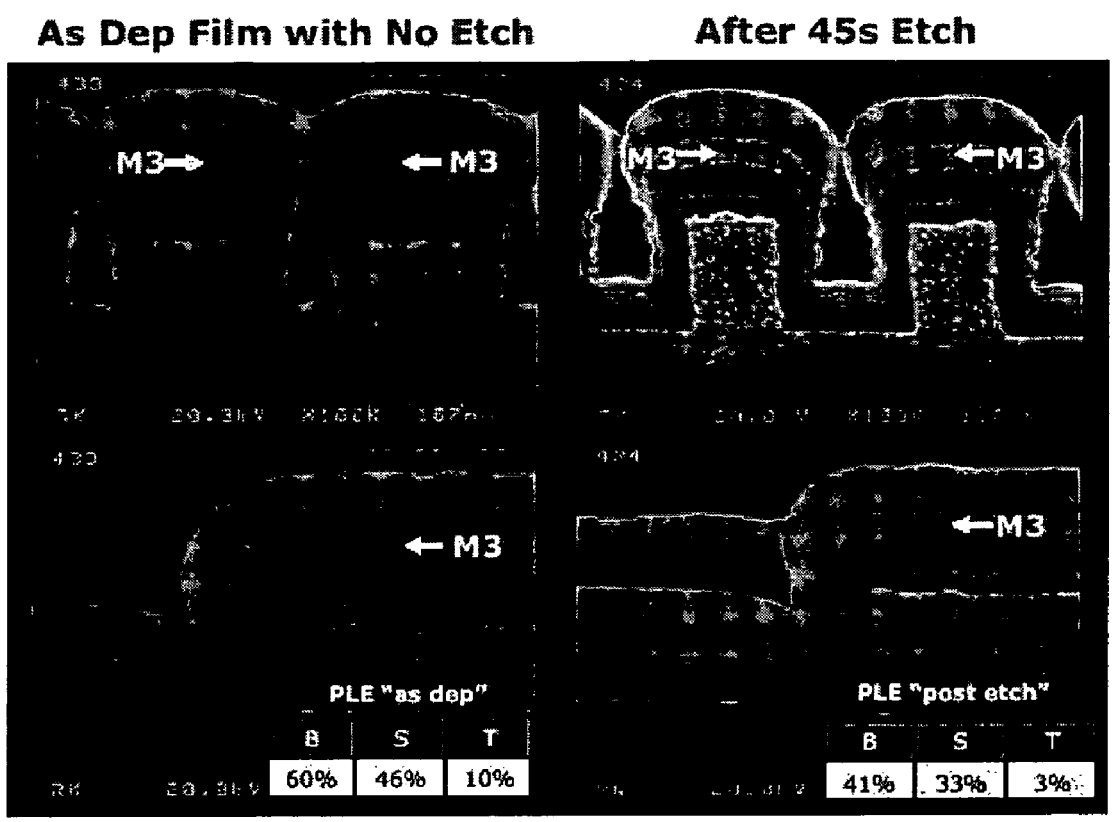
FIG. 42 is an electron micrograph showing profile changes and Pattern Loading Effect (PLE) improvement after an $NF_3$ etch-back process in accordance with an embodiment of the present invention.

FIG. 42 shows the profile change and Pattern Loading Effect (PLE) improvement after NF$_3$ etch-back of the silicon nitride layer labeled M3. M3 illustrates the nitride bread-loafing profile. The M3 profile has been changed after an NF$_3$ etch-back process. After post deposition NF$_3$ etch-back of the M3 compressive nitride, the PLE is improved.

H. Tensile Stressed Materials

Without being limited by an explanation, it has been discovered that a silicon nitride stressed material having higher tensile stress values can be obtained by a number of techniques employed alone or in combination reducing the net hydrogen content, or the amount of silicon-hydrogen and nitrogen-hydrogen bonds (Si—H and N—H bonds respectively) in the deposited silicon nitride material. It is believed that lowering the hydrogen content in the deposited material, which results in a detectably smaller amount of Si—H and N—H bonds in the silicon nitride material, gives rise to higher tensile stress values in the deposited material. It has further been discovered that several different deposition process parameters, treatments of deposited material, or combinations thereof, can be used to achieve lower hydrogen content in the deposited material, as described herein.

Incorporated by reference herein for all purposes is "Mechanism of SiN$_x$ Deposition from NH$_3$-SiH$_4$ Plasma", Smith et al., *J. Electrochem. Soc.*, Vol. 137, No. 2 (February 1990). This article attributes the formation of tensile stress in a CVD SiN film, to densification of the film in a subsurface zone by the elimination of the volatile ammonia (NH$_3$) species. Specifically, nitrogen radicals in the plasma may abstract hydrogen to release the ammonia, leaving dangling Si and N bonds separated by voids. Stretched Si—N bonds then form and are detectable by FT-IR analysis by a characteristic peak at 840 cm$^{-1}$. Constrained by the surrounding material, these stretched Si—N bonds cannot relax, resulting in tensile stress.

Various techniques may be employed to enhance the level of the tensile stress that is created. As described in detail below, in accordance with one technique, tensile stress may be enhanced by forming the material in multiple layers in a plurality of successive deposition/treatment (dep/treat) cycles. In accordance with still another embodiment, tensile stress may be enhanced by depositing the material at a lower temperature prior to subsequent curing by exposure to radiation.

To deposit a tensile stressed silicon nitride material, the process gas introduced into the chamber may comprise a first component that includes a silicon-containing gas, a second component that includes a nitrogen-containing gas, and a third component containing carbon, boron, or phosphorus. The silicon-containing gas can be, for example, silane, disilane, trimethylsilyl (TMS), tris(dimethylamino)silane (TDMAS), bis(tertiary-butylamino)silane (BTBAS), dichlorosilane (DCS), and combinations thereof. The carbon-containing compound can be, in addition to the gases mentioned above, ethylene ($C_2H_4$), propylene ($C_3H_6$), toluene ($C_7H_8$), and combinations thereof. The boron and phosphorus containing compounds can be dibhorane ($B_2H_6$), boron chlorides ($B_2C_{14}$), and phosphine ($PH_3$), respectively. For example, a suitable silane flow rate is from about 5 to about 100 sccm. The nitrogen-containing gas can be, for example, ammonia, nitrogen, and combinations thereof. A suitable ammonia flow rate is from about 10 to about 200 sccm. The process gas can also include a diluent gas that is provided in a much larger volume that the reactive gas components. The diluent gas can also serve both as a diluent and at least partially as a reactant nitrogen-containing gas, for example, nitrogen in a flow rate of from about 5000 to about 30,000 sccm. The process gas may also contain additional gases such as an oxygen-containing gas, for example, oxygen, when depositing silicon oxy-nitride materials. Unless otherwise specified, in these processes, typical gas pressures are from about 3 to about 10 Torr; substrate temperatures are from about 300 to 600° C.; electrode spacing is from about 5 mm (200 mils) to about 12 mm (600 mils); and RF power levels are from about 5 to about 100 Watts.

A. Nitrogen Plasma Treatment Cycles

It was further discovered that the stress values of the as-deposited silicon nitride material could be increased by treating the deposited silicon nitride film with a nitrogen plasma treatment step (treat). Such a treatment cycle can be performed by modifying the deposition process to have two process steps. In the first or deposition process step (dep), a process gas comprising a first component comprising silicon-containing gas and nitrogen-containing gas, and a second component comprising a diluent nitrogen gas, is introduced into the chamber and a plasma is formed from the process gas by applying a high or low frequency voltage to the chamber electrodes. In the second or nitrogen plasma treatment cycle, the flow of the first component of the process gas which includes the silicon-containing gas and the nitrogen-containing gas is shut off or substantially terminated; while the flow of the second component comprising the diluent nitrogen gas is still left on, and the high or low frequency voltage supplied to the electrodes to form the plasma is also maintained. These two process cycles are repeated a number of times during deposition of the silicon nitride material.

Again, without being limited by the explanation, it is believed that the nitrogen plasma cycles further reduce the hydrogen content in the deposited silicon nitride. It is believed that the nitrogen plasma cycle promotes the formation of silicon-nitrogen bonds in the deposited silicon nitride material by removing silicon-hydrogen bonds from the deposited material. However, since the nitrogen plasma treatment can only affect a thin surface region of the deposited silicon nitride film, a nitrogen treatment cycle is formed after short deposition process cycles in which only a film of silicon nitride is deposited on the substrate that is sufficiently thin to allow nitrogen plasma treatment to penetrate substantially the entire thickness of the deposited film. If the nitrogen plasma treatment was performed after deposition of the entire thickness of the silicon nitride film, only a thin surface region of the deposited material would be properly treated.

The modified deposition process comprises a sufficient number of deposition cycles followed by plasma treatment cycles to achieve the desired film thickness. For example, a deposition process comprising twenty (20) process cycles that each comprises a first deposition cycle and a second nitrogen plasma treatment cycle, deposited a tensile stressed silicon nitride material having a thickness of 500 angstroms. Each deposition cycles was performed for about 2 to about 10 seconds and more typically about 5 seconds; and each nitrogen plasma treatment cycle was performed for about 10 to about 30 seconds, and more typically 20 seconds. The resultant deposited tensile stressed silicon nitride material had a thickness of 500 angstroms, and the tensile stress value of the deposited material was increased by the nitrogen plasma treatment to 1.4 GPa. This represented a 10 to 20% improvement over the tensile stress of the as-deposited silicon nitride material, as shown below in Table II.

TABLE II

| | Tensile Film Stress (GPa) Temperature | | | | |
|---|---|---|---|---|---|
| | 400° C. | 430° C. | 450° C. | 480° C. | 500° C. |
| Baseline (Single Material) | 1.0 | 1.1 | 1.2 | 1.3 | 1.35 |
| NPT (1)-20s Treat | 1.3 | 1.35 | 1.44 | 1.44 | 1.43 |
| NPT (2)-10s Treat | 1.3 | 1.35 | 1.4 | 1.4 | 1.43 |

NPT = Nitrogen Plasma Treatment

Table II shows the improvement in tensile stress of a deposited silicon nitride material with increased substrate temperature during deposition, and with/without multiple nitrogen plasma treatment cycles. The baseline (single material) silicon nitride film was deposited in a single deposition process cycle using the process conditions described above, without nitrogen plasma treatment cycles. The baseline film showed an increase in tensile stress from 1 GPa to about 1.35 GPa as the substrate temperature was increased from 400 to 500° C. The NPT (nitrogen plasma treatment) films were deposited with multiple deposition and nitrogen plasma process cycles—where NPT (1) corresponds to 20 second nitrogen plasma treatment cycles and NPT (2) corresponds to 10 second nitrogen plasma treatment cycles. It is seen that for both NPT films, the tensile stress increased from the baseline film with the nitrogen plasma treatment and also increased with substrate temperature.

Figure 6:
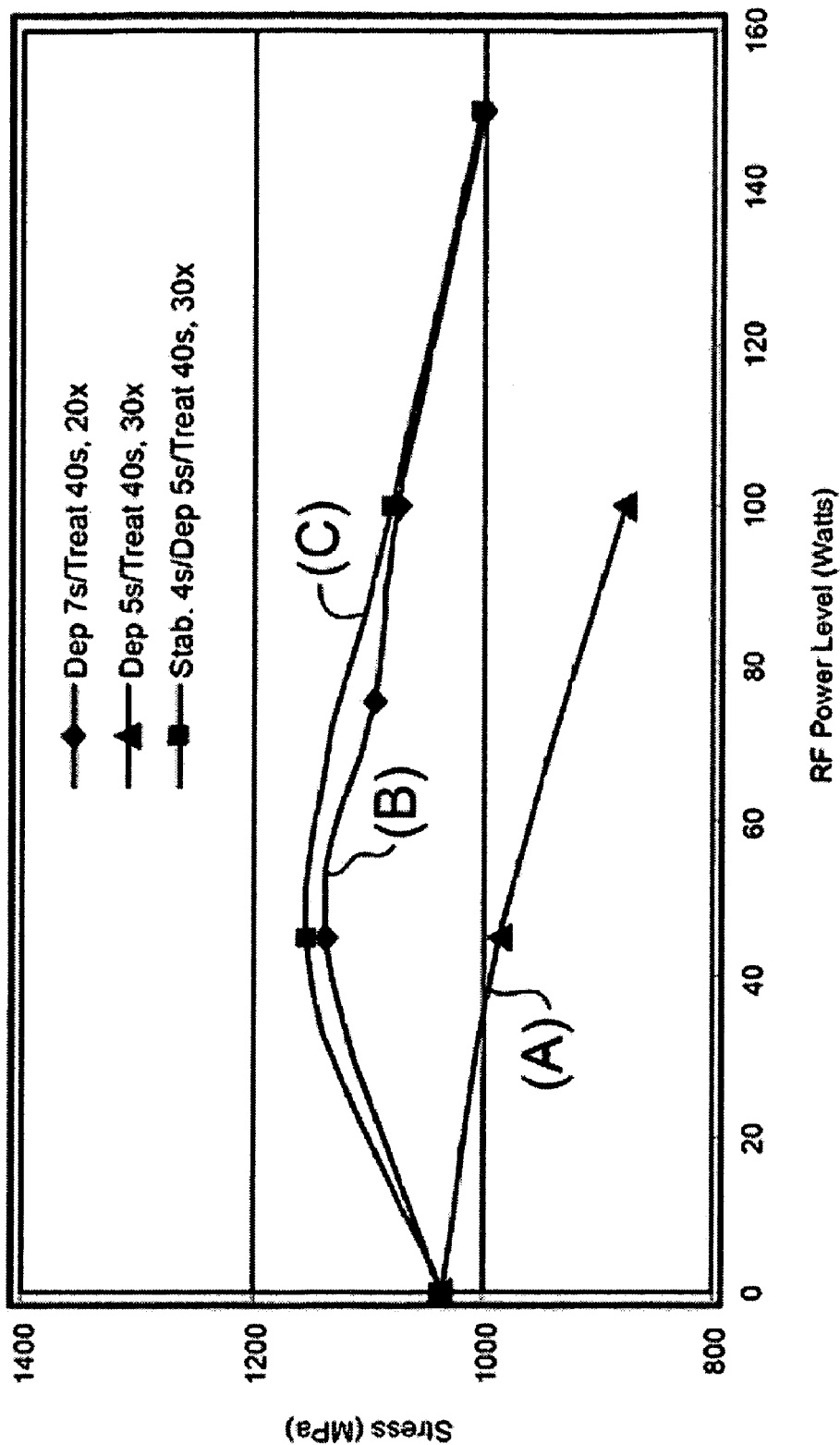
FIG. 6 is a graph showing measured tensile stresses for increasing power level of the high RF voltage and different nitrogen plasma treatment process cycles.

FIG. 6 shows the effect of increasing power level of the high RF voltage applied to the electrodes 105, 109, for different nitrogen plasma treatment process conditions, on the tensile stress values of the deposited materials. The first process (A) comprised a deposition stage for 7 seconds, followed by a plasma treatment stage of 40 seconds, repeated for 20 cycles. The second process (B) involved a deposition stage for 5 seconds, followed by plasma treatment for 40 seconds, repeated for 30 cycles. The third process involved plasma stabilizing stage for 4 seconds, deposition for 5 seconds, and plasma treatment for 40 seconds, for 30 cycles. The first and third processes resulted in the highest tensile stress values, when the high radio frequency was set to a power level of a little over 40 Watts, with tensile stress values decreasing on either side of that peak level. The third process steadily decreased in tensile stress value for increasing power levels from a tensile stress value of a little over a 1000 MPa at a power of 0 Watts to 900 MPa at a power of 100 Watts. Thus a power level of 20 to 60 watts, and more preferably 45 watts, was selected for nitrogen plasma/deposition processes.

Figure 7:
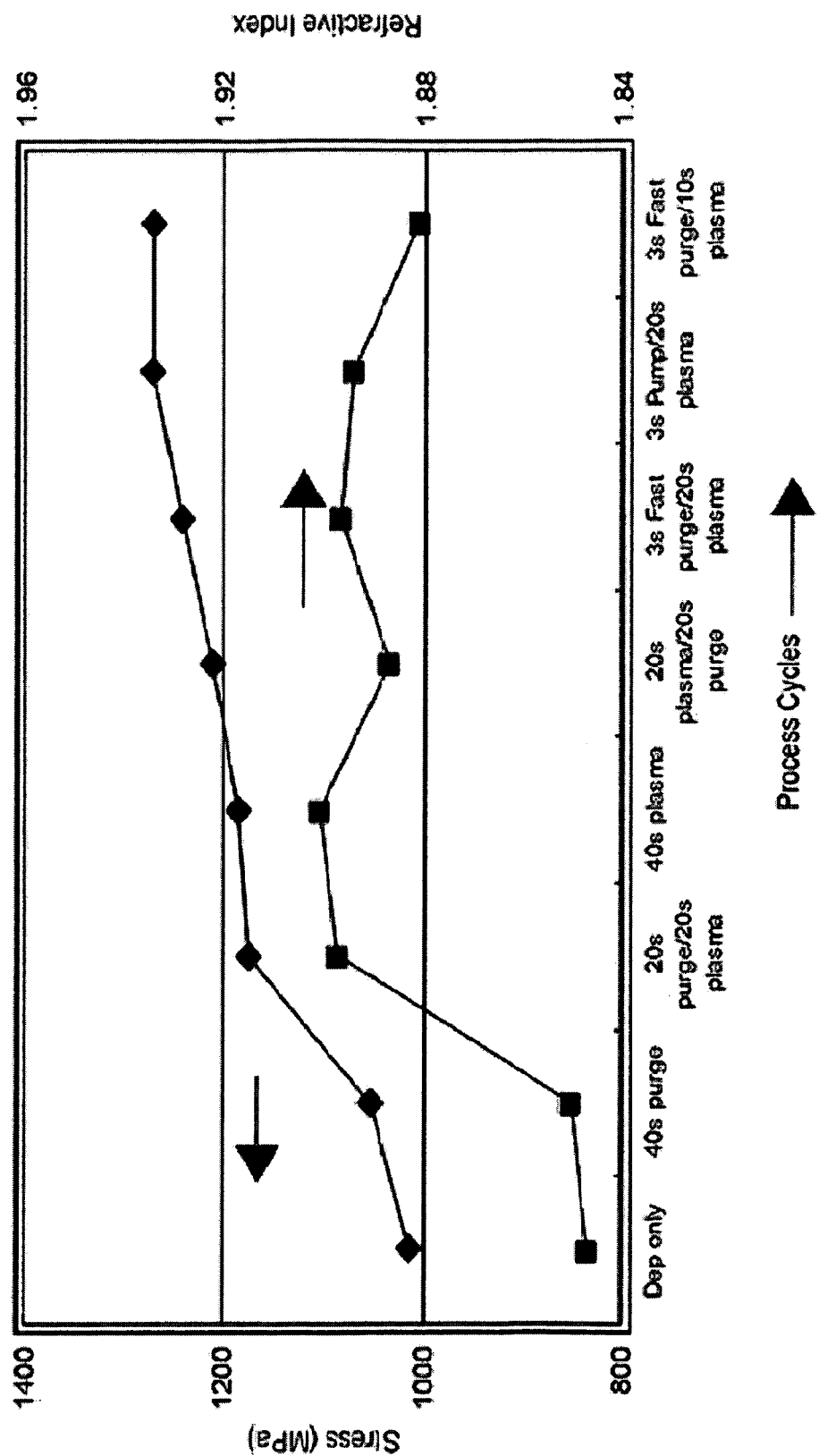
FIG. 7 is a graph showing the tensile stress values and refractive indices obtained for layers deposited under different deposition and nitrogen plasma treatment process cycles.

FIG. 7 shows the tensile stress values and refractive indices obtained for layers deposited under different deposition processes and different nitrogen plasma treatment cycles. The top line indicates the measured tensile stress values and the bottom line indicated the measured refractive indices. The processes included: a deposition only process; a process with a 40 second purge to see the effect without RF power, that is only thermal impact; a process with a 20 second purge then 20 second plasma step; a process with a 40 second plasma step; a process with a 20 second plasma step then 20 second purge; a process with a 3 second fast purge than 20 second plasma step; a process with a 3 second pump and 20 second plasma step, and a process with a 3 second fast purge and 10 second plasma step. The layers were formed by a performing a sequence of 30 consecutive cycles.

The highest tensile stress values were achieved with the 3 second pump, 20 second plasma and 3 second fast purge, 10 second plasma processes. The lowest tensile stress values were measured for the deposition only and 10 second purge processes. Generally, the stress value obtained maximizes and evens out for plasma treatment durations longer than 10 sec; however, the stress values do not saturate for treatment durations that were longer than 20 sec when a pump down cycle was added.

Table III below illustrates the exemplary process conditions for each step during the cycle shown in FIG. 7.

TABLE III

| STEP | $SiH_4$ (sccm) | $NH_3$ (sccm) | $N_2$ (L) | Press. (T) | Power (W) | Duration (sec) |
|---|---|---|---|---|---|---|
| Stabilize | 25 | 50 | 20 | 6 | 0 | 4 |
| Deposit | 25 | 50 | 20 | 6 | 45 | 5 |
| Pump | 0 | 0 | 0 | TFO | 0 | 30 |
| Fast Purge | 0 | 0 | 20 | TFO | 0 | 30 |
| Purge | 0 | 0 | 20 | 6 | 0 | 5-40 |
| Treat | 0 | 0 | 20 | 6 | 45 | 20-40 |

All steps performed at 400° C., with a wafer-to-faceplate spacing of 430 mils
TFO = throttle valve fully open.

Figure 8:
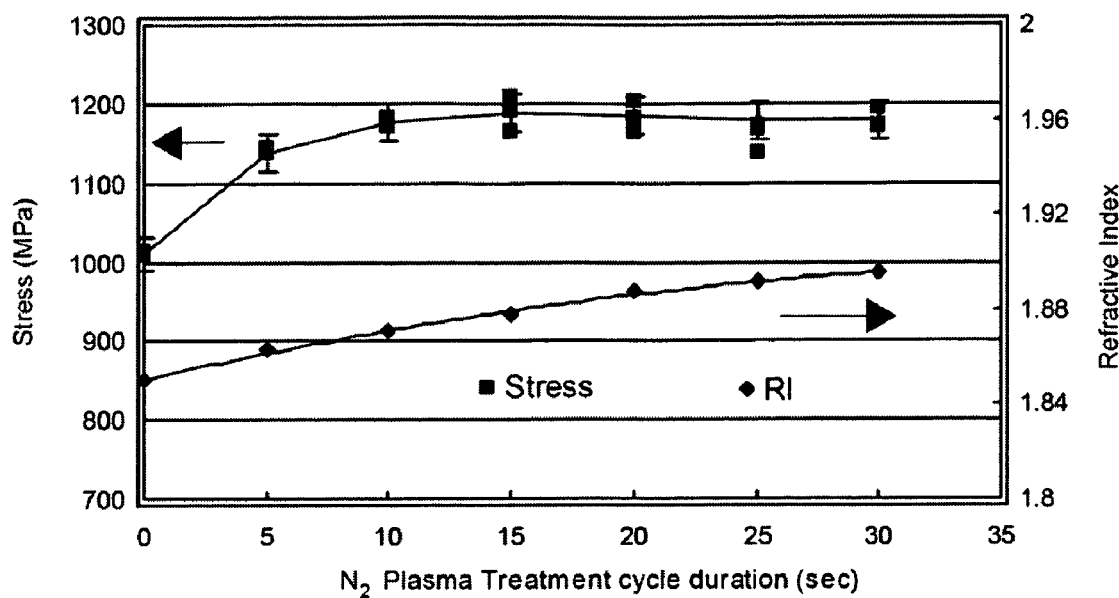
FIG. 8 is a graph showing the change in tensile stress values of deposited materials with $N_2$ plasma treatment time.

FIG. 8 shows the effect of the duration of $N_2$ plasma treatment on the tensile stress values of deposited materials. The tensile stress values increase until a treatment duration of about 10 seconds is reached, after which the tensile stress values appears to "saturate" and do not get much larger. The refractive index increases slightly with increasing treatment time.

Figure 9:
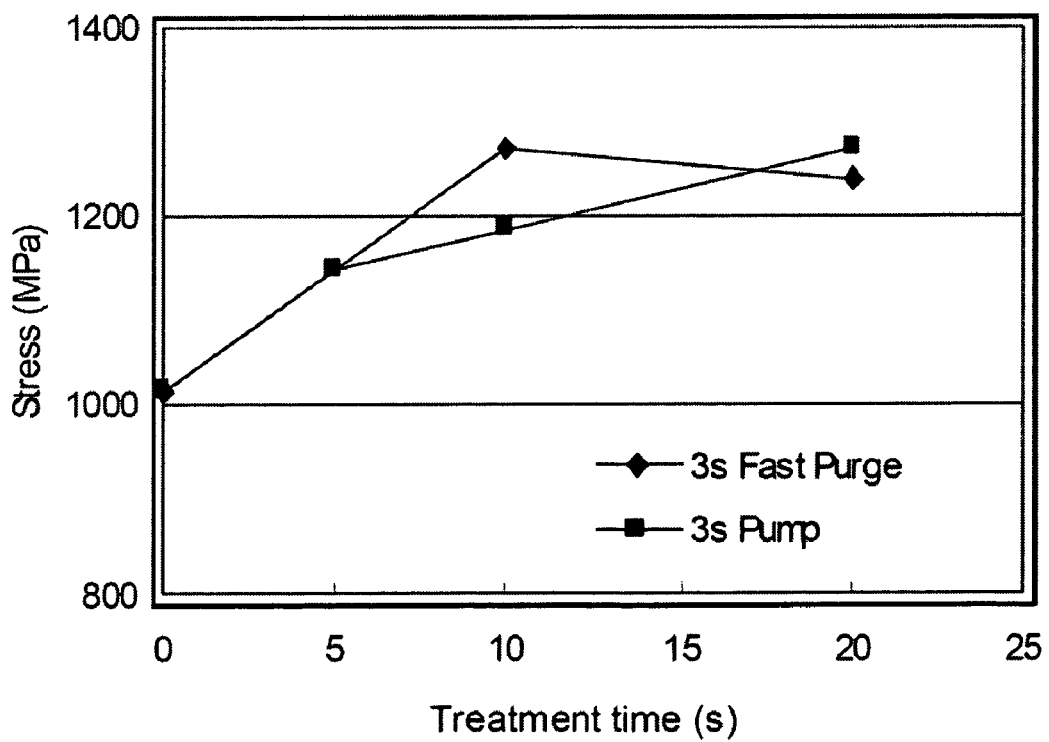
FIG. 9 is a graph showing the effect of $N_2$ plasma treatment time on the tensile stress value for processes having different purge and pump cycles.

FIG. 9 shows the effect of the treatment duration on the tensile stress value for processes having a 3 second fast purge and a 3 second pump. The tensile stress values in FIG. 9 do not appear to "saturate" as much as those in FIG. 8, even for treatment times up to about 20 seconds.

It has been discovered that the implementation of additional steps in the nitrogen plasma treatment can result in an even greater enhancement of the level of tensile stress in the resulting film. Table IV summarizes the process sequence for various different cycles of $N_2$ plasma exposure.

TABLE IV

| Process Sequence | Step Time (x # cycles) (sec) | Thickness (Å) | RI | Stress (MPa) | Throughput Twin Tool (Wafers/hr) |
|---|---|---|---|---|---|
| Dep only (Baseline) | 134 | 500 | 1.847 | 1000 | 20 |
| Dep/Treat (DP) | 10/20 (×5) | 525 | 1.874 | 1100 | 10 |

TABLE IV-continued

| Process Sequence | Step Time (x # cycles) (sec) | Thickness (Å) | RI | Stress (MPa) | Throughput Twin Tool (Wafers/hr) |
|---|---|---|---|---|---|
| Stab/Dep/Treat (SDT) | 4/5/20 (×25) | 580 | 1.892 | 1180 | 6 |
| Stab/Dep/Pump/Purge/Treat (SDPPuT) | 4/5/3/5/20 (×30) | 510 | 1.891 | 1230 | 4.5 |

Figure 10:
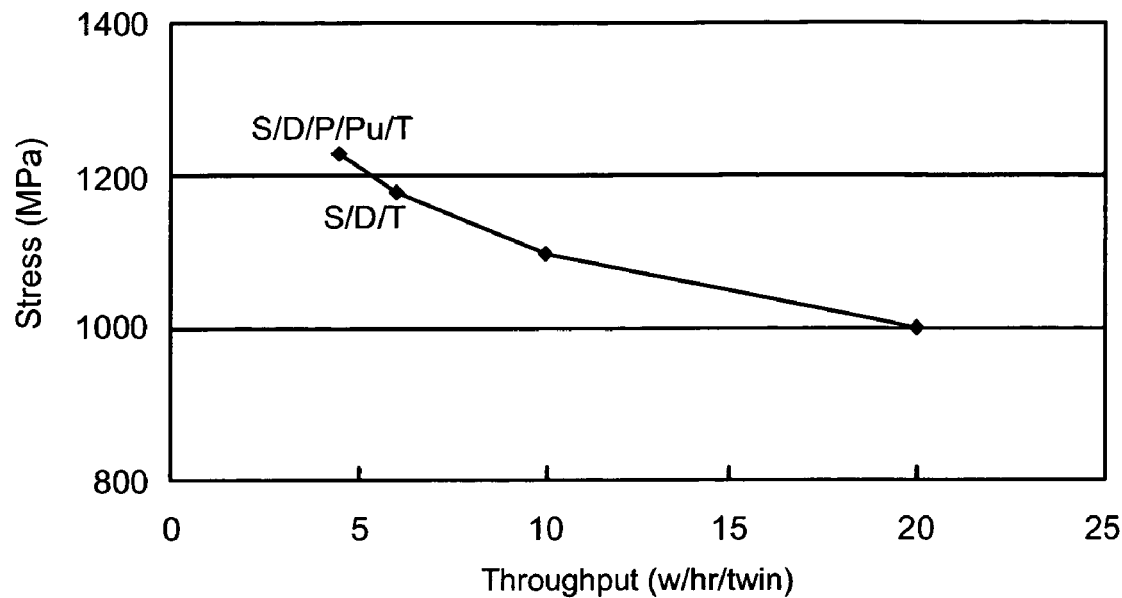
FIG. 10 plots film tensile film stress versus throughput for CVD SiN films formed with different dep/treat cycles.

FIG. 10 plots film stress versus process throughput, for a twin chamber tool, for each of the $N_2$ plasma exposure cycles shown in Table IV. FIG. 10 shows that the addition of steps to each cycle reduces process throughput.

Figure 11A:
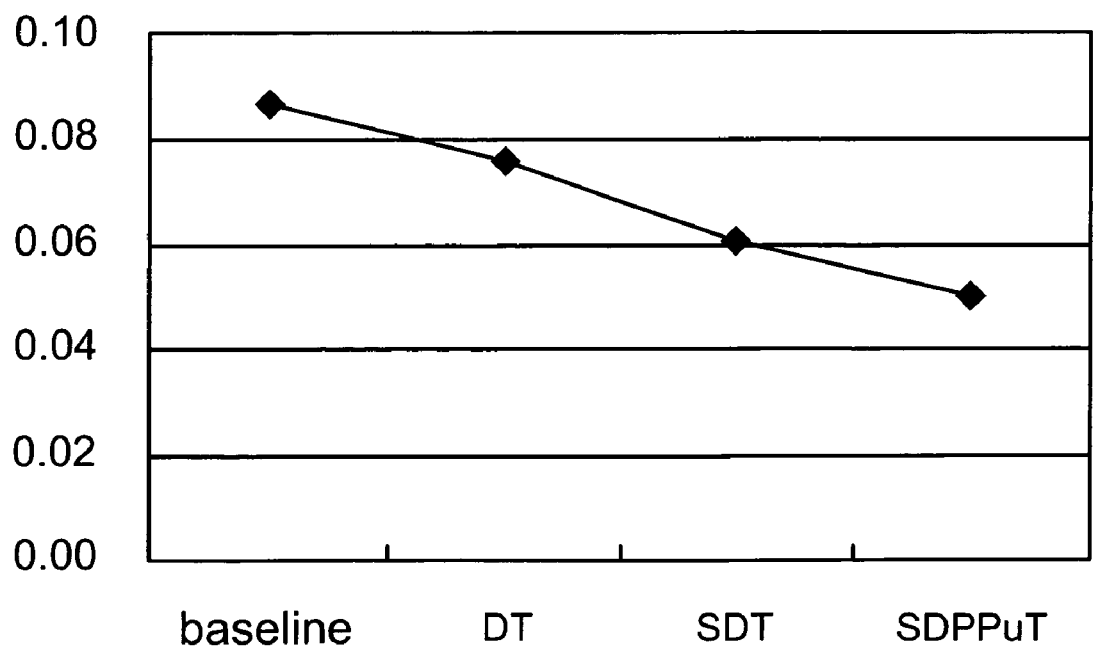
FIG. 11A shows FT-IR spectra for a CVD SiN film resulting from deposition at 400° C. under the various cycle and times shown in Table IV.
Figure 11B:
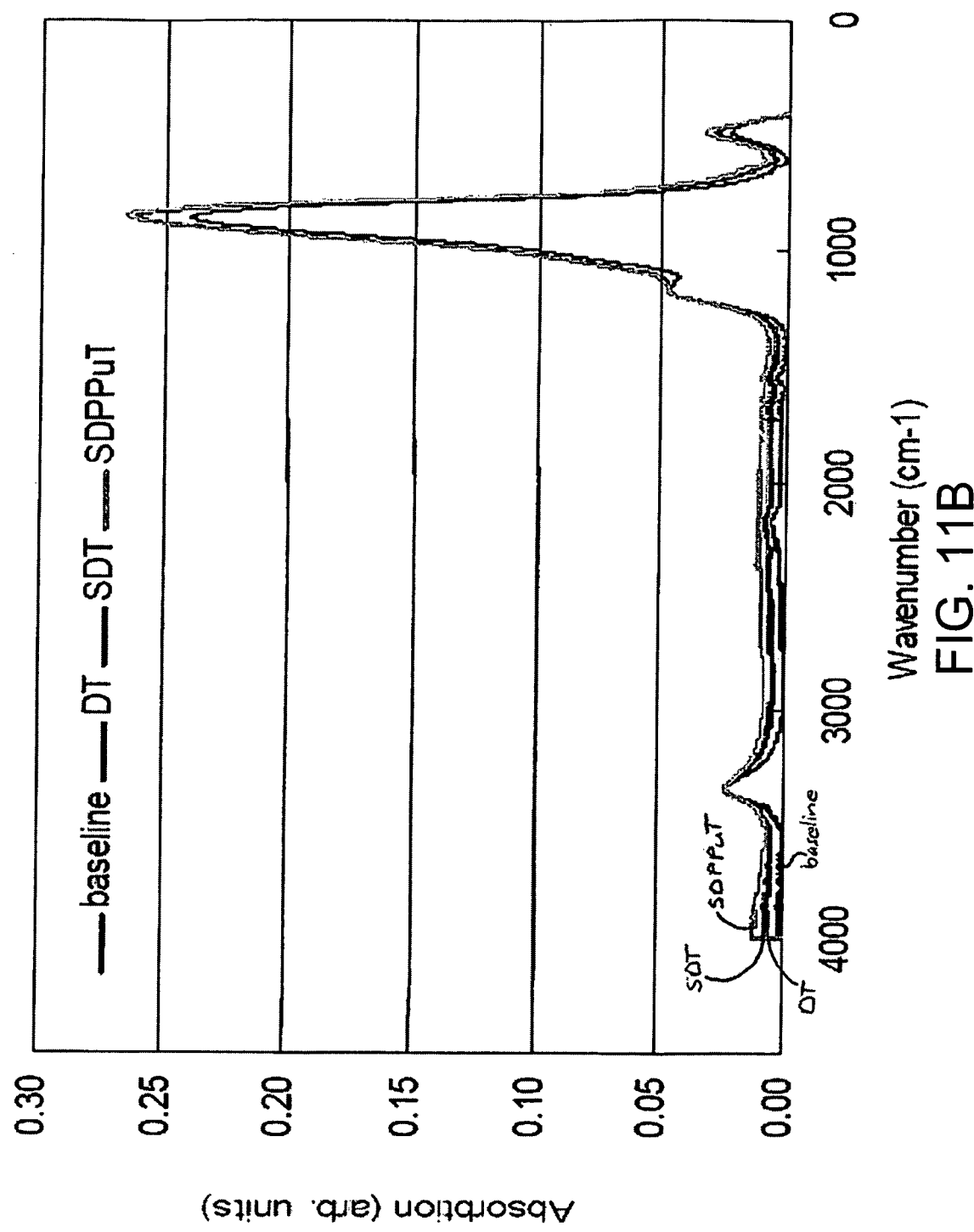
FIG. 11B plots the ratio of N—H:Si—N bonds of the CVD SiN films resulting from deposition under the various cycle conditions shown in Table IV.

FIG. 11 shows FT-IR spectra for a 2800 Å-thick CVD SiN film resulting from deposition at 400° C. under the various cycles and times shown in Table IV. FIG. 11 shows that the $N_2$ treatment removes hydrogen from both Si—H and N—H bonds, and the peaks at 2200 cm$^{-1}$ and 3330 cm$^{-1}$ respectively decrease. An additional indication that N—H is reduced by the $N_2$ treatment is the decrease in the peak/shoulder at 1167 cm$^{-1}$, which corresponds to the Si—NH—Si bond. This peak 1167 cm$^{-1}$ becomes more pronounced when there are a significant number of N—H bonds in the film.

Without wishing to be limited by any particular theory, it is believed that $N_2$ treatment reduces the hydrogen content in the film leading to the formation of strained Si—N bonds. By introducing additional steps (such as purge and/or pump) after deposition, the effect of the $N_2$ treatment is enhanced because there are no more deposition gases in the chamber. By contrast, where residual $SiH_4$ and $NH_3$ remains in the chamber during treatment, some deposition continues and treatment is not able to penetrate as well into the material already deposited.

FIG. 11A plots the ratio of N—H:Si—N bonds of the CVD SiN films resulting 20 from deposition under the various cycle conditions shown in Table IV. FIG. 11A shows that the addition of steps to the $N_2$ plasma exposure cycle can reduce N—H content by up to about 40%.

Table V presents stress results for CVD SiN films formed at increasing temperatures utilizing a Producer® SE tool.

TABLE V

| | Tensile Film Stress (GPa) Temperature (° C.) | | |
|---|---|---|---|
| Cycle | 400 | 430 | 450 |
| Baseline | 1.0 | 1.1 | 1.2 |
| D/T | 1.1 | 1.2 | — |
| S/D/T | 1.2 | 1. | 1.44 |
| S/D/P/Pu/T | 1.3 | — | 1.4 |

Table V shows that a CVD SiN film having a tensile stress of 1.5 GPa may be formed within a thermal budget of 450° C., utilizing the modified tensile process regime.

Figure 12A:
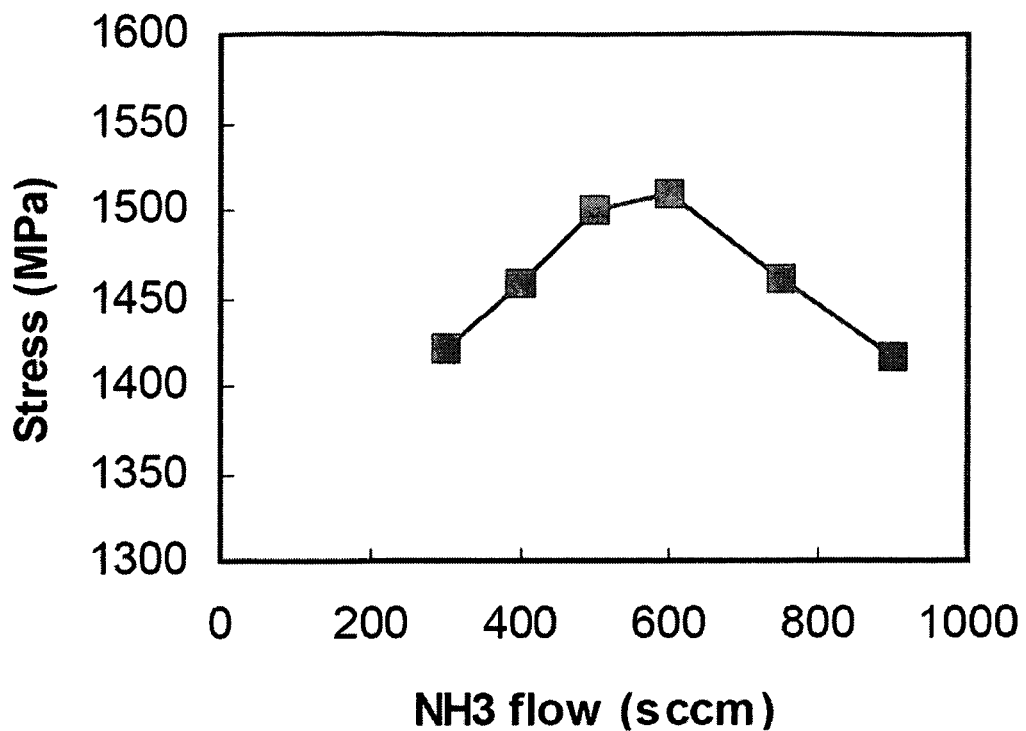
FIGS. 12A-D plotting film stress of a CVD SiN film formed at 450° C. under a variety of different process conditions.
Figure 12B:
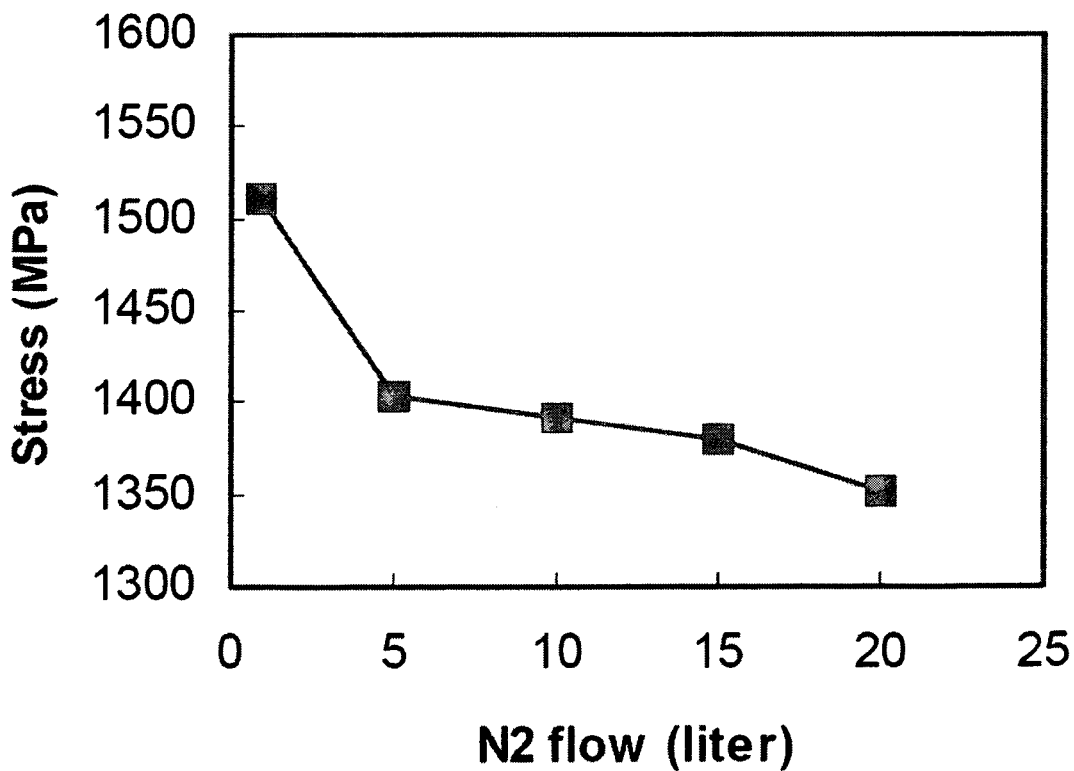
Figure 12C:
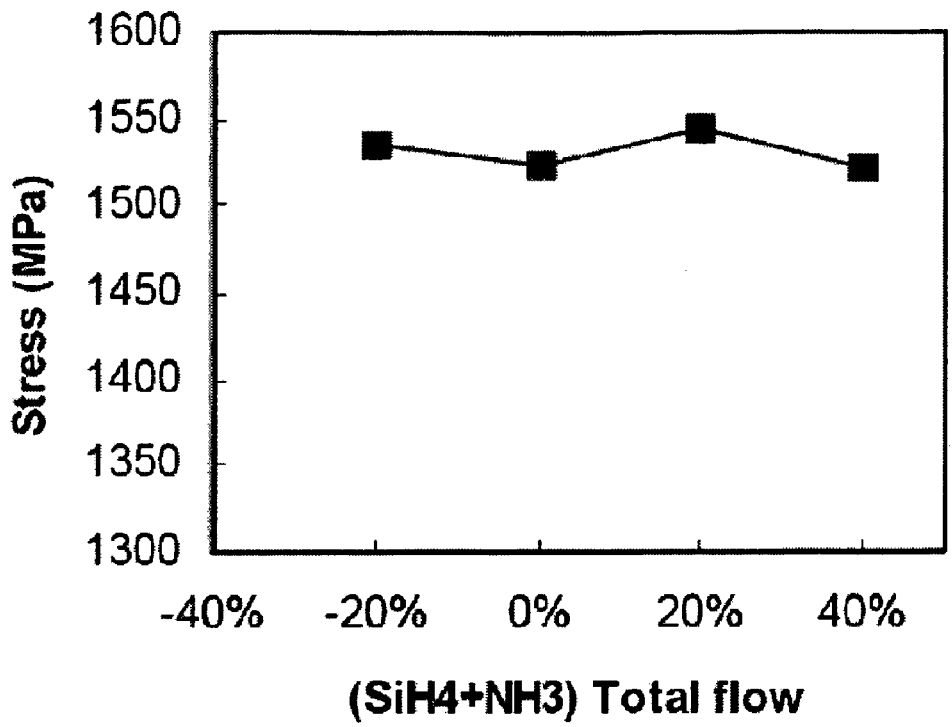
Figure 12D:
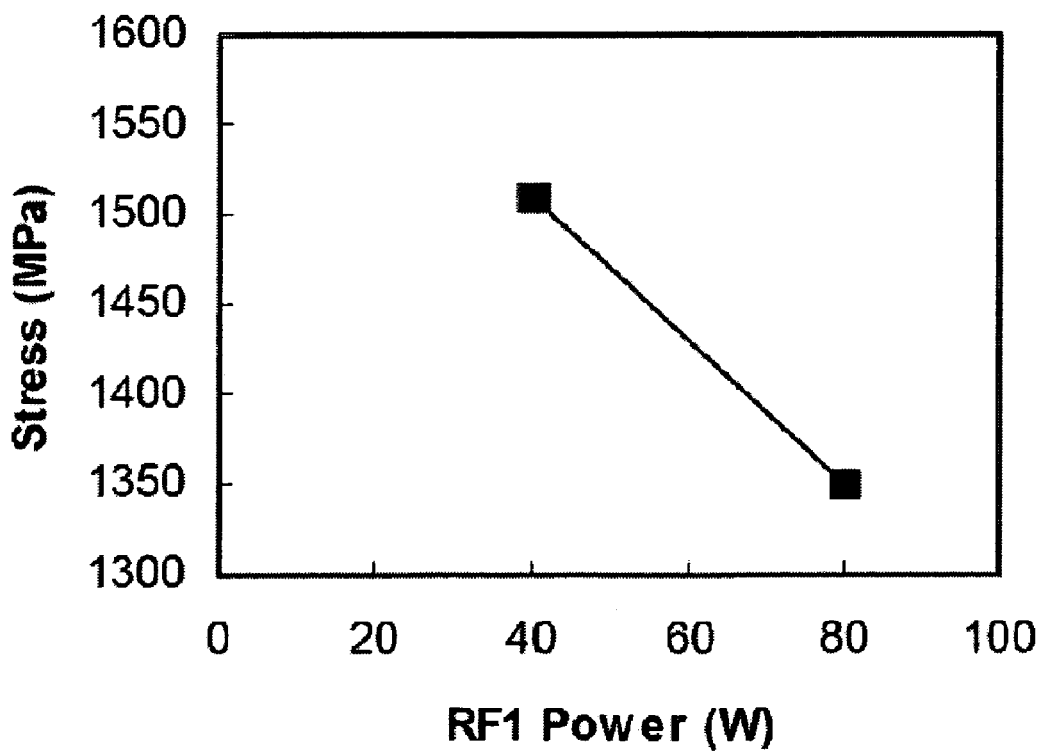

FIGS. 12A-D confirm this result, plotting various attributes of a CVD SiN film formed at 450° C. under different process conditions. FIG. 12A plots film stress versus $NH_3$ flow and indicates that a tensile stress of 1.5 GPa was achieved. FIG. 12B plots film stress versus $N_2$ flow, and indicates that a tensile stress of 1.5 GPa was achieved with lower $N_2$ flow rates. FIG. 12C plots film stress versus the total $SiH_4$ and $NH_3$ flow rate, and shows that film stress is not a strong function of this process parameter. FIG. 12D plots film stress versus applied RF power, and shows that a tensile film stress of 1.5 GPa was achieved with a lower RF power.

B. Argon (Plasma Treatment)

As described above, exposure of a CVD film to a plasma including a nitrogen containing gas may enhance tensile stress of the film. In accordance with another embodiment of the present invention, stress of a CVD film may also be enhanced by exposing the film during and/or after deposition to a plasma including Argon gas.

FIGS. 13A-F illustrate properties of a CVD SiN film formed by a dep/treat cycle under the conditions shown below in Table VI:

TABLE VI

| CYCLE STEP | $SiH_4$ (sccm) | $NH_3$ (sccm) | $N_2$ (L) | $N_2 + Ar$ (L) | RF Power (W) |
|---|---|---|---|---|---|
| Deposition (Dep) | 60 | 900 | 1 | — | 100 |
| Treatment (Treat) | 0 | 0 | — | 20 | varied |

Pressure = 8.5 Torr
Wafer-to-faceplate spacing = 300 mils

Figure 13A:
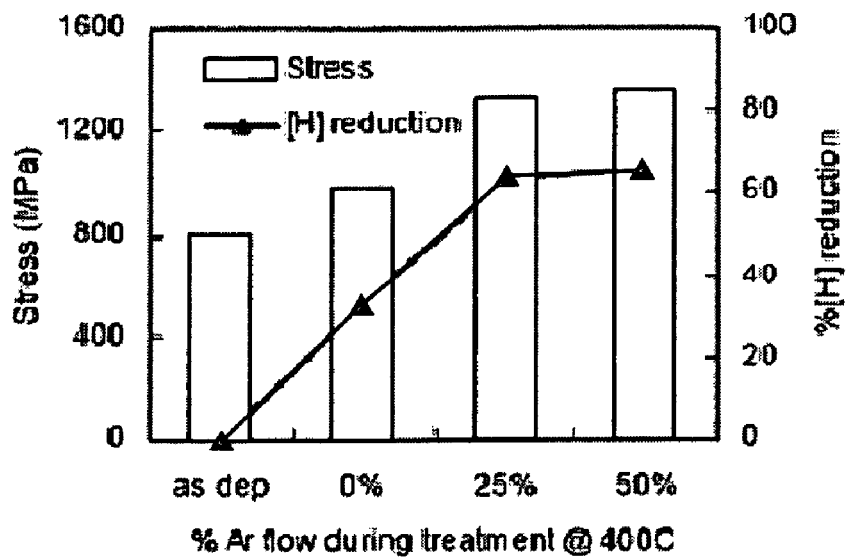
FIG. 13A charts tensile stress and plots reduction in hydrogen content for CVD SiN films exposed to post-deposition treatment with plasma formed from gases containing different levels of Argon, at 400° C.
Figure 13B:
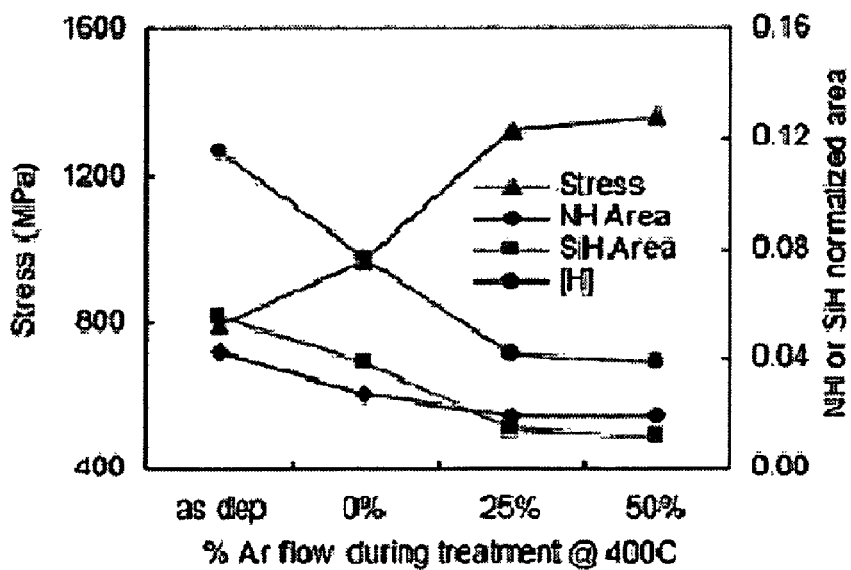
FIG. 13B plots tensile stress, H content, and FT-IR spectrum peak area for N—H and Si—H bonds, for the CVD SiN films deposited in FIG. 13A.

FIGS. 13A-B show the effect of varying the % of Ar gas flowed during the post deposition treatment, where deposition and treatment are performed at 400° C. FIGS. 13A-B show that the amount of tensile stress resulting in the deposited film directly correlates with reduction in hydrogen content ([H]) in the resulting film. FIGS. 13A-B also show that the increase in tensile stress is a function of Argon gas content and saturates at a % Ar of greater than about 25%.

Figure 13C:
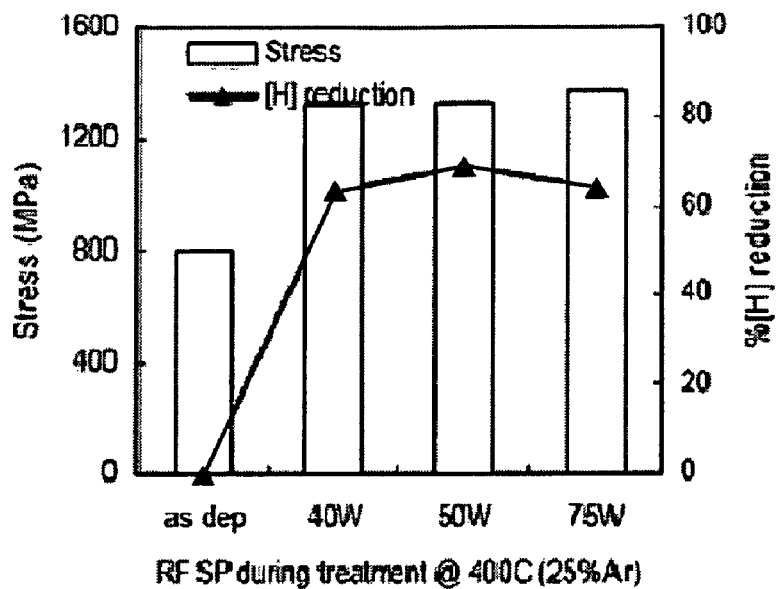
FIG. 13C charts tensile stress and plots reduction in hydrogen content for CVD SiN films exposed to post-deposition treatment with an Ar plasma at different power levels.
Figure 13D:
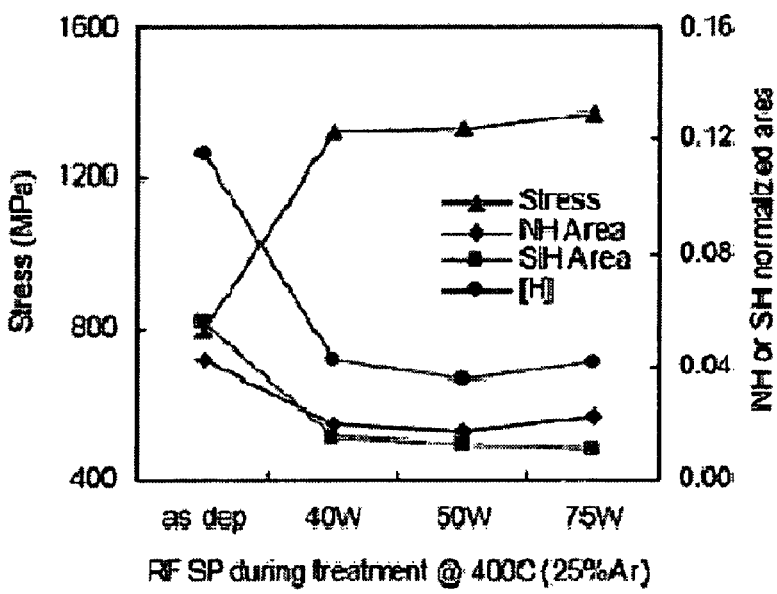
FIG. 13D plots tensile stress, H content, and FT-IR spectrum peak area for N—H and Si—H bonds, for the CVD SiN films deposited in FIG. 13C.

FIGS. 13C-D show the effect of varying the RF power level applied during the post-deposition Ar treatment, where Ar is 25% of the gas flow and both the deposition and treatment take place at 400° C. FIGS. 13C-D show that the increase in tensile stress is fairly insensitive to the treatment RF power.

Figure 13E:
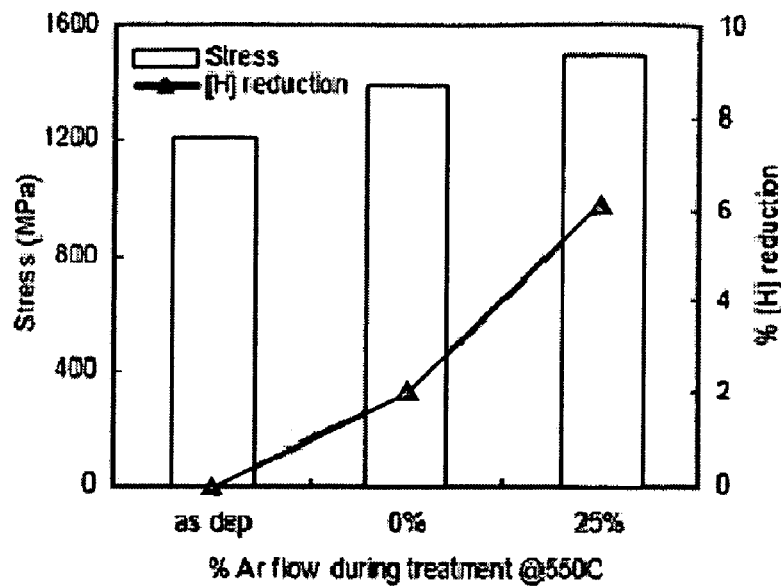
FIG. 13E charts tensile stress and plots reduction in hydrogen content for CVD SiN films exposed to post-deposition treatment with plasma formed from gases containing different levels of Argon, at 550° C.
Figure 13F:
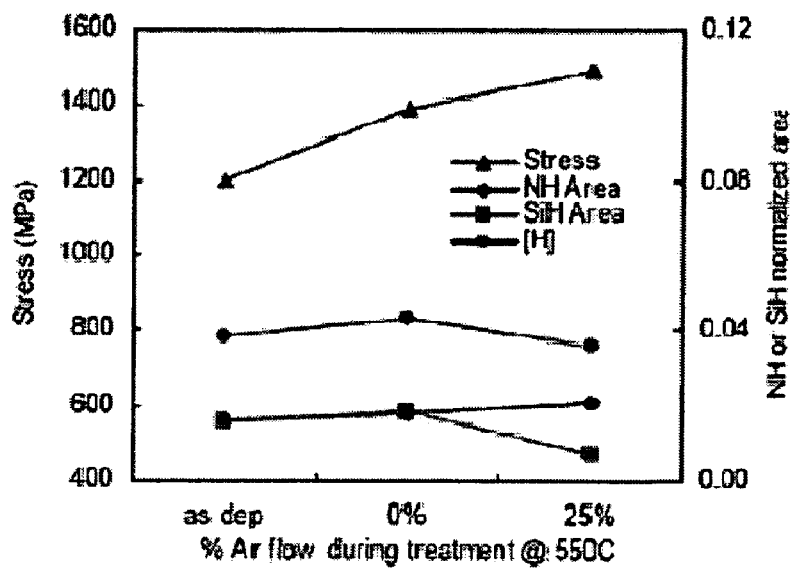
FIG. 13F plots tensile stress, H content, and FT-IR spectrum peak area for N—H and Si—H bonds, for the CVD SiN films deposited in FIG. 13F.

FIGS. 13E-F show the effect of varying the temperature upon deposited films treated with plasma including varying amounts of Argon. Specifically, the dep/treat cycles of FIGS. 13E-F were performed at 550° C. FIGS. 13E-F confirm that the increase is tensile stress of the resulting film directly correlates with reduction in hydrogen content of the film. FIGS. 13E-F also indicate that the treatment is less effective when the deposition takes place at a higher temperature (i.e., 550° C. vs. 400° C.). FIGS. 13E-F show the total hydrogen content in the "as deposited" film is lower when compared to the film deposited at 400° C. (FIGS. 13A-B) which leads to a lower reduction in total hydrogen content during plasma treatment.

C. Ultraviolet Radiation Exposure

The tensile stress of an as-deposited silicon nitride material can be further increased by treating the deposited material with exposure to a suitable energy beam, such as ultraviolet radiation or electron beams. It is believed that ultraviolet and electron beam exposure can be used to further reduce the hydrogen content in the deposited material. The energy beam exposure can be performed within the CVD chamber itself or in a separate chamber. For example, a substrate having the deposited stressed material could be exposed to ultraviolet or electron beam radiation inside the CVD processing chamber. In such an embodiment, the exposure source could be protected from the CVD reaction by a shield or by introducing the exposure source into the chamber subsequent to the flow of process gas. The ultraviolet or electron beams could be applied to the substrate, in-situ in the CVD deposition chamber during a CVD reaction to deposit the stressed material. In this version, it is believed that ultraviolet or e-beam exposure during the deposition reaction would disrupt undesirable bonds as they are formed, thereby enhancing the stress values of the deposited stressed material.

Figure 18:
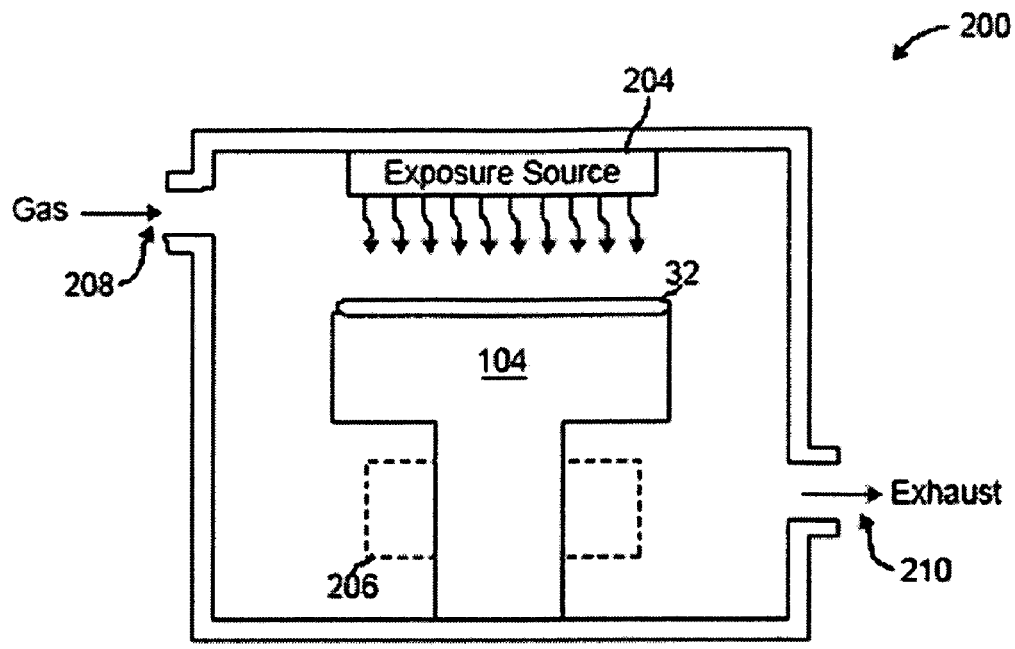
FIG. 18 is a schematic view of an exposure chamber suitable for exposing a silicon nitride material to a suitable energy beam source.

FIG. 18 shows an exemplary embodiment of an exposure chamber 200 which can be used to expose a substrate 32 to ultraviolet radiation or electron beam treatment. In the version shown, the chamber 200 includes a substrate support 104 moveable between a released position distal from the exposure source 204, and a lifted position proximate to the source 204 to allow adjustment of the spacing therebetween. A substrate support 104 supports the substrate 32 in the chamber 200. During insertion and removal of the substrate 32 from the exposure chamber 200, the substrate support 104 can be moved to a loading position, and thereafter, during exposure of the substrate 32 having the deposited silicon nitride material to ultraviolet radiation or electron beams, the support 104 is raised into the lifted position to maximize exposure levels. The chamber 200 further comprises a heater 206, such as a resistive element, which can be used to heat the substrate 32 to a desired temperature during exposure of the substrate 32. A gas inlet 208 is provided to introduce a gas into the exposure chamber 200 and a gas outlet 210 is provided to exhaust the gas from the chamber 200.

The exposure chamber 200 further includes an exposure source 204 that provides a suitable energy beam, such as ultraviolet radiation or electron beams. A suitable ultraviolet radiation source can emit a single ultraviolet wavelength or a broadband of ultraviolet wavelengths. A suitable single wavelength ultraviolet source comprises an excimer ultraviolet source that provides a single ultraviolet wavelength of 172 nm or 222 nm. A suitable broadband source generates ultraviolet radiation having wavelengths of from about 200 to about 400 nm. Such ultraviolet sources can be obtained from Fusion Company, USA or Nordson Company, USA. The stressed silicon nitride material may be exposed to ultraviolet radiation having other wavelengths that are generated by lamps that contain gas that radiates at specific wavelengths when electrically stimulated. For example, suitable ultraviolet lamp may comprise Xe gas, which generates ultraviolet radiation having a wavelength of 172 nm. In other versions, the lamp may comprise other gases having different corresponding wavelengths, for example, mercury lamps radiate at a wavelength of 243 nm, deuterium radiates at a wavelength of 140 nm, and $KrCl_2$ radiates at a wavelength of 222 nm. Also, in one version, generation of ultraviolet radiation specifically tailored to modify the stress value in the deposited stressed material can be accomplished by introducing a mixture of gases into the lamp, each gas capable of emitting radiation of a characteristic wavelength upon excitation. By varying the relative concentration of the gases, the wavelength content of the output from the radiation source can be selected to simultaneously expose all of the desired wavelengths, thus minimizing the necessary exposure time. The wavelength and intensity of the ultraviolet radiation can be selected to obtain predetermined tensile stress value in the deposited silicon nitride material.

The CVD deposition chamber 80 and exposure chamber 200 may also be integrated together on a multi-chamber processing platform (not shown) served by a single robot arm. The exposure source 204 and the support of the exposure chamber 200, and the components of the CVD deposition chamber 80 that include the substrate support 104, motor, valves or flow controllers, gas delivery system, throttle valve, high frequency power supply, and heater 206, and the robot arm of the integrated processing system, may all be controlled by a system controller over suitable control lines. The system controller relies on feedback from optical sensors to determine the position of movable mechanical assemblies such as the throttle valve and substrate support 104 which are moved by appropriate motors under the control of the controller.

For exposure treatment in the described exposure chamber 200, a substrate having a silicon nitride material according to any of the deposition processes described or other deposition processes known in the art, is inserted into the exposure chamber 200 and placed upon the substrate support 104 in the lowered position. The substrate support 104 is then raised to a lifted position, the optional heater 206 in the support powered on, and the exposure source 204 is activated. During exposure, a gas may be circulated through the exposure chamber 200, such as helium, to improve thermal heat transfer rates between the substrate and the support. Other gases may also be used. After a period of radiation exposure, the exposure source 204 is deactivated and the substrate support 104 is lowered back into the released position. The substrate bearing the exposed silicon nitride stressed material is then removed from the exposure chamber 200.

Figure 19:
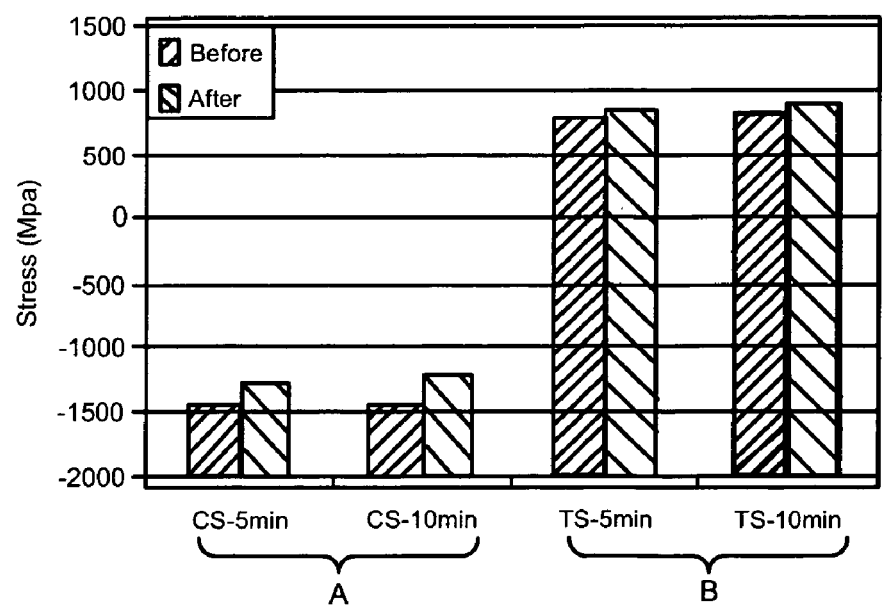
FIG. 19 is a bar graph showing the change in tensile stress values of material deposited at different process conditions (A, and B) for increasing ultraviolet radiation exposure time.

FIG. 19 is a bar graph showing the effect of ultraviolet radiation treatment on the tensile stress values of materials deposited at different process conditions including A: compressive film (45 sccm $SiH_4$/600 sccm $NH_3$/2000 sccm He/30W HF/30W LF/2.5T/480 mils/430° C.); and B: tensile film (75 sccm $SiH_4$/1600 sccm $NH_3$/5000 sccm $N_2$50W HF/5 W LF/6 T/480 mils/430° C.). Different broadband UV treatment times at 400° C. of 5 minutes and 10 minutes were used. For all deposited films, ultraviolet radiation exposure increased tensile stress values, with the greatest improvement occurring for the materials having the lowest tensile stress values, namely materials A and B. A and B increased in a tensile stress of level from about −1500 MPa to around about −1300 MPa. Materials C and D also increased. Thus, the ultraviolet treatment can increase the tensile stress value for deposited materials.

Figure 20:
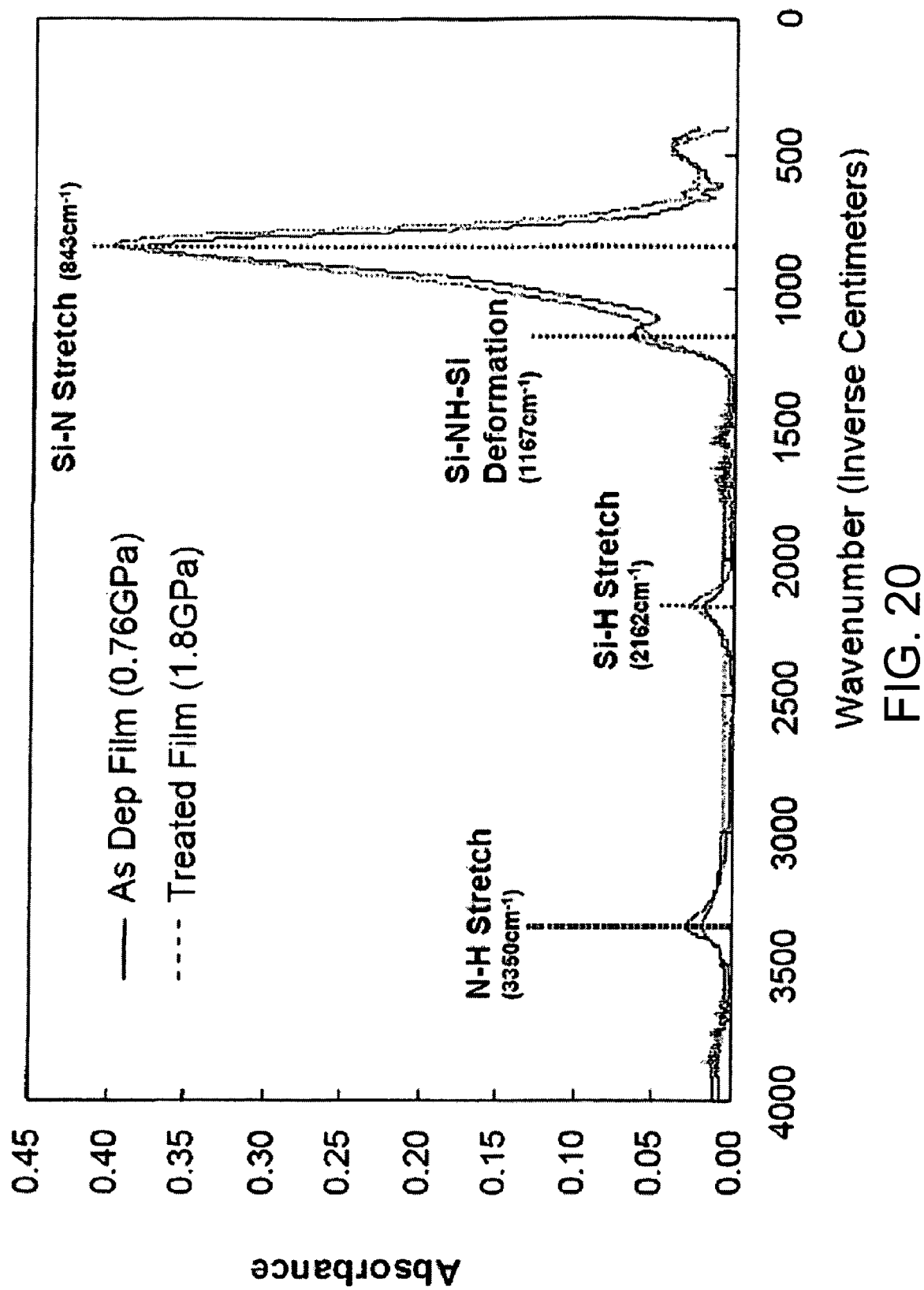
FIG. 20 is a graph showing a Fourier Transformed Infrared (FT-IR) spectrum of a stressed silicon nitride material in the as-deposited state (as dep.-continuous line), and after treatment with ultraviolet radiation (treated film—dashed line)

It was determined that exposure of the deposited silicon nitride material to ultraviolet radiation or electron beams is capable of reducing the hydrogen content of the deposited material, and thereby increasing the tensile stress value of the material. It is believed that exposure to ultraviolet radiation allows replacement of unwanted chemical bonds with more desirable chemical bonds. For example, the wavelength of UV radiation delivered in the exposure may be selected to disrupt unwanted hydrogen bonds, such as the Si—H and N—H bond that absorbs this wavelength. The remaining silicon atom then forms a bond with an available nitrogen atom to form the desired Si—N bonds. For example, FIG. 20 shows a Fourier Transformed Infrared spectrum (FT-IR) of a stressed silicon nitride material in the as-deposited state (as dep.—continuous line), and after treatment with ultraviolet radiation (treated film—dashed line). From the FT-IR spectrum, it is seen that after treatment with the ultraviolet radiation, the size of both the N—H stretch peak and the Si—H stretch peak significantly decrease, while the size of the Si—N stretch peak increases. This demonstrates that after ultraviolet treatment, the resultant silicon nitride material contains fewer N—H and Si—H bonds, and an increased number of Si—N bonds which are desirable to increase the tensile stress of the deposited material.

FIGS. 21A to 21E show the improvement in tensile stress value of an as-deposited silicon nitride material that is subjected to different periods of ultraviolet exposure treatment times. The silicon nitride material of FIG. 21A was deposited under the following process conditions 60 sccm flow rate of silane; 900 sccm flow rate of ammonia; 10,000 sccm flow rate of nitrogen; 6 Torr process gas pressure; electrode power level of 100 watt; and electrode spacing of 11 mm (430 mils). The tensile stress of the deposited silicon nitride film was measured in the as-deposited state to be about 700 MPa. The points label 0 to 6 on the x-axis each correspond to different ultraviolet treatment time of 0 minutes (as deposited), 10 minutes, 30 minutes, 45 minutes, one hour, two hours, and three hours, respectively. The as-deposited silicon nitride material of the line labeled with tetrahedrons (treatment 1) was exposed to a broadband ultraviolet radiation source, while the as-deposited silicon nitride material of the line labeled with squares (treatment 2) was exposed to a single wavelength ultraviolet source at 172 nm. It was determined that the broadband ultraviolet radiation source provided increased tensile stress in the deposited material as compared with a single wavelength ultraviolet radiation source.

Figure 21A:
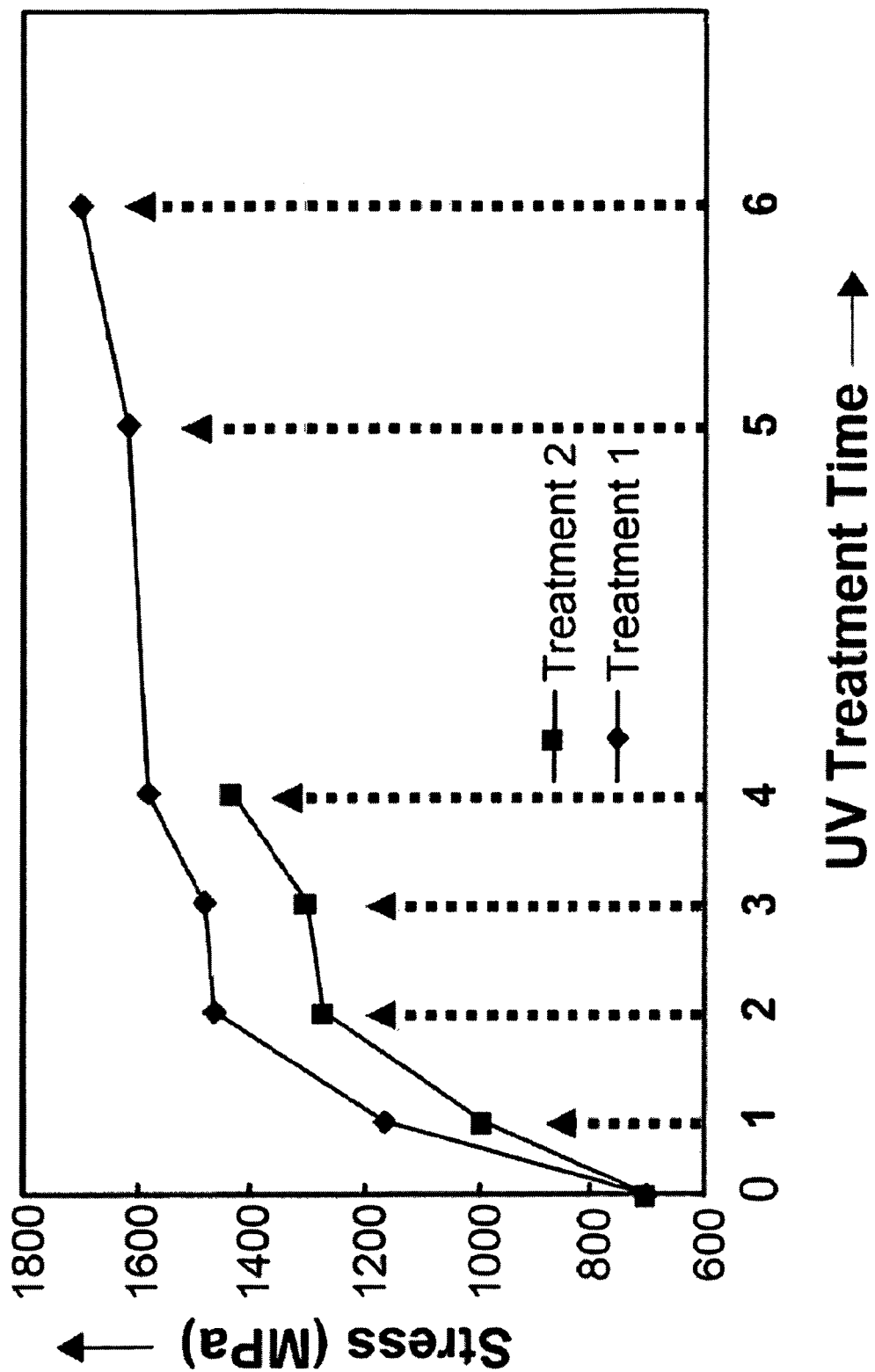
FIGS. 21A to 21E are graphs showing the increase in tensile stress of deposited silicon nitride materials with time of ultraviolet radiation exposure, and in FIG. 21A, to both single wavelength (Treatment 1) and broadband (Treatment 2) ultraviolet exposure.
Figure 21B:
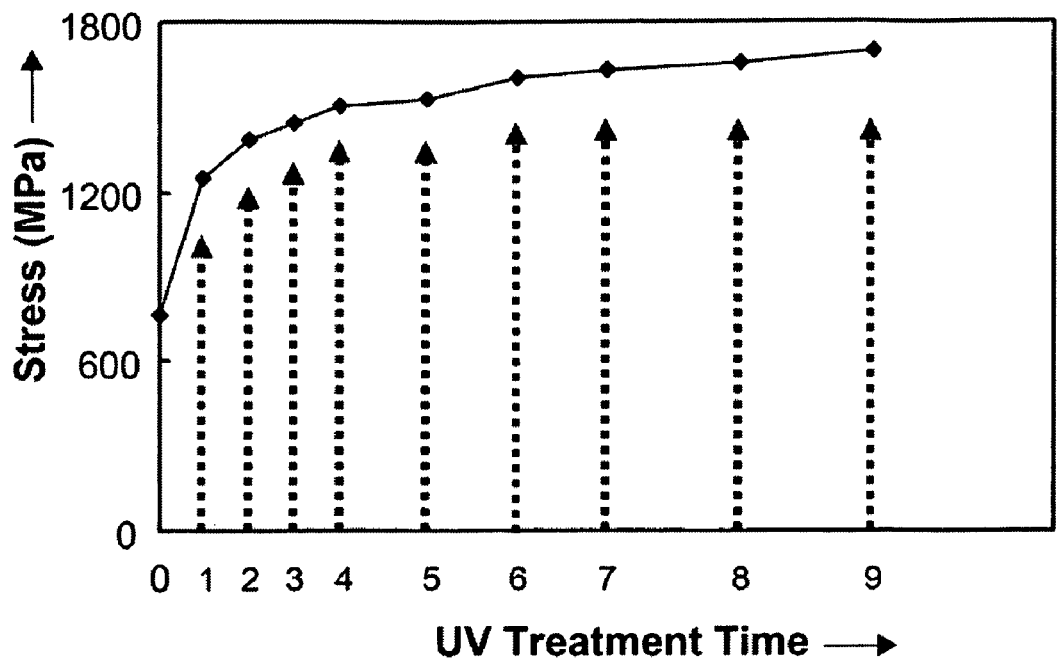
Figure 21C:
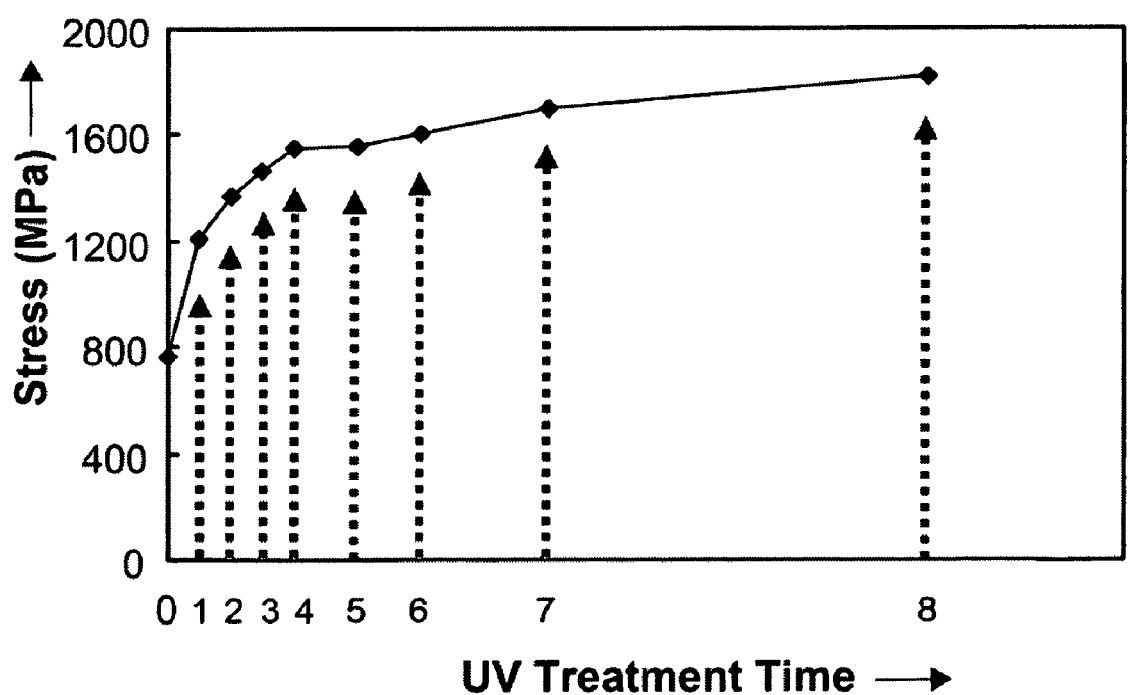

Generally, as ultraviolet treatment time increased, the tensile stress of the as-deposited film also increased from the original value of 700 MPa to values exceeding about 1.6 GPa. The silicon nitride material of FIGS. 21B and 21C were deposited under the same conditions as the sample shown in FIG. 21A, with the following exceptions—the sample of FIG. 21B was deposited using 60 sccm flow rate of silane; 600 sccm flow rate of ammonia; and electrode power level of 150 watts; and the sample of FIG. 21C was deposited using 60 sccm flow rate of silane; 300 sccm flow rate of ammonia; and an electrode power level of 150 watts. In FIGS. 21B and 21C, the as-deposited material was treated only with a broadband ultraviolet radiation, and the treatment times also varied from 0 minutes to 3 hours but at different time intervals corresponding to 8 or 9 segments, as shown. The best result obtained is shown in FIG. 21C, where the as-deposited silicon nitride material increased in tensile stress after approximately three hours of ultraviolet exposure from 800 MPa to 1.8 GPa, which was almost double the original tensile stress value.

Figure 21D:
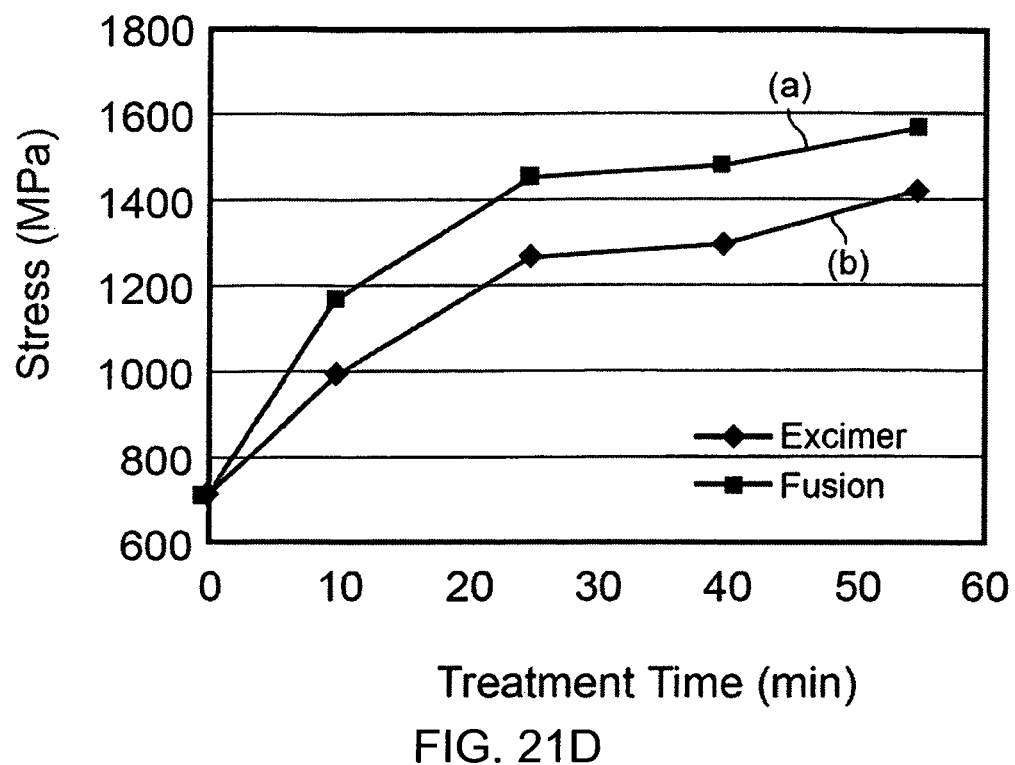
Figure 21E:
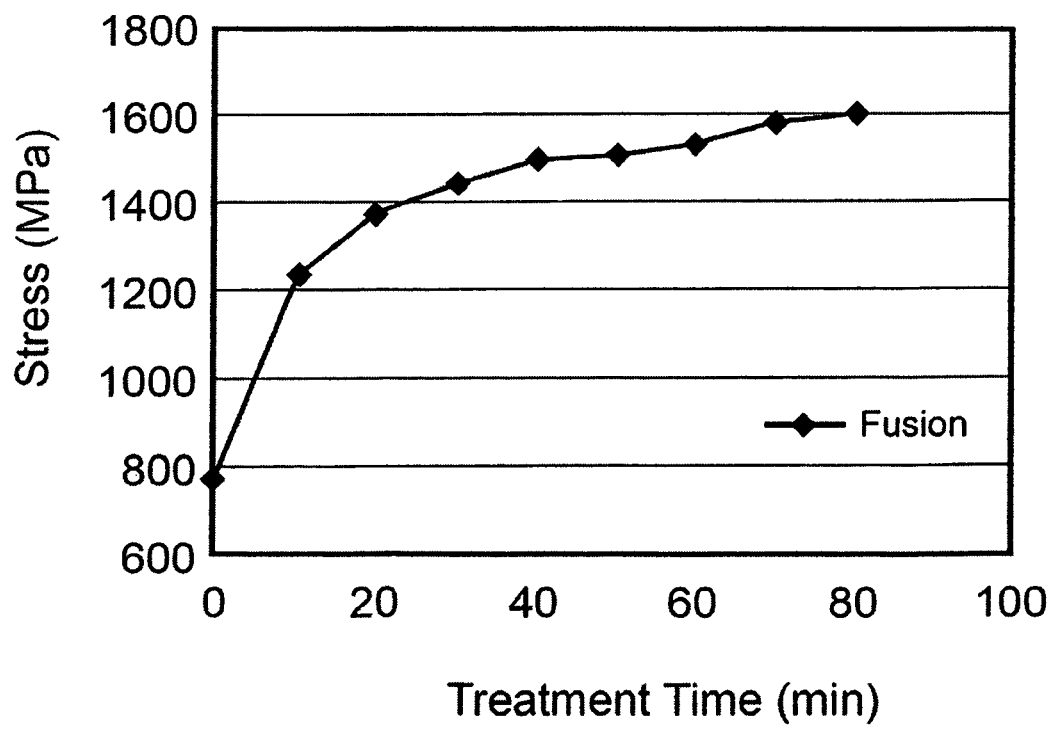

The material deposited shown in FIG. 21D was deposited using 60 sccm flow rate of silane; 900 sccm flow rate of ammonia; 10,000 sccm nitrogen; electrode power of 100 watt; pressure of 7 Torr; and 11 mm spacing. Line (a) was treated with a Fusion H UV light source which provided UV wavelengths of about 200 to 400 nm; and Line (b) was treated with an Excimer UV source which provided UV wavelengths of about 172 nm. For both treatments, tensile stresses increased from about 800 MPa (for the as-deposited silicon nitride) to 1.8 and 1.4 GPa, respectively, after about 50 minutes of ultraviolet exposure material. The cure time can be significantly reduced by further optimizing the UV lamp to increase the light intensity reaching the wafer. The sample of FIG. 21E was deposited using 60 sccm flow rate of silane; 300 sccm flow rate of ammonia; 10,000 sccm nitrogen; electrode power of 150 watt; pressure of 6 Torr; and 11 mm spacing. The deposited material was treated with a Fusion H source. As before, the as-deposited silicon nitride material increased in tensile stress after approximately 50 minutes of treatment from about 700 MPa to 1.6 GPa.

In the manner just described, tensile stress of a CVD material may be enhanced by post-deposition exposure to ultraviolet radiation. This stress enhancement may be accomplished by varying process parameters such as UV treatment time, and diluent gas content at the time of deposition.

It was also determined that the effect of ultraviolet exposure could be enhanced by optimizing the composition of the "as deposited" film. It has further been discovered that the tensile stress increases by increasing hydrogen content in the "as deposited" film and adjusting the ratio of Si—H/N—H bonds to about 1:1. The total hydrogen content in the film can be increased by decreasing the deposition temperature prior to UV exposure. Specifically, reducing the temperature at the time of deposition can enhance the tensile stress imparted to a film that is subsequently cured by exposure to UV radiation.

Table VIII lists FT-IR spectral data for two CVD silicon nitride films exposed to UV radiation post-deposition. The first CVD nitride film was deposited at 400° C., and the second nitride film was deposited at 300° C.

TABLE VIII

FT-IR SPECTRA DATA OF DEPOSITED FILM AFTER UV CURE (FT-IR data normalized to 3000 Å)

| DEPOSITION TEMPERATURE | | NH Peak Center (cm$^{-1}$) | NH Peak Area | SiH Peak Center (cm$^{-1}$) | SiH Peak Area | SiH Peak Center (cm$^{-1}$) | SiN Peak Area |
|---|---|---|---|---|---|---|---|
| 400° C. | As Dep | 3355 | 0.033 | 2159 | 0.031 | 842 | 0.491 |
| | UV Treated | 3355 | 0.022 | 2170 | 0.024 | 836 | 0.497 |
| | % Change | — | 33.8 | — | 23.5 | — | 1.1 |
| 300° C. | As Dep | 3359 | 0.042 | 2146 | 0.05 | 847 | .43 |
| | UV Treated | 3360 | 0.011 | 2171 | 0.01 | 833 | 0.5 |
| | % Change | — | 73.8 | — | 70.8 | — | 17.0 |

Table VIII indicates that post-deposition UV treatment reduces the numbers of both Si—H and N—H bonds, while increasing the network of Si—N bonds. Without being limited to a particular explanation, Table VIII likely indicates that deposition of a lower temperature allows more film restructuring during the UV cure step, leading to higher tensile stress in the resulting film.

Figure 22A:
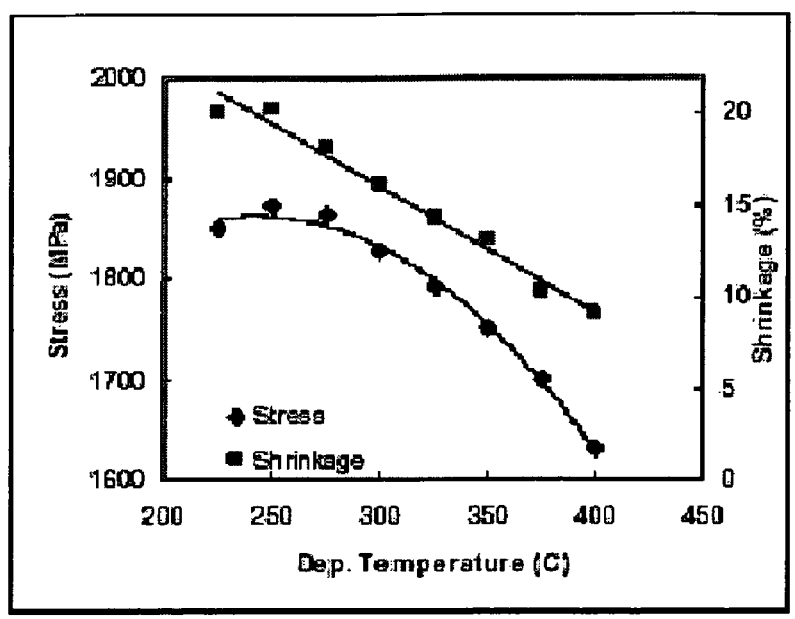
FIG. 22A plots tensile stress and shrinkage versus deposition temperature for CVD SiN films exposed to post-deposition treatment with UV radiation.

FIG. 22A plots stress and film shrinkage after UV cure, of a plurality of CVD nitride films deposited at different temperatures. FIG. 22A indicates an increase in stress with decreased deposition temperature. FIG. 22A also indicates an increase in shrinkage with decreased deposition temperature. The correlation of increased shrinkage with reduced deposition temperature of FIG. 22A confirms the greater restructuring undergone by the films initially deposited at low temperatures.

Figure 22B:
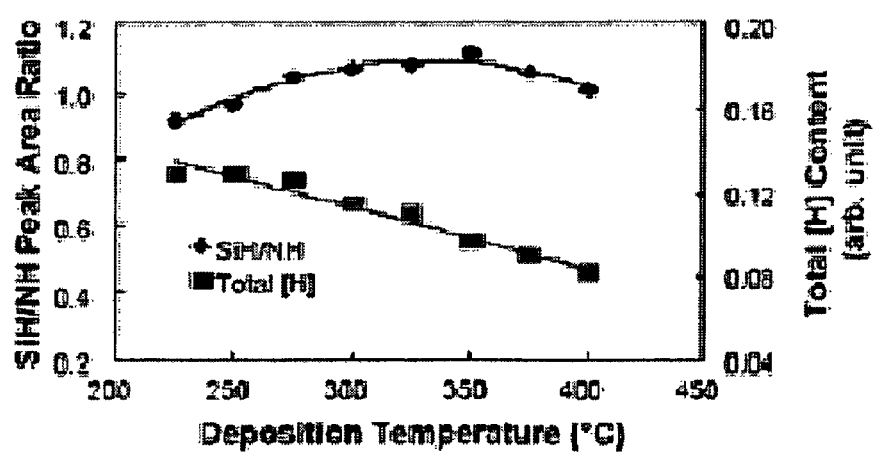
FIG. 22B plots total H content, and the ratio of FT-IR spectrum peak areas of Si—H and N—H bonds, for the CVD SiN films of FIG. 22A.

FIG. 22B plots total H content ([H]), and SiH/NH peak area ratio; of SiN films formed by CVD at different temperatures. FIG. 22B shows that tensile stress of the film increases with hydrogen content at lower deposition temperatures.

Figure 23:
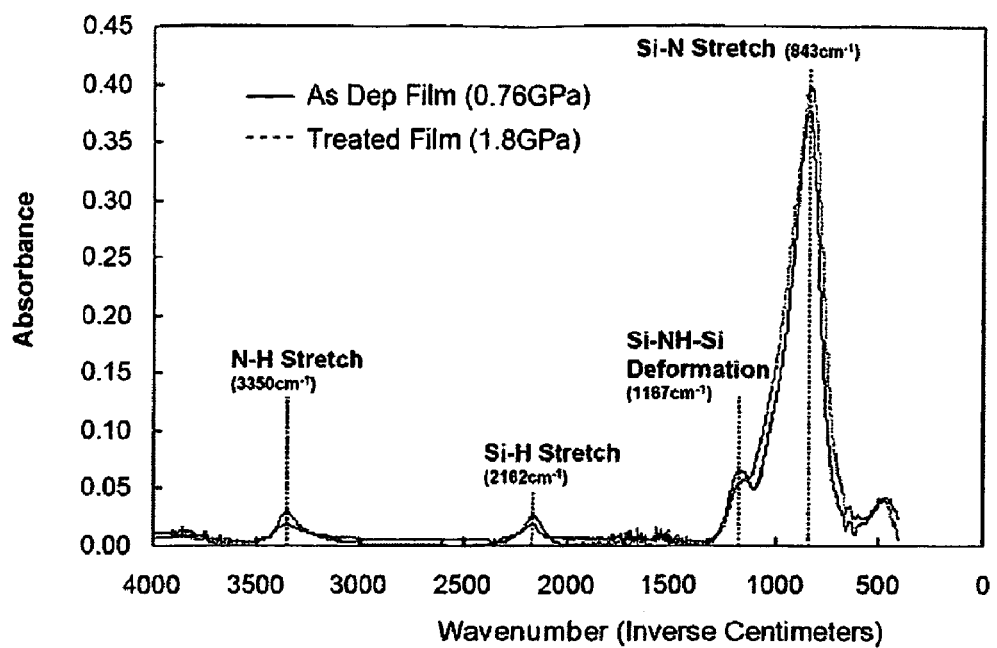
FIG. 23 shows FT-IR spectra of a CVD SiN film as-deposited, and after treatment with UV radiation.

FIG. 23 plots FT-IR spectra of a CVD nitride film exhibiting as deposited at 300° C., and then after exposure to UV radiation at 400° C. Table IX lists composition of the CVD SiN film as-deposited, and after UV curing, as determined by Rutherford Backscattering Spectrometry (RBS) and the Hydrogen-Forward Scattering (HFS) method:

TABLE IX

| RBS/HFS | H(%) | N(%) | Si(%) | Si/N |
|---|---|---|---|---|
| As Dep Film | 25 | 43 | 32 | 0.74 |
| Post UV Treat Film | 16.5 | 48.5 | 35 | 0.73 |

FIG. 23 and Table IX indicate that a lower deposition temperature results in formation of more SIN bonds after the UV cure, leading to higher stress in the cured film.

Both the $N_2$ treatment and UV treatment are based on the same principle. Specifically, Si—H and N—H bonds are broken and hydrogen is removed from the film. This hydrogen removal leaves Si and N dangling bonds in the film, allowing new Si—N bonds to be formed. Those new Si—N bonds are strained, because the Si and N atoms are locked in place by the network and can't more to relieve the strain.

However, the $N_2$ treatment technique is limited by de penetration depth of the N radicals/ions, and the energy of those N radicals/ions. Increasing the energy may be detrimental, because the N will become implanted in the film, decreasing tensile stress.

By contrast, the UV treatment technique has a bulk effect. The entire film can be treated at once and the process is more efficient and can break more bonds. Also, because a broadband UV source emitting wavelengths down to 200 nm is being used, the UV energy also favors re-bonding of the dangling bonds to form the strained Si—N bonds. Specifically, some dangling bonds remain during the formation of all films. These dangling bonds have the effect of degrading electrical properties of the film. These dangling bonds can survive subsequent treatment, especially if the distance between a Si dangling bond and a N dangling bond is too large. The UV treatment technique provides the necessary activation energy to allow the two types (Si and N) of dangling bonds to form a desired Si—N bond.

As discussed above, UV treatment is one of the techniques used to increase the tensile stress of the nitride layers. The efficiency of the UV cure is directly correlated with the optical properties of the silicon nitride layer and the substrate topography.

An increase of UV cure efficiency can improve the stress level and the manufacturability of high stress nitride film. The Fresnel principle as shown in FIG. 34A, illustrates that if the gate to gate spacing is of the same order of magnitude as the UV light wavelength, diffraction will occur leaving some areas un-treated, such as sidewall and bottom corner of the poly gate. FIG. 34B shows an illuminated region photo with dark bands against the edge followed by light and dark bands. FIG. 34B confirms the Fresnel principle by showing plenty of dark areas around the bottom and side walls.

UV cure efficiency can be improved by properly engineering the incidence of the UV light and the device sidewall profile in order to avoid the Fresnel effect and take advantage of the Brewster angle theory. According to this theory, the light absorption is optimal for a critical angle calculated from the refractive index ratio of the vacuum and nitride. For some SiNx film, this angle is calculated to be between 63 and 66 degrees. FIG. 35A illustrates this theory by defining the geometrical orientation and the p- and s-components of polarization. FIG. 35B shows the reflectance for each component as a function of the angle of incidence, indicating a minimum at Brewster's angle for the p-component. At this Brewster angle, absorption is at a maximum as there is no diffraction.

Two methods may be utilized in accordance with embodiments of the present invention in order to take advantage of the Brewster angle theory and ensure even treatment of different locations on the film by the UV light. In accordance with a first embodiment, the substrate may be moved relative to the UV light source, to ensure that light is incident over a variety of angles, including the Brewster angle. In accordance with an alternative embodiment, the raised features on the substrate may be formed having sidewalls of less than 90 degrees, thereby allowing light incident at the Brewster angle to penetrate reach the substrate surface.

As mentioned above, the maximum absorption occurs when the angle between the film normal and the direction of UV incidence is between 63 and 66 degrees. For blanket wafers or features covering large areas, the film has only one orientation relative to the wafer surface and makes a fixed angle with the incident light. Thus in accordance with one embodiment of the present invention, the direction of UV incidence can be modified by rotating the source around its axis and/or on a hemisphere above the wafer, or by rotating the substrate relative to the source. This rotation ensures that every section of the nitride film on the wafers is exposed to a UV light with a 63-66 degree angle of incidence.

In accordance with an alternative embodiment of the present invention, UV absorption by the nitride film can be enhanced where the device structure is modified to offer an angle less than 90 degrees with the wafer surface. On patterned wafers, the film follows the device contour and the angel between the UV incidence and film normal, varying from 0 to 180 degrees. Where the features form less than a 90 degree angle, the probability of satisfying the Brewster angle criterion is increased which leads to an enhancement in UV absorption and a direct increase in the tensile stress.

The UV source rotation embodiment and the device angle engineering embodiment may also be used together to enhance efficiency of UV curing. These two embodiments can also be applied for enhancing the post-UV cure properties of other films such a low-k dielectrics.

In accordance with still other embodiments of the present invention, UV cure efficiency can be enhanced by the addition of porogens. The effect of the UV cure is directly correlated to the UV lamp efficiency and the curing potential of the deposited film. The curing potential relates to the change in the film structure dining cure. The structural change involves elimination of hydrogen and reconstruction of the nitride amorphous network. These structural changes in turn lead to proportional changes in film properties, namely, film refractive index and density increase, the film shrinks, and residual stress in the film becomes more tensile. To maximize the post-cure tensile stress, the hydrogen content in the film needs to be maximized while maintaining a balance between SiH and NH content in the film. The hydrogen content in the nitride films is a strong function of the deposition temperature and is limited to about 30%.

In accordance with an embodiment of present invention, various temperature-labile molecules can be introduced to the deposition chemistry for forming a silicon nitride film, in order to enhance its curing potential. Such temperature labile molecules are usually of large size, and are incorporated into the film during deposition without breakage.

After deposition, the molecule can be removed using UV treatment or in-situ plasma treatment. During the post-deposition cure process, the space in the film previously occupied by the temperature labile molecule will close, resulting in strained Si—N bonds and increasing tensile stress in the film. The temperature-liable molecules can include but are not limited to those listed in the following TABLE X:

TABLE X

TEMPERATURE LABILE MOLECULES (POROGENS)

| Name | Chemical Formula |
|---|---|
| alpha-terpinene (ATRP) | $C_{10}H_{10}$ |
| Toluene | $C_7H_8$ |
| Limonene | $C_{10}H_{16}$ |
| Pyran | $C_6H_{10}O_2$ |
| Vinyl acetate | $C_4H_6O_2$ |
| Cyclo-pentene | $C_8H_{14}$ |
| 1 methyl cyclo-penetne | $C_6H_{10}$ |
| 5 vinyl bicyclo hept-2-ene | $C_9H_{12}$ |
| Cyclo-pentene oxide | $C_5H_8O$ |

III. Strain-inducing Spacer

Still another embodiment in accordance with the present invention offers an integration scheme useful for further enhancing performance of an NMOS device by taking advantage of the change in stress of the nitride layer induced by the spike annealing process. FIGS. 39A-M illustrate simplified cross-sectional views of the process steps for this integration.

Figure 39A:
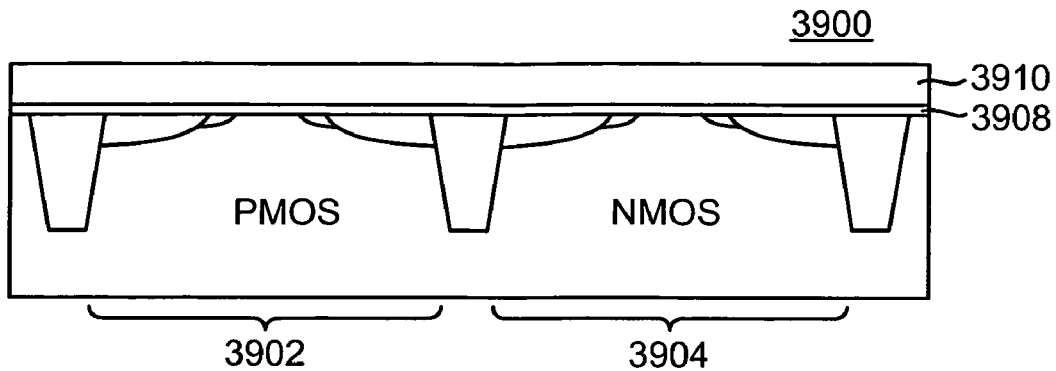
FIGS. 39A-M illustrate simplified cross-sectional views of an integration process flow employing stress from a plurality of sources to enhance device performance.

As shown in FIG. 39A, the starting point for the process integration is a precursor CMOS structure 3900 comprising PMOS region 3902 separated from adjacent NMOS region 3904 by shallow trench isolation (STI) structure 3906. Gate oxide layer 3908 and overlying gate polysilicon layer 3910 are formed in a stack over precursor CMOS structure 3900.

Figure 39B:
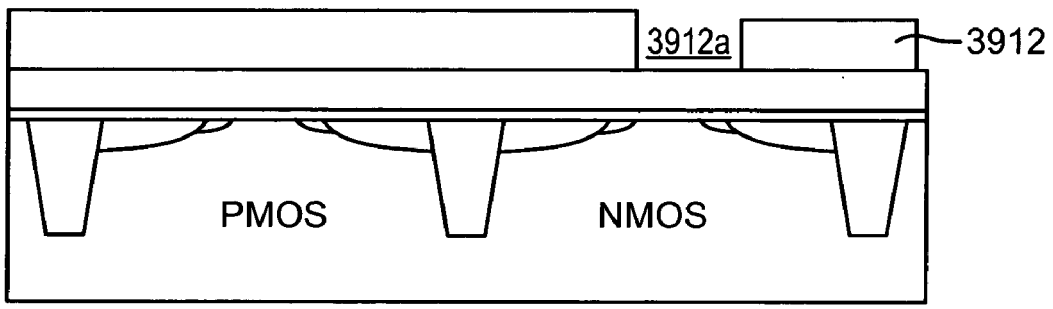
Figure 39C:
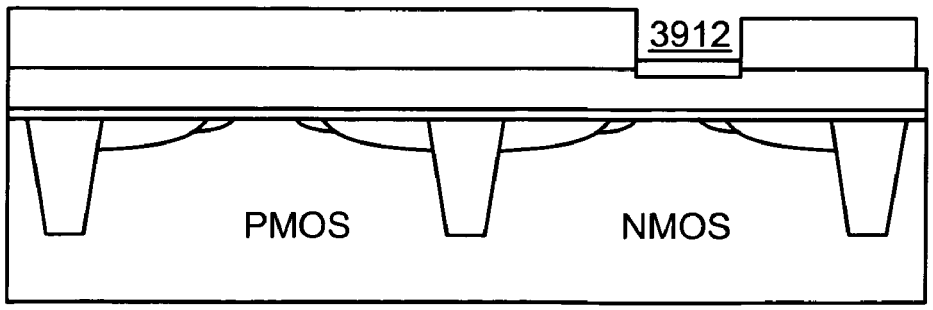

FIG. 39B shows the patterning of photoresist mask 3912 to define gap 3912a exposing the gate polysilicon/oxide stack at the location of the NMOS gate. FIG. 39C illustrates the pre-amorphization processes performed on the polysilicon in the exposed region. Two possible methods for such pre-amorphization include 1) the implantation of germanium into the NMOS poly, or 2) recessing the NMOS poly-silicon gate followed by selective SiGe deposition. With regard to the second alternative, an oxide mask may be used to ensure results.

Figure 39D:
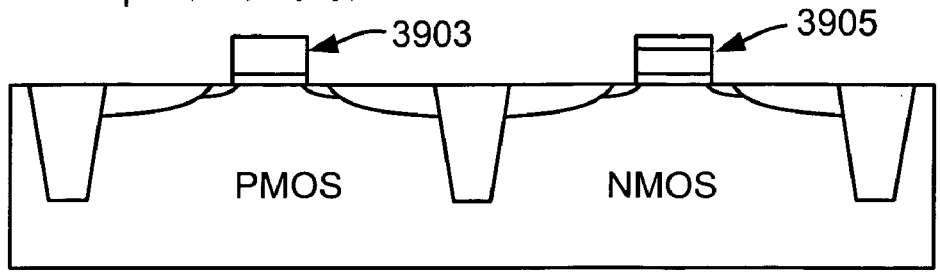

FIG. 39D shows performance of standard processing steps to form gates 3903 and 3905 of the PMOS and NMOS transistor structures, respectively. This conventional processing includes use of disposable (sacrificial) spacers for source/drain implants, followed by the Halo implants.

Figure 39E:
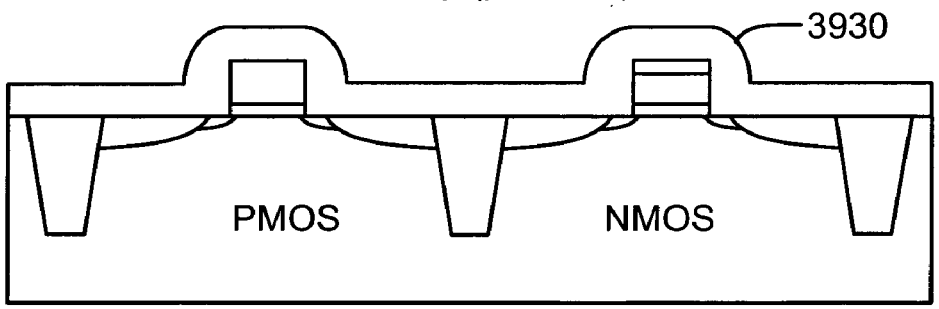

The imposition of tensile stress enhances the speed of electron flow across the NMOS channel region. Conversely, the imposition of compressive stress enhances the speed of movement of holes in the PMOS channel region. Accordingly, FIG. 39E shows the deposition of the tensile-stressed nitride film 3930 over the PMOS and NMOS gates prior to rapid thermal processing (RTP).

Figure 39F:
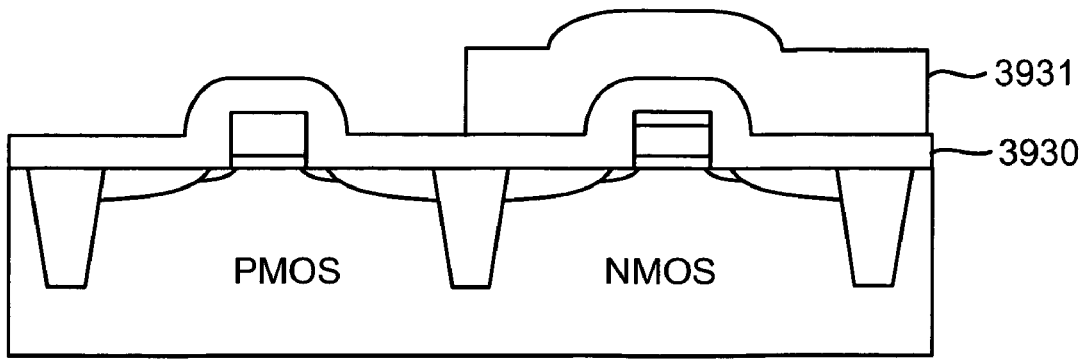
Figure 39G:
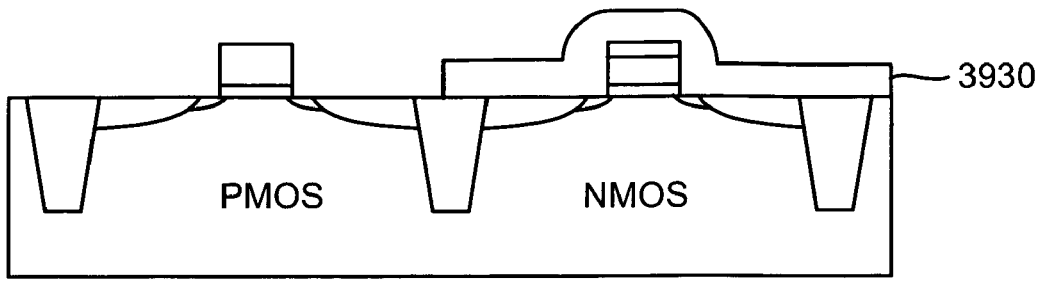

FIGS. 39F-G show removal of the tensile stressed nitride layer over PMOS regions. As shown in FIG. 39F, a mask 3931 is first patterned to expose the SiN overlying the PMOS region. In FIG. 39G, the exposed SiN is selectively etched utilizing the mask, which is then removed.

Figure 39H:
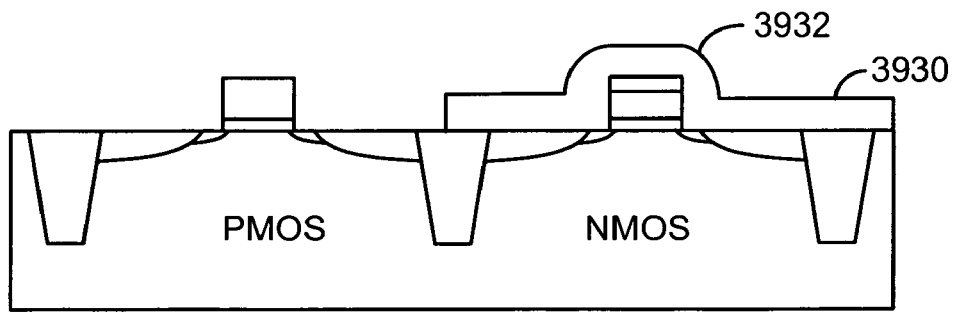
Figure 39I:
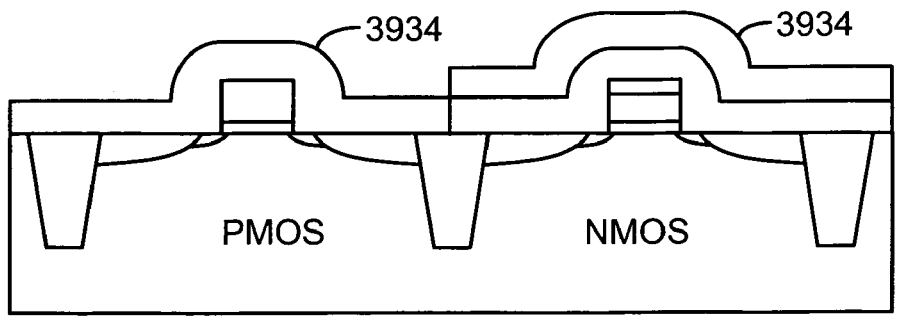

FIG. 39H show performance of a RTP spike annealing step, which elevates the stress of the conformal nitride film from <1 GPa to about 2 GPa. This RTP spike anneal creates a stress-inducing texture 3932 in the polysilicon gate. Alternatively, the annealing during this step may take the form of a dynamic surface anneal used to activate dopants. These annealing methods or any other annealing methods may be used to recrystallize the polysilicon of the NMOS gate, thereby increasing nitride stress to 2.0 GPa. The tensile stress imposed by this film serves to enhance the performance of the NMOS device.

Figure 40:
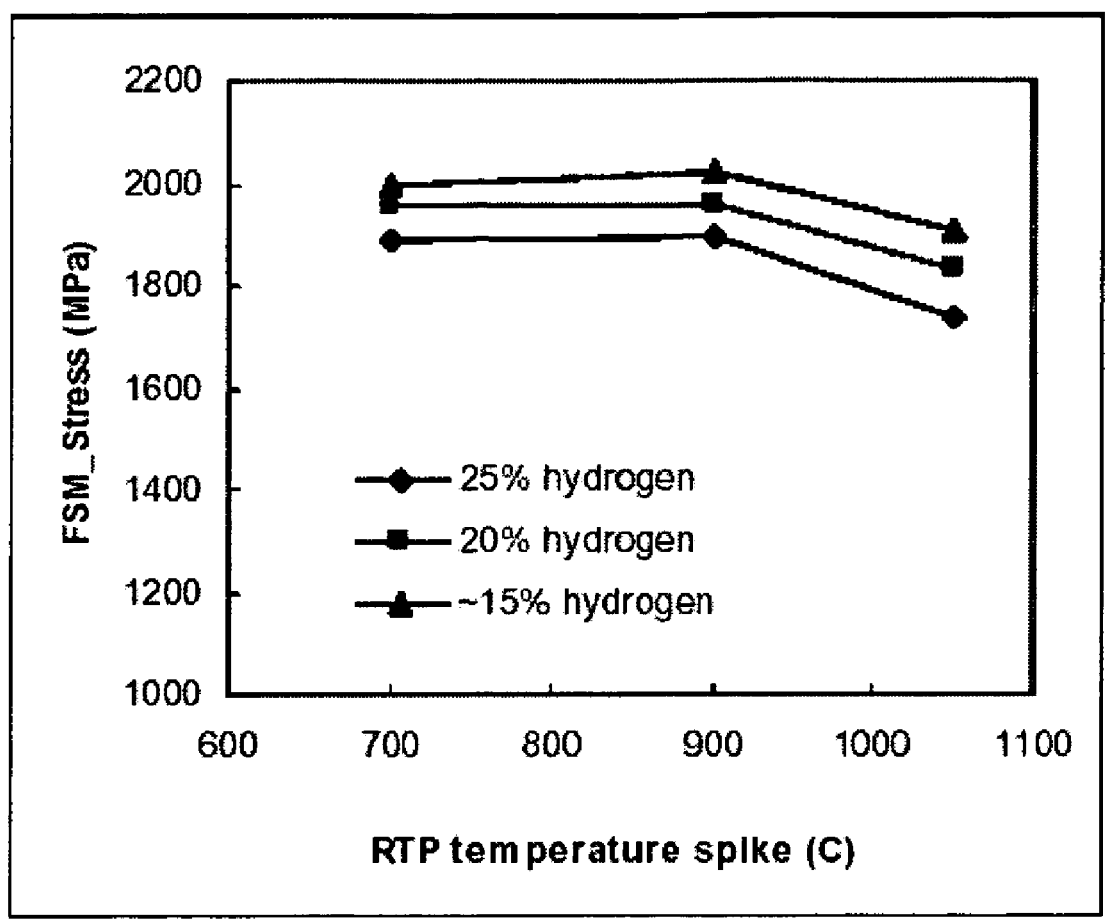
FIG. 40 is graph showing the response of stressed nitride films when used with Rapid Thermal Processing versus the composition (Si—H/N—H) and total hydrogen content of the film.

The composition of the silicon nitride layer can be optimized to result in highest tensile stress of the SiN film after RTP. FIG. 40 plots film stress versus the RTP temperature spike, for deposited SiN films of different compositions. FIG. 40 shows the response of PECVD nitride films to RTP, vs. the composition (Si—H/N—H) and total hydrogen content of the film. The stress in the SiN film post RTP is 2 GPa (tensile), and this stress value can potentially be increased by further optimizing the deposition chemistry.

Figure 39J:
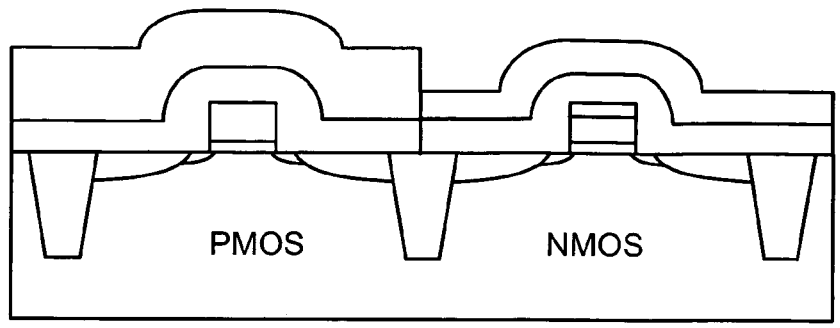
Figure 39K:
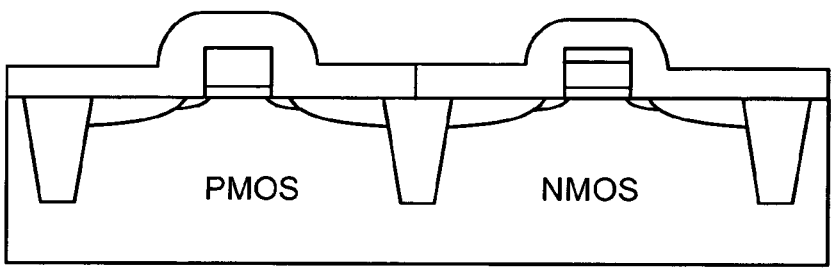

FIGS. 39I-L shows the next series of steps in the integration process flow, wherein nitride spacers are formed adjacent to gate oxide/polysilicon stack, to complete formation of the gate structures. Specifically, in FIG. 39I, nitride layer 3934 of neutral or compressive stress is formed over the entire structure. As shown in FIGS. 39J-K, lithography and etching are employed to remove nitride layer 3934 from the NMOS region.

Figure 39L:
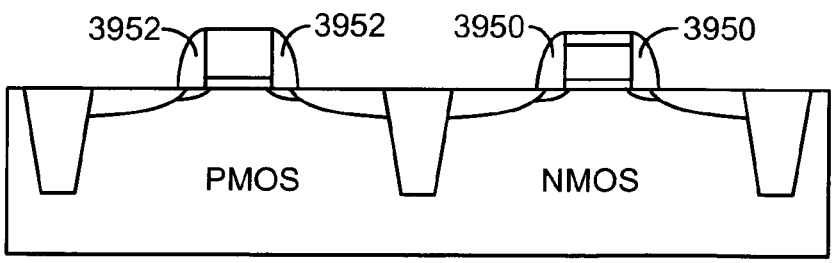

FIGS. 39L illustrates formation of the spacer structures 3950 and 3952 for the NMOS and PMOS devices, through etching of the tensile stress SiN layer 3930 and the neutrau-compressive SiN layer 3934, respectively.

Figure 39M:
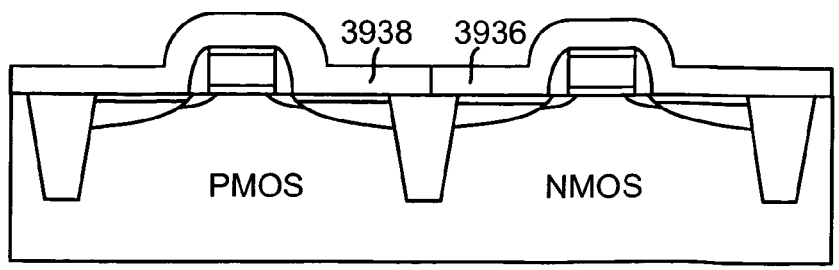

Finally, FIG. 39M shows the dual stress layer integration. Halo implants are performed, and conducting contacts such as NiSix are formed, followed by formation of the nitride etch stop layer (ESL). Over the NMOS device, a SiN ESL 3936 exhibiting tensile stress is created. Over the PMOS device, a SiN ESL 3938 exhibiting compressive stress is created.

Once deposited, the silicon nitride etch stop layer may be treated to enhance its tensile stress. For example the deposited etch stop layer may be subjected to in-situ plasma treatment. Alternatively or in conjunction with plasma treatment, the deposited etch stop layer may be subjected to a UV cure with, or without a capping layer to modulate the radiation experienced by the film. Examples of such capping layers include but are not limited to amorphous carbon, oxynitride, or other materials having extinction coefficients different from the high stress nitride layer.

The integration scheme shown FIGS. 40A-L take advantage of several different sources of tensile stress in order to improve device performance. First, the tensile stress of the nitride spacer layer is utilized. A second source of stress is that induced in the polysilicon gate by the RTP step. A third source of stress is from the nitride etch stop layer formed over the gate.

IV. Enhanced Film Conformality

The above description has focused upon the enhancement of film stress. However, as shown and described above in connection with FIG. 1, another important property of a film intended to impose strain on a silicon lattice is conformality. Embodiments in accordance with the present invention allow the enhancement of conformality of a CVD film, by permitting deposition and treatment to be performed at low pressures, thereby obviating the need for separate, time-consuming purge steps between film deposition and treatment.

The substrate processing techniques described so far have been performed at pressures of about 1 Torr or greater. As shown and described above, however, a cycle in a process for CVD of a film exhibiting controlled properties, may involve successive deposition and treatment under different conditions.

Where the processing chamber is operating at pressures of about 1 Torr and above, such changed conditions may generally necessitate pumping or purging steps in order to achieve optimum results. However, as shown and illustrated above in connection with Table IV and FIG. 10, such an intervening pumping/purging steps can consume significant amounts of processing time, substantially reducing throughput.

Accordingly, embodiments of the present invention also relate to methods and apparatuses for depositing films by chemical vapor deposition at relatively low pressures (i.e. between about 20-150 mTorr). The pumping required to maintain the chamber in this low pressure range ensures a short residence time for gases employed for deposition and treatment, thereby obviating the need for a separate pumping or purging steps.

It has further been discovered that CVD processing at low pressures, and the concurrent elimination of separate intervening gas pumping/purging steps, sufficiently reduces processing time and elevates throughput enough to render commercially practicable the formation of highly conformal SiN films. In particular, the highly conformal CVD SiN films are formed by repeated cycles in which an initial step involving a silicon precursor in the absence of a plasma, results in deposition of a highly conformal layer of amorphous silicon (a-Si). This deposition step is followed by a treatment step in which the conformal a-Si film is exposed to a nitrogen-containing plasma. This cyclic processing regime is rendered commercially practicable by eliminating the need for separate gas pumping and purging steps intervening between the successive deposition and treatment steps of the cycle.

In accordance with one embodiment of the present invention, a conformal SiN layer may be formed by employing a cyclic deposition process at low pressure wherein a silane soak deposition step in the absence of plasma is followed by treatment with a plasma formed from $N_2$ as the nitrogen-containing species. In certain embodiments, the plasma may also include argon, which may bombard the deposited film and/or assist in the dissociation of $N_2$, thereby decreasing N—H content in the deposited film and forming dense N—H bonds.

In accordance with an alternative embodiment of the present invention, a conformal SiN layer may be formed by employing a cyclic deposition process at low pressure, wherein a silane soak deposition step in the absence of plasma is followed by treatment with a plasma formed from $N_2$ and $NH_3$ as the nitrogen-containing species.

Figure 24:
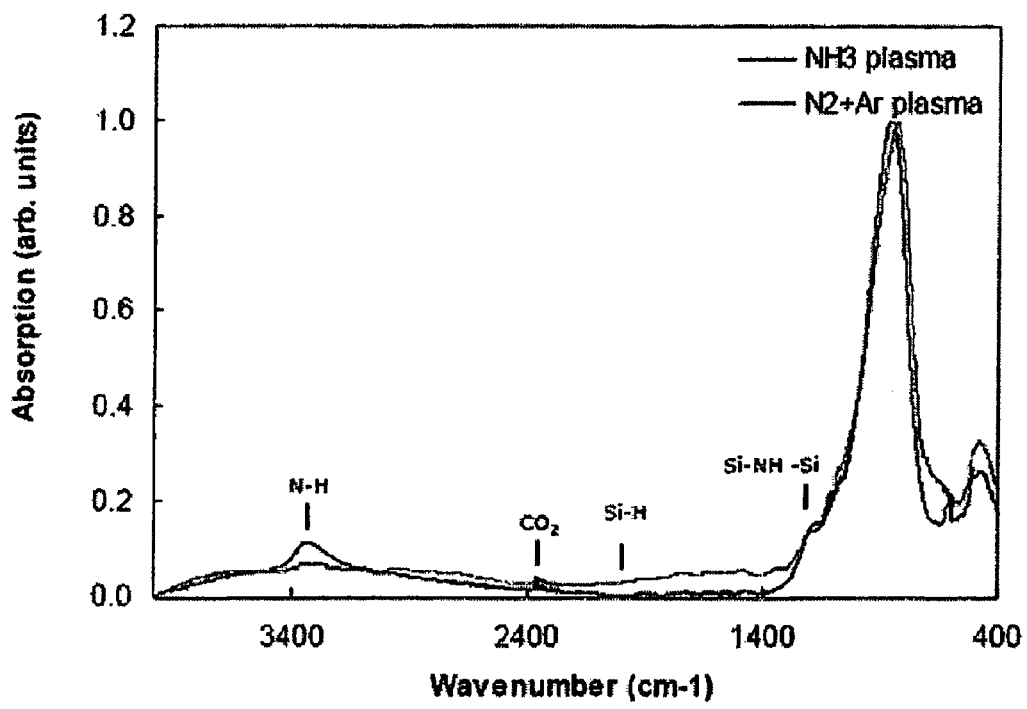
FIG. 24 shows FT-IR spectra of CVD SiN films exposed to post-deposition treatment plasma as generated from different gas mixtures.

FIG. 24 shows an FT-IR spectra of CVD SiN films formed by a 20 sec silane soak followed by treatment by a 10 sec exposure to a plasma formed from $N_2$+Ar, or from $N_2$+$NH_3$. FIG. 24 shows that the presence of argon during treatment may have resulted in a decrease in N—H content, and the formation of dense SiN bonds.

In another experiment, this SiN process regime was performed with, and without, a post $SiH_4$ soak purging step. It was discovered that removal of the post-$SiH_4$ soak purging step processing at low pressures, did not impact the thickness of the SiN layer formed per cycle. Specifically, the low pressure and efficient pumping effectively interrupted the $SiH_4$ soaking step.

It was also discovered that the thickness of the SiN material deposited per cycle was improved with treatment by the $N_2$/Hr plasma relative to the $NH_3$/$N_2$ plasma. Specifically, treatment with the $N_2$/Ar plasma resulted in a thickness of material deposited per cycle of about 3-5 Å, whereas treatment with the $N_2$/$NH_3$ plasma resulted in a thickness of material deposited per cycle of about 2-5 Å.

Figure 25A:
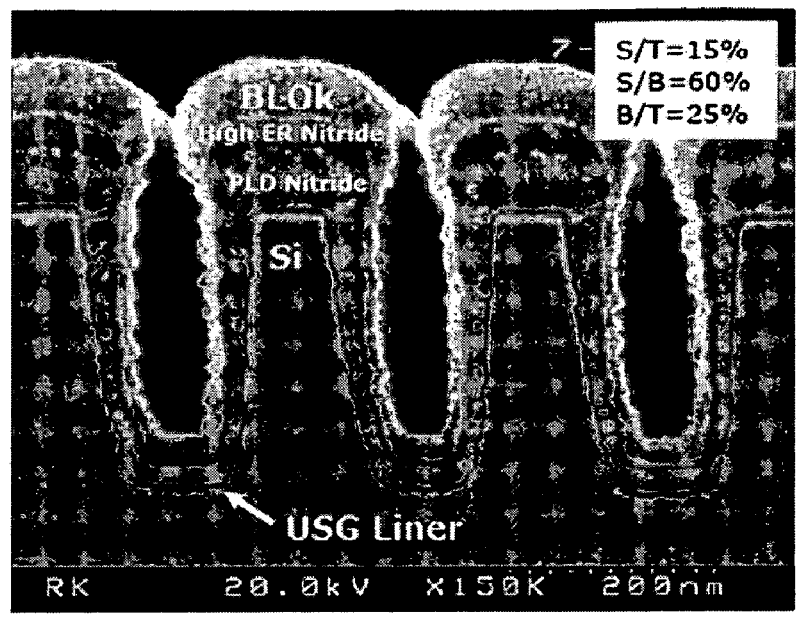
FIGS. 25A-D are cross-sectional electron micrographs showing conformality of CVD SiN films formed under different processing conditions.
Figure 25B:
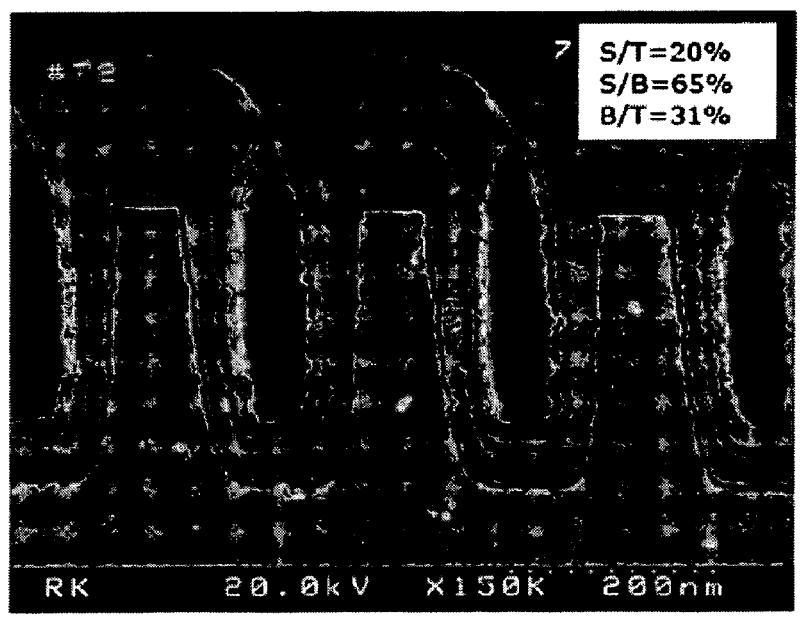

FIGS. 25A and 25B show electron micrographs of densely-packed topographic features bearing SiN CVD films formed at wafer temperatures of 350° C., utilizing $N_2$+$NH_3$ and $N_2$+Ar plasma treatment, respectively. Comparison of FIG. 25A with FIG. 25B reveals the presence of Ar in the treatment step to have increased $N_2$ dissociation, and improved film morphology and step coverage.

Figure 25C:
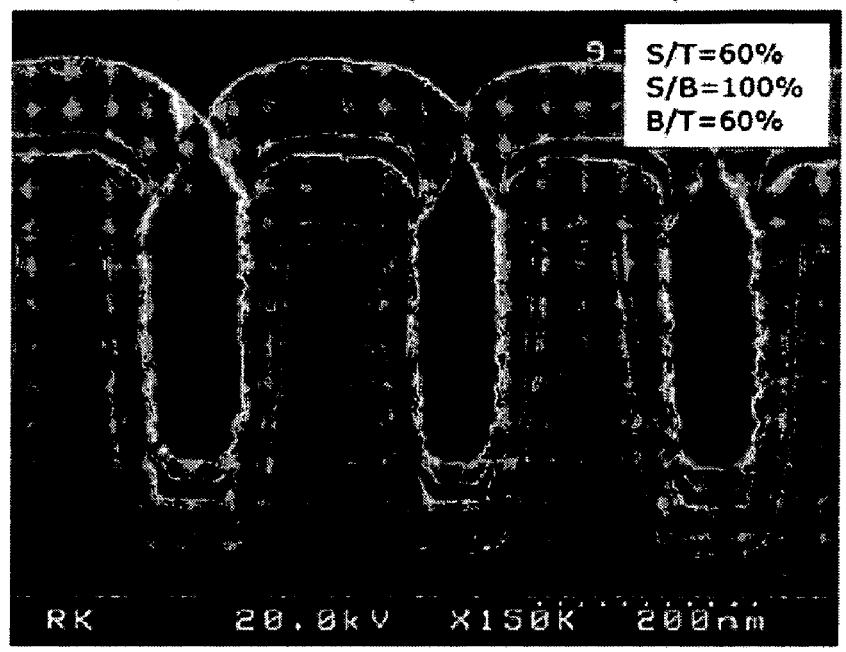

FIG. 25C shows an electron micrograph of densely-packed topographic features bearing a SiN CVD film formed from $N_2+Ar$ plasma at a higher wafer temperature of 430° C. Comparison of FIG. 25C with FIG. 25B reveals the increased temperature to have improved step coverage of the resulting film.

Figure 25D:
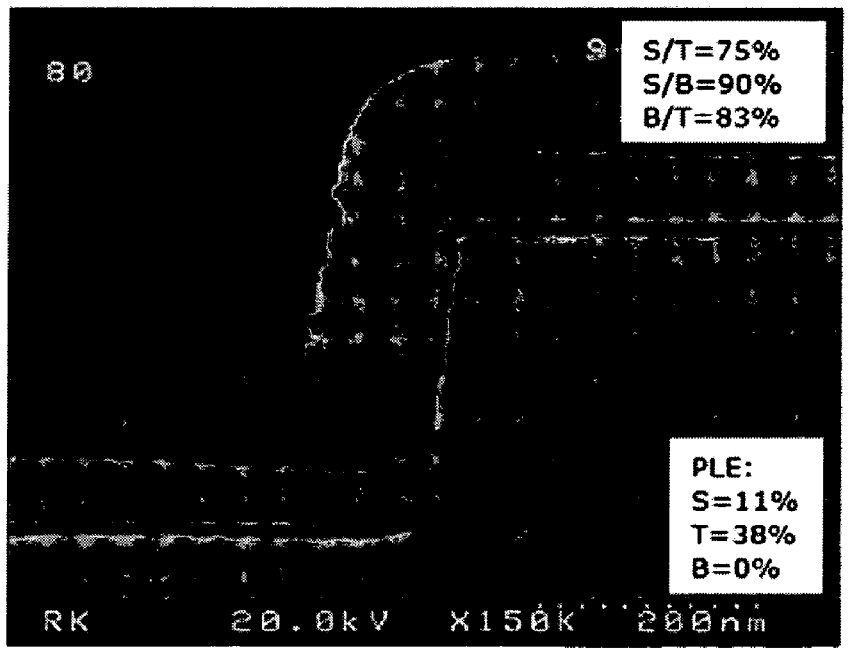

FIG. 25D shows an electron micrograph of less dense topography bearing a CVD SiN film formed from $N_2+Ar$ plasma at the 430° C. wafer temperature. Comparison of FIG. 25D with FIG. 25C reveals that the Pattern Loading Effect (PLE) is also improved by this deposition regime.

Without being bound by any particular theory, the $N_2$ treatment reduces the hydrogen content in the film leading to the formation of strained Si—N bonds. By introducing additional steps (such as purge and/or pump) after deposition, the effect of the $N_2$ treatment is enhanced because there are no more deposition gases in the chamber. When residual $SiH_4$ and $NH_3$ are still in the chamber, the deposition continues during the treatment as well, and the treatment is able to penetrate through the material already deposited during the intentional deposition step.

Figure 26A:
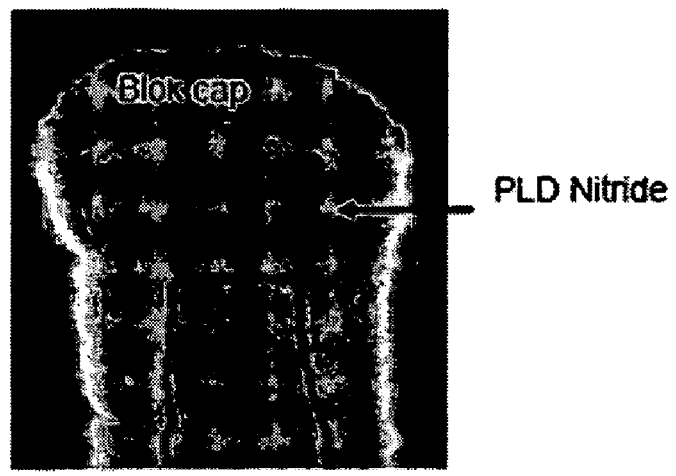
FIGS. 26A-B are enlarged cross-sectional electron micrographs showing morphology of CVD SiN films formed under different processing conditions.
Figure 26B:
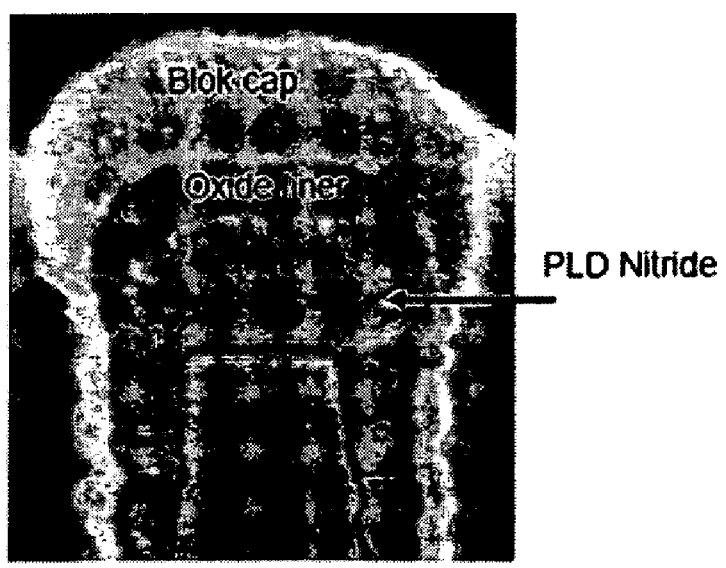

FIGS. 26A-B are enlarged cross-sectional micrographs showing the upper portion of a raised feature bearing a SiN layer formed by a $SiH_4$ soaking, followed by treatment with $N_2/Ar$ and $N_2/NH_3$ plasmas, respectively. Comparison of FIGS. 26A-B shows that the nitride layer treated with the $N_2/NH_3$ plasma exhibits a columnar, grainy film morphology as compared with the film exposed to the $Ar/N_2$ plasma.

The character of the resulting film may depend upon the $SiH_4$ soak deposition step, as well as upon the subsequent treatment with a nitrogen-containing plasma. For example, the quality of morphology of the resulting deposited film may be influenced by the exposure dose during the $SiH_4$ soak step. For purposes of the following discussion, the exposure dose is defined by Equation (I) below:

$D=T\times PP$; where $D$=exposure dose;

$T$=time of exposure; and $PP$=partial pressure of $SiH_4$. (I)

Figure 27:
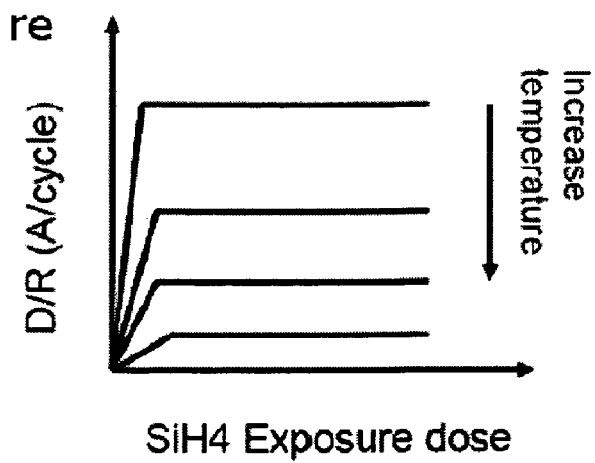
FIG. 27 plots the rate of deposition of material versus exposure dose.

The thickness of the saturated film per dep/treat cycle is dependent upon the incoming flux of $SiH_4$ reaching the surface, and the rate of desorption of $SiH_4$ from that surface. The incoming $SiH_4$ flux is dependent upon the exposure dose, and the rate of $SiH_4$ desorption is dependent upon the temperature. Accordingly, FIG. 27 plots the rate of deposition of material versus exposure dose. FIG. 27 shows that this rate of deposition will decline with increasing temperature.

Figure 28A:
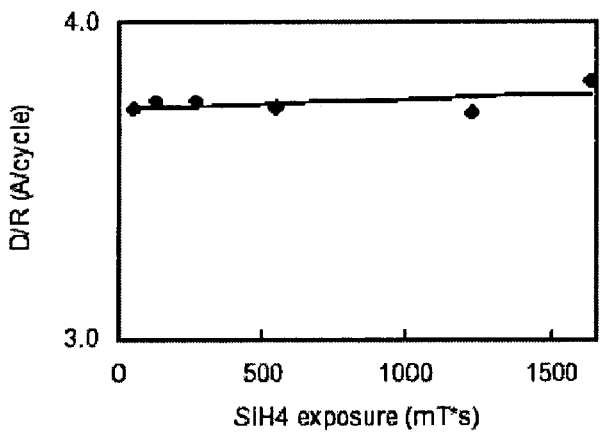
FIG. 28A plots deposition rate versus exposure dose.
Figure 28B:
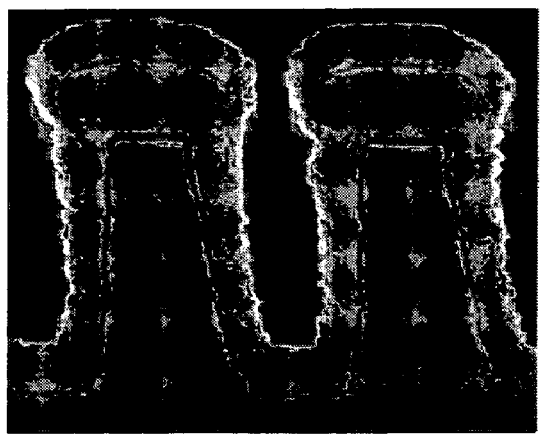
FIG. 28B shows a cross-sectional micrograph showing a feature bearing a layer deposited after a $SiH_4$ exposure dose of 500 mT*s.
Figure 29A:
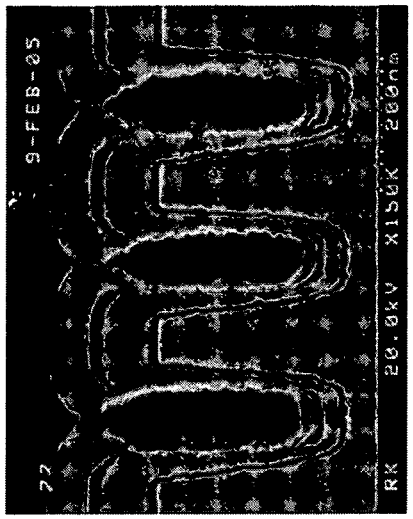
FIGS. 29A-H are cross-sectional electron micrographs showing morphology of CVD SiN films formed under different processing conditions.
Figure 29B:
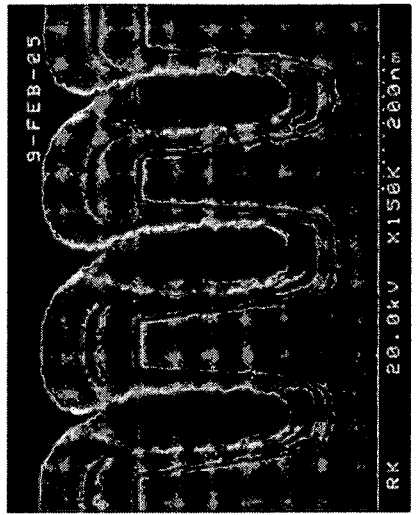
Figure 29C:
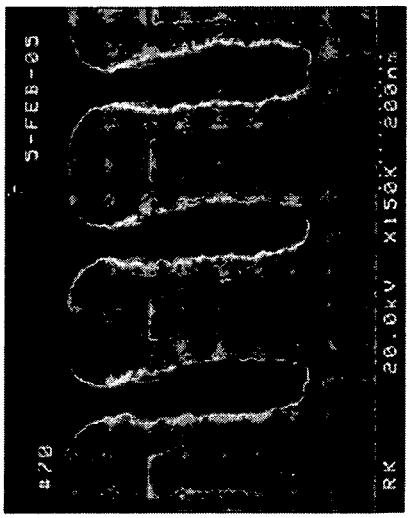
Figure 29D:
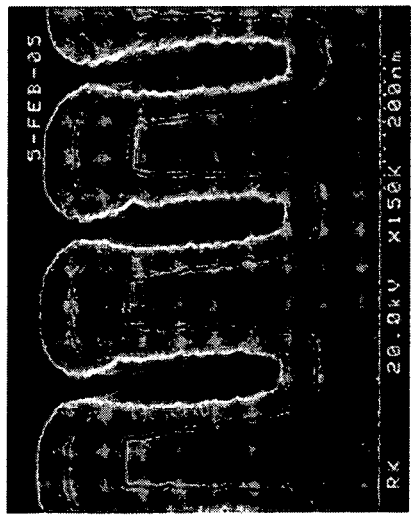
Figure 29E:
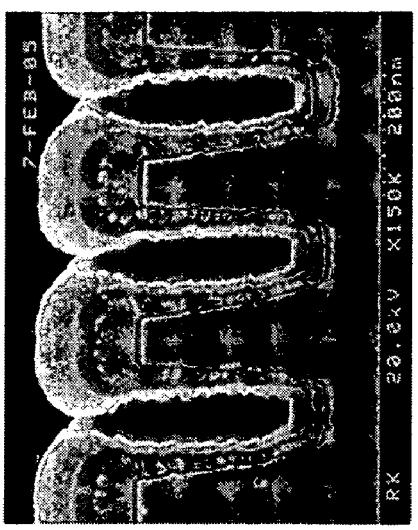
Figure 29F:
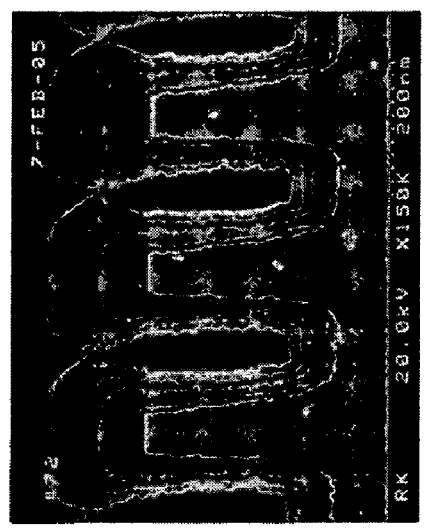
Figure 29G:
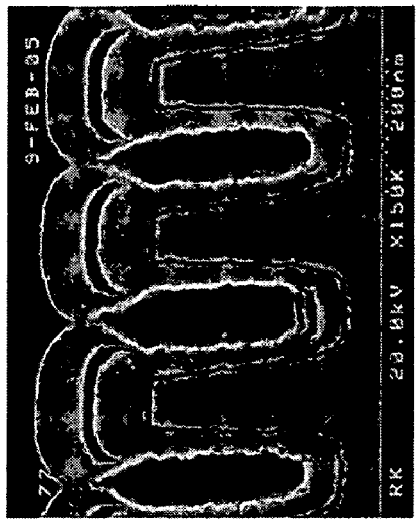
Figure 29H:
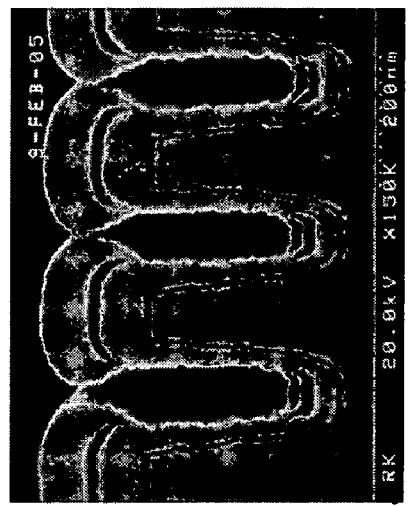

FIG. 28A plots deposition rate versus exposure dose. FIG. 28B shows a cross-sectional micrograph showing a feature bearing a layer deposited after a $SiH_4$ exposure dose of 500 mT*s. FIG. 28B shows the step coverage performance of the silicon nitride film deposited with the process conditions corresponding to the fourth data point of FIG. 28A.

FIGS. 29A-H are cross-sectional electron micrographs showing the morphology of films deposited utilizing a $SiH_4$ soak deposition step followed by treatment by exposure to a nitrogen-containing plasma under the plurality of different conditions shown below in Table XI.

TABLE XI

| FIG. # | Purge? | Temp (° C.) | Treat Plasma | Relative Film Morphology |
|---|---|---|---|---|
| 29A | No | 400 | $NH_3$ | Columnar |
| 29B | | | $N_2 + Ar$ | Homogenous |
| 29C | | 500 | $NH_3$ | Columnar |
| 29D | | | $N_2 + Ar$ | Homogenous |
| 29E | Yes | 400 | $NH_3$ | Columnar |
| 29F | | | $N_2 + Ar$ | Homogenous |
| 29G | | 500 | $NH_3$ | Columnar |
| 29H | | | $N_2 + Ar$ | Homogenous |

FIGS. 29A-H emphasize the effect of temperature and addition of Ar during treatment, upon step coverage and morphology of the resulting deposited film. These figures indicate that higher temperature improves both step coverage and film morphology. In particular, step coverage from feature side wall-to-top (S/T), is improved from 30% at 400° C., to 60% at 500° C. Film morphology is improved from columnar/grainy, to dense and homogeneous films.

Without being bound by any theory, in comparing treatment by $NH_3$ (typically diluted w/$N_2$) with treatment by $N_2+Ar$, the latter is more beneficial because the addition of Ar increases plasma density by improving the $N_2$ dissociation. This provides more N-radicals and ions to react with the $SiH_4$ already present on the surface from the previous $SiH_4$ soak.

It has further been discovered that exposure to a plasma including Argon gas can substantially enhance the rate of deposition of a film formed in accordance with embodiments of the present invention.

For example, while the discussion so far has focused upon a processing regime wherein SiN is deposited from a plasma including both $SiH_4$ and $NH_3$, this is not required by the present invention. In accordance with alternative embodiments of the present invention, a ratio of $NH_3$:$SiH_4$ can be zero (0) with material deposited in the absence of a plasma. In such an embodiment, an amorphous silicon layer (a-Si) is initially deposited from $SiH_4$ at low pressures. This amorphous silicon layer is then subsequently treated with a plasma containing nitrogen, and also potentially Argon and Helium, in order to result in formation of the SiN.

The efficiency of the deposition process is in part limited by the surface coverage of the first precursor. The silicon-source precursor has to be chemisorbed on both the initial as well as the newly formed surfaces with a 100% surface coverage. However, it is known that nitrogen-containing precursors inhibit the adsorption of the silane ($SiH_4$) on the surface, which may lead to a decrease in the deposition rate with the number of cycles.

Maintaining a constant deposition rate throughout the deposition process is important to control film thickness. A substantially constant deposition rate can be achieved using a surface activation process which removes the un-reacted precursors and enhances the chemisorption of $SiH_4$ on the SiNx surface. The surface activation process may be realized by employing an argon (Ar) cleaning step. The role of the Ar radicals is to sputter off the excess precursor adsorbed on the surface.

In accordance with embodiments of the present invention, Ar is either introduced into the chamber for stabilization or after being stabilized through the divert line. The Ar is radicalized using either a capacitive plasma discharge inside the chamber, or using a Remote Plasma Unit (RPS). The plasma power, gas flow and cleaning time are parameters influencing the surface recovery.

Figure 14:
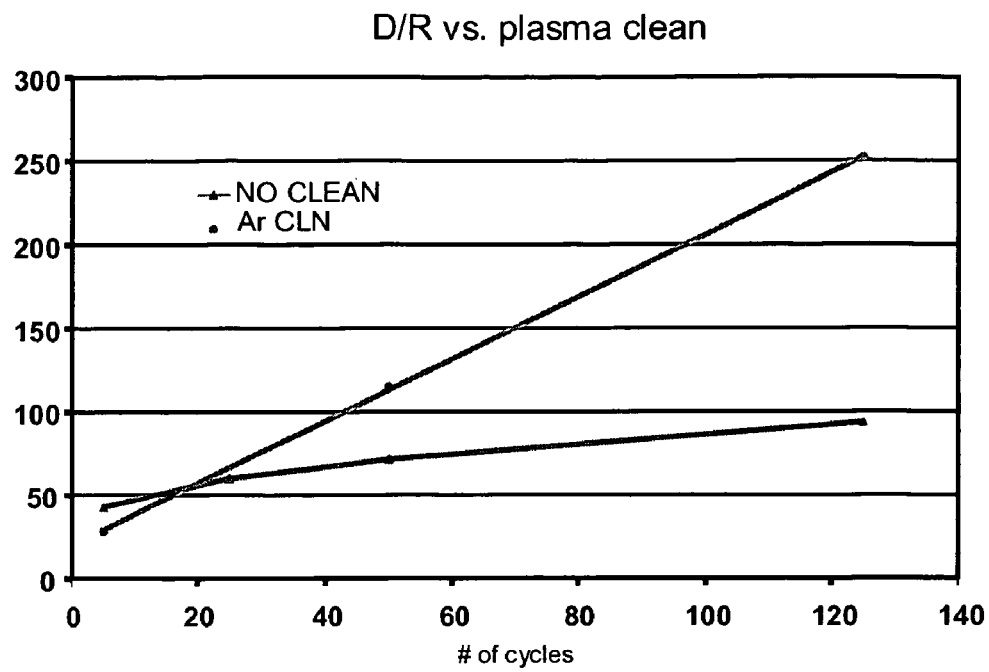
FIG. 14 plots film thickness versus number of dep/treatment cycles, for CVD SiN films deposited with and without Ar plasma cleaning between each cycle.

FIG. 14 shows the difference in the plots film thickness versus number of cycles for regimes including and not including a post-treatment Ar plasma cleaning step. Without the Ar clean, the deposition rate decreases 10 times over 120 cycles. When using the Ar clean, a constant deposition rate of about 0.5 ML/cycle is achieved. A similar post-treatment cleaning concept can also be used to form other types of films, for example other barrier dielectric films.

Figure 15:
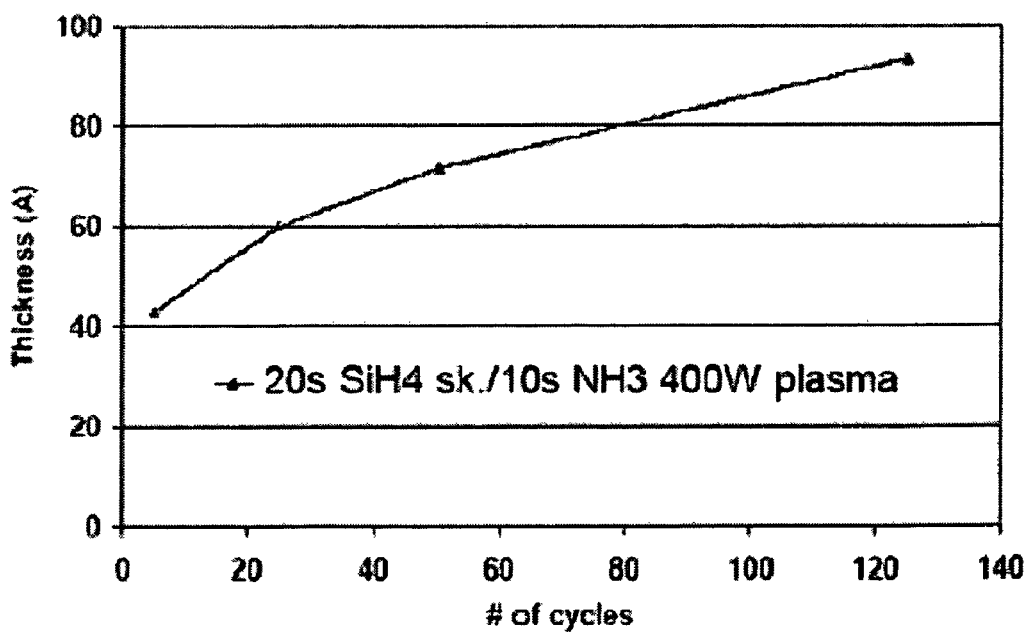
FIG. 15 plots film thickness versus number of dep/treatment cycles for, CVD SiN films deposited without Ar plasma cleaning between each cycle.

FIG. 15 plots SiN film thickness versus a number of depsoak ($SiH_4$)/treat ($NH_3$) cycles under the specific conditions listed below in Table VII:

TABLE VII

| Process Parameter | Cycle Step Step | | | | |
|---|---|---|---|---|---|
| | $SiH_4$ soak | Purge | $NH_3$ stab | $NH_3$ plasma | Purge |
| Step time (sec) | 20 | 10 | 10 | 10 | 10 |
| Pressure (Torr) | 4.8 | 4.8 | 4.8 | 4.8 | 4.8 |
| HF RF Power (W) | 0 | 0 | 0 | 400 | 0 |
| Heater temperature (C.) | 400 | 400 | 400 | 400 | 400 |
| Lift Pos (steps) | 450 | 450 | 450 | 450 | 450 |
| $SiH_4$ Flow (sccm) | 230 | 0 | 0 | 0 | 0 |
| $NH_3$ Flow (sccm) | 0 | 0 | 100 | 100 | 0 |
| $N_2$ Flow (sccm) | 2000 | 2000 | 2000 | 2000 | 2000 |

FIG. 15 indicates that the deposition rate decreases over time from 8 Å/cycle to less than 1 Å/cycle. This decrease in deposition rate may be due to the accumulation of $NH_3$ and $NH_3$-derived species on the surface of the film after each dep/treat cycle. Accordingly, a cleaning step may be employed at the end of each cycle to regenerate and prepare the surface to adsorb $SiH_4$ in the deposition stage of the next cycle.

Figure 16:
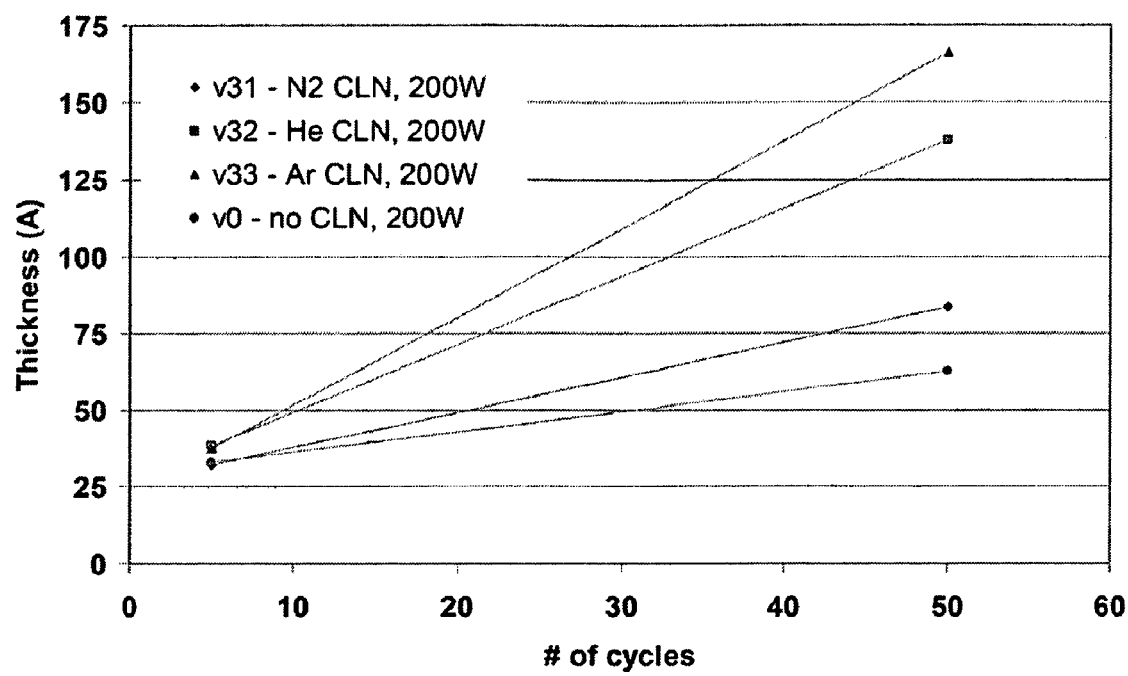
FIG. 16 plots film thickness versus number of dep/treatment cycles, for CVD SiN films formed under a number of conditions between successive cycles.

FIG. 16 plots thickness of SiN films deposited utilizing the cyclic dep process regime described in Table VII, where the surface is exposed to different conditions between successive dep/treat cycles. FIG. 16 shows exposure to an Argon plasma to be the most effective inter-cycle cleaning approach.

Figure 17:
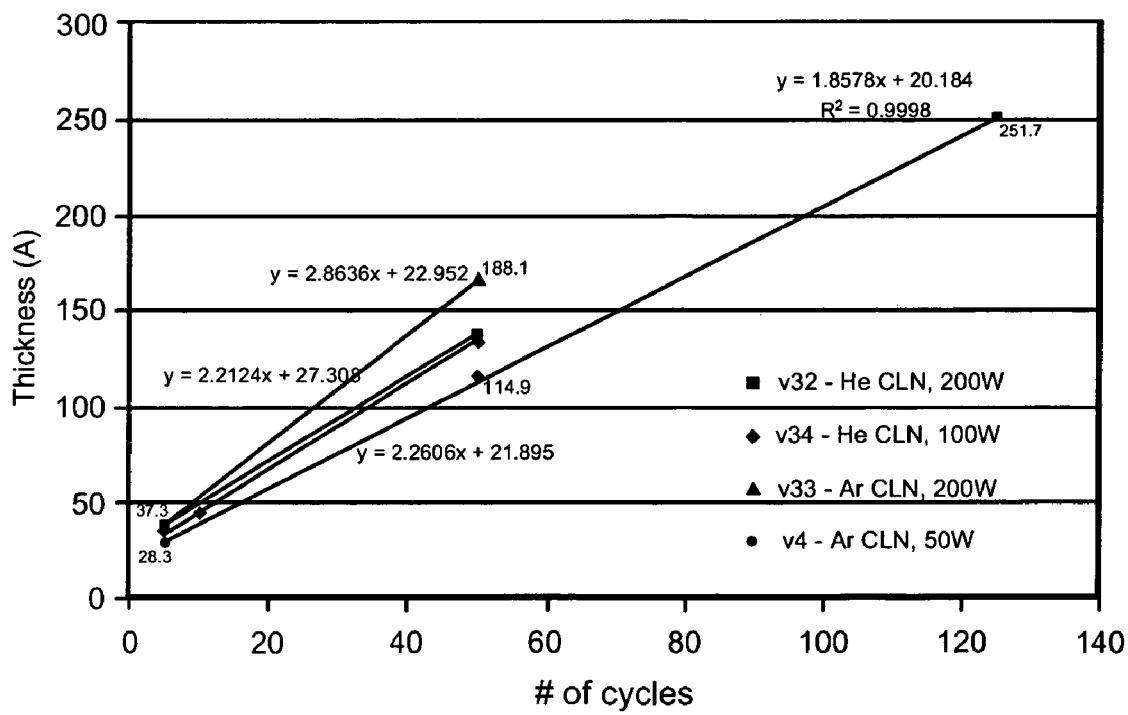
FIG. 17 plots films thickness versus number of dep/treatment cycles, for CVD SiN films formed under a number of conditions between successive cycles.

FIG. 17 plots thickness of SiN films deposited utilizing the cyclic process regime described in Table VII, where the surface is exposed to different conditions between successive dep/treat cycles. FIG. 17 shows that reduction in power applied to generate the Ar cleaning plasma, resulted in a further improvement in deposition rate.

V. Embodiments of Substrate Processing Chambers

Figure 30:
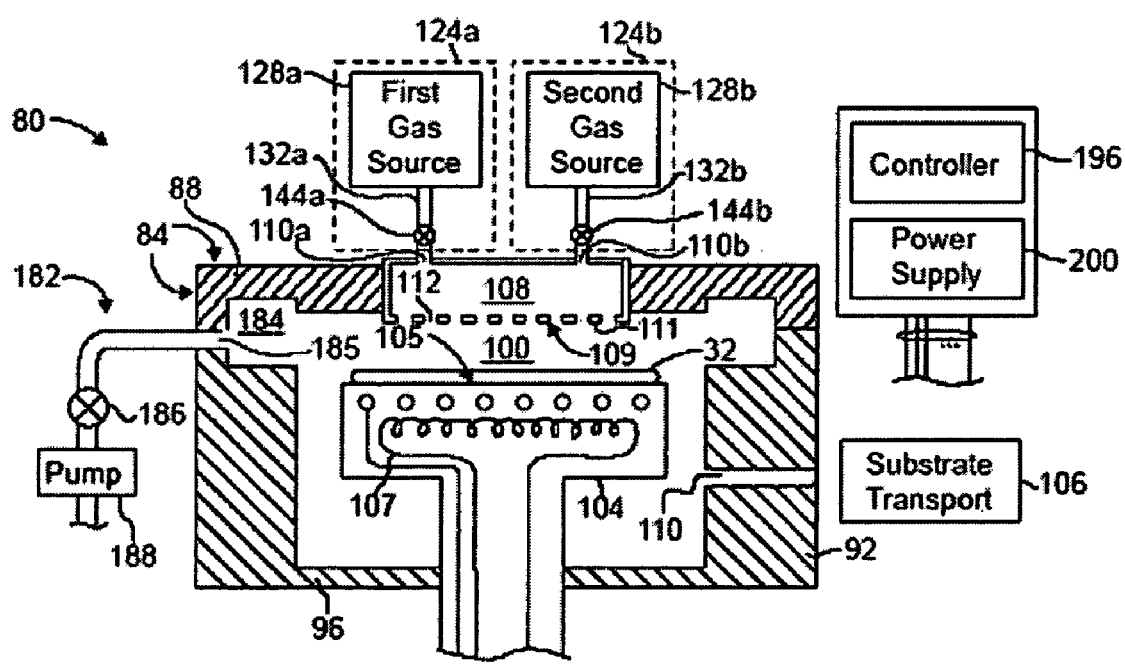
FIG. 30 is a schematic view of an embodiment of a substrate processing chamber that is a PECVD deposition chamber.

An embodiment of a substrate processing chamber 80 that can be used for depositing stressed materials is schematically illustrated in FIG. 30. While an exemplary chamber is used to illustrate the invention, other chambers as would be apparent to one of ordinary skill in the art may also be used. Accordingly, the scope of the invention should not be limited to the exemplary embodiment of the chamber or other components provided herein. Generally, the chamber 80 is a plasma enhanced chemical vapor deposition (PE-CVD) chamber suitable for processing a substrate 32, such as a silicon wafer. For example, a suitable chamber is a Producer® SE type chamber from Applied Materials, Santa Clara, Calif. The chamber 80 comprises enclosure walls 84, which include a ceiling 88, sidewalls 92, and a bottom wall 96, that enclose a process zone 100. The chamber 80 may also comprise a liner (not shown) that lines at least a portion of the enclosure walls 84 about the process zone 100. For processing a 300 mm silicon wafer, the chamber typically has a volume of about 20,000 to about 30,000 $cm^3$, and more typically about 24,000 $cm^3$.

During a process cycle, the substrate support 104 is lowered and a substrate 32 is passed through an inlet port 110 and placed on the support 104 by a substrate transport 106, such as a robot arm. The substrate support 104 can be moved between a lower position for loading and unloading, and an adjustable upper position for processing of the substrate 32. The substrate support 104 can include an enclosed electrode 105 to generate a plasma from process gas introduced into the chamber 80. The substrate support 104 can be heated by heater 107, which can be an electrically resistive heating element (as shown), a heating lamp (not shown), or the plasma itself. The substrate support 104 typically comprises a ceramic structure which has a receiving surface to receive the substrate 32, and which protects the electrode 105 and heater 107 from the chamber environment. In use, a radio frequency (RF) voltage is applied to the electrode 105 and a direct current (DC) voltage is applied to the heater 107. The electrode 105 in the substrate support 104 can also be used to electrostatically clamp the substrate 32 to the support 104. The substrate support 104 may also comprise one or more rings (not shown) that at least partially surround a periphery of the substrate 32 on the support 104.

After a substrate 32 is loaded onto the support 104, the support 104 is raised to a processing position that is closer to the gas distributor 108 to provide a desired spacing gap distance, $d_s$, therebetween. The spacing distance can be from about 2 mm to about 12 mm. The gas distributor 108 is located above the process zone 100 for dispersing a process gas uniformly across the substrate 32. The gas distributor 108 can separately deliver two independent streams of first and second process gas to the process zone 100 without mixing the gas streams prior to their introduction into the process zone 100, or can premix the process gas before providing the premixed process gas to the process zone 100. The gas distributor 108 comprises a faceplate 111 having holes 112 that allow the passage of process gas therethrough. The faceplate 111 is typically made of metal to allow the application of a voltage or potential thereto, and thereby serve as electrode in the chamber 80. A suitable faceplate 111 can be made of aluminum with an anodized coating. The substrate processing chamber 80 also comprises first and second gas supplies 124a, b to deliver the first and second process gas to the gas distributor 108, the gas supplies 124a, b each comprising a gas source 128a, b, one or more gas conduits 132a, b, and one or more gas valves 144a, b. For example, in one version, the first gas supply 124a comprises a first gas conduit 132a and a first gas valve 144a to deliver a first process gas from the gas source 128a to a first inlet 110a of the gas distributor 108, and the second gas supply 124b comprises a second gas conduit 132b and a second gas valve 144b to deliver a second process gas from the second gas source 128b to a second inlet 110b of the gas distributor 108.

The process gas can be energized by coupling electromagnetic energy, for example, high frequency voltage energy to the process gas to form a plasma from the process gas. To energize the first process gas, a voltage is applied between (i) the electrode 105 in the support 104, and (ii) a second electrode 109 which may be the gas distributor 108, ceiling 88 or chamber sidewall 92. The voltage applied across the pair of electrodes 105, 109 capacitively couples energy to the process gas in the process zone 100. Typically, the voltage applied to the electrode 105, 109 is at a radio frequency. Generally, radio frequencies cover the range of from about 3 kHz to about 300 GHz. For the purposes of the present application, low radio frequencies are those which are less than about 1 MHz, and more preferably from about 100 KHz to 1 MHz, such as for example a frequency of about 300 KHz.

Also for the purposes of the present application, high radio frequencies are those from about 3 MHz to about 60 MHz, and more preferably about 13.56 MHz. The selected radio frequency voltage is applied to the first electrode 105 at a power level of from about 10 W to about 1000 W, and the second electrode 109 is typically grounded. However, the particular radio frequency range that is used, and the power level of the applied voltage, depend upon the type of stressed material to be deposited.

The chamber 80 also comprises a gas exhaust 182 to remove spent process gas and byproducts from the chamber 80 and maintain a predetermined pressure of process gas in the process zone 100. In one version, the gas exhaust 182 includes a pumping channel 184 that receives spent process gas from the process zone 100, an exhaust port 185, a throttle valve 186 and one or more exhaust pumps 188 to control the pressure of process gas in the chamber 80. The exhaust pumps 188 may include one or more of a turbo-molecular pump, cryogenic pump, roughing pump, and combination-function pumps that have more than one function. The chamber 80 may also comprise an inlet port or tube (not shown) through the bottom wall 96 of the chamber 80 to deliver a purging gas into the chamber 80. The purging gas typically flows upward from the inlet port past the substrate support 104 and to an annular pumping channel. The purging gas is used to protect surfaces of the substrate support 104 and other chamber components from undesired deposition during the processing. The purging gas may also be used to affect the flow of process gas in a desirable manner.

A controller 196 is also provided to control the activities and operating parameters of the chamber 80. The controller 196 may comprise, for example, a processor and memory. The processor executes chamber control software, such as a computer program stored in the memory. The memory may be a hard disk drive, read-only memory, flash memory or other types of memory. The controller 196 may also comprise other components, such as a floppy disk drive and a card rack. The card rack may contain a single-board computer, analog and digital input/output boards, interface boards and stepper motor controller boards. The chamber control software includes sets of instructions that dictate the timing, mixture of gases, chamber pressure, chamber temperature, microwave power levels, high frequency power levels, support position, and other parameters of a particular process.

The chamber 80 also comprises a power supply 198 to deliver power to various chamber components such as, for example, the first electrode 105 in the substrate support 104 and the second electrode 109 in the chamber. To deliver power to the chamber electrodes 105, 109, the power supply 198 comprises a radio frequency voltage source that provides a voltage having the selected radio frequencies and the desired selectable power levels. The power supply 198 can include a single radio frequency voltage source, or multiple voltage sources that provide both high and low radio frequencies. The power supply 198 and also include an RF matching circuit. The power supply 198 can further comprise an electrostatic charging source to provide an electrostatic charge to an electrode often electrostatic chuck in the substrate support 104. When a heater 107 is used within the substrate support 104, the power supply 198 also includes a heater power source that provides an appropriate controllable voltage to the heater 107. When a DC bias is to be applied to the gas distributor 108 or the substrate support 104, the power supply 198 also includes a DC bias voltage source that is connected to a conducting metal portion of the faceplate 111 of the gas distributor 108. The power supply 198 can also include the source of power for other chamber components, for example, motors and robots of the chamber.

The substrate processing chamber 80 also comprises a temperature sensor (not shown) such as a thermocouple or an interferometer to detect the temperature of surfaces, such as component surfaces or substrate surfaces, within the chamber 80. The temperature sensor is capable of relaying its data to the chamber controller 196 which can then use the temperature data to control temperature of the processing chamber 80, for example, by controlling the resistive heating element in the substrate support 104.

The embodiment of the chamber described above in connection with FIG. 30 is typically configured to perform processing at pressures of about 1 Torr and above. As shown and described above, however, in order to deposit highly conformal films with reasonably high throughput, it may be advantageous to perform processing in a substantially lower pressure regime.

Figure 31:
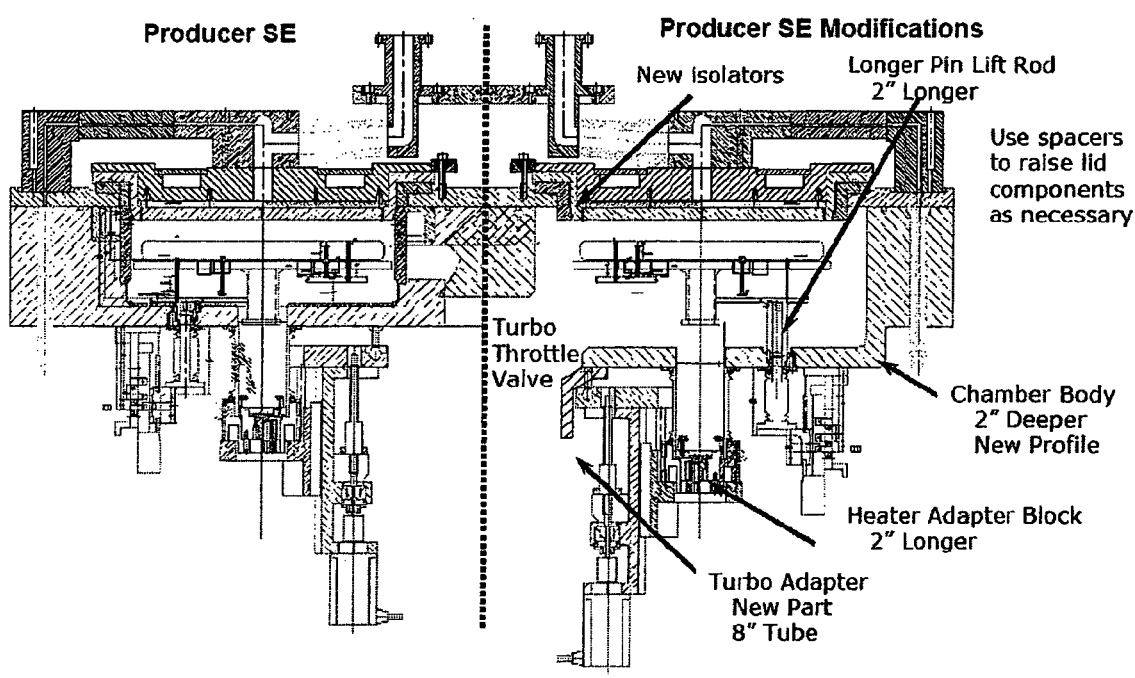
FIG. 31 is a simplified cross-sectional view of a conventional higher pressure processing chamber, and a chamber modified in accordance with an embodiment of the instant invention to operate at lower pressures.
Figure 32:
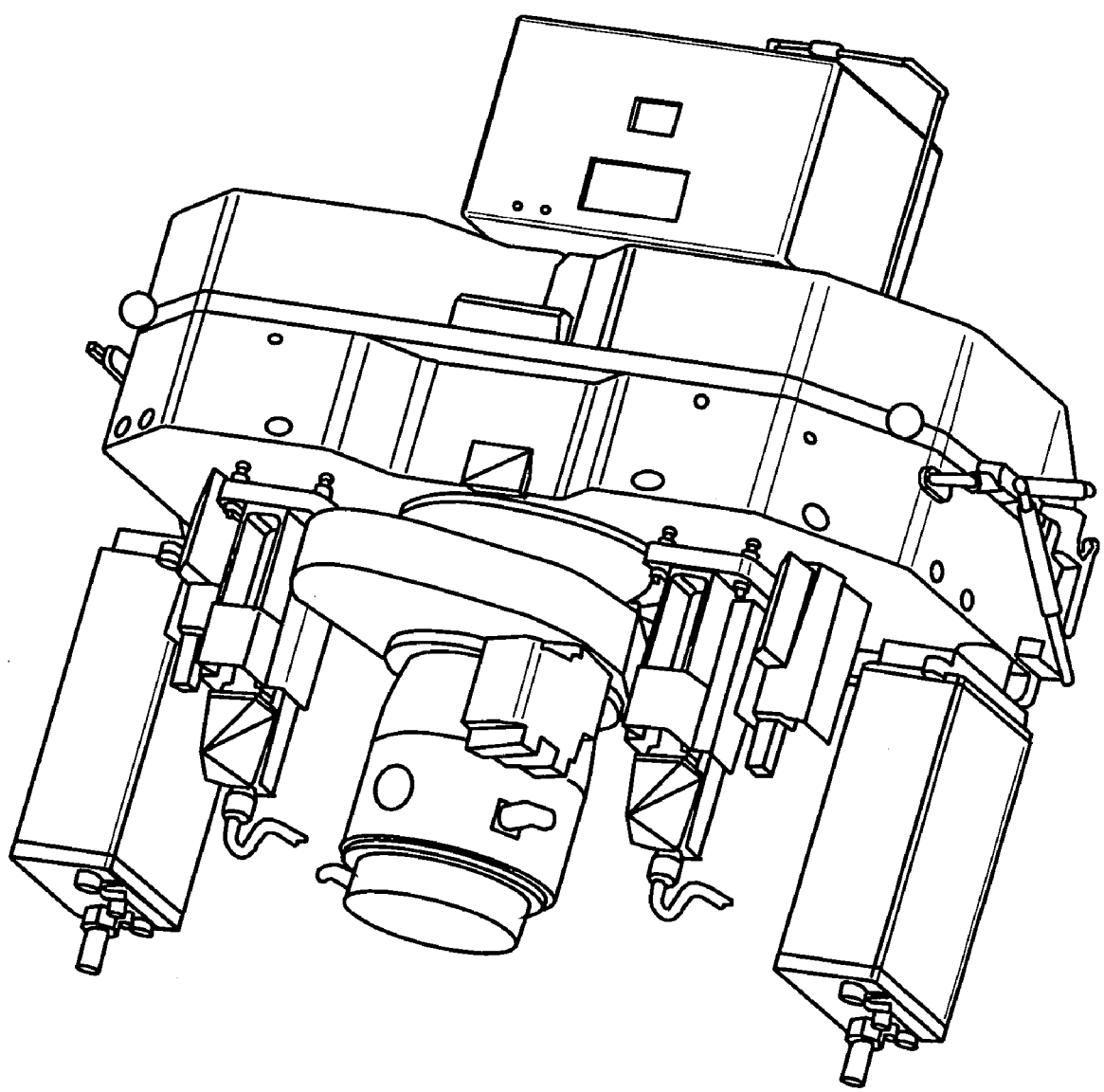
FIG. 32 is a perspective view of the modified chamber shown in cross-sectional in FIG. 31.

Accordingly, FIG. 31 shows a simplified cross-sectional view comparing the processing chambers of the Applied Materials' Producer® SE chamber configured to operate at higher ($\geq 1$ Torr) pressures, and an alternative chamber embodiment configured to operate at lower (~20-150 mTorr) pressures. FIG. 32 shows a perspective view of the modified chamber.

Lower pressure chamber 3100 differs from higher pressure chamber 3102 in the following respects. First the low pressure chamber 3100 has been modified to increase the volume 3102 under the heater 3104 in order to improve turbo pumping symmetry and efficiency. This allows the modified chamber to accommodate a higher power pump (not shown) with an adapter tube 3103 and a turbo throttle valve (not shown) and adding a new turbo adapter tube parts to accommodate these parts. The chamber was redesigned to create a low pressure pump port 3106 located at approximately the height of the wafer pedestal 3108. This in turn involved deepening the chamber body profile by about 2", which in turn involved extending lift pin rods 3110 and heater adapter block 3112 by about the same distance.

In the region overlying the pedestal, isolators 3114 having a measured thickness were employed, and spacers (not shown) were used to raise lid components as necessary.

Different types of stressed materials can be deposited in accordance with embodiments of the present invention. One type of stressed material that is commonly deposited comprises silicon nitride. By silicon nitride it is meant a material having silicon-nitrogen (Si—N) bonds, including materials such as silicon oxy-nitride, silicon-oxygen-hydrogen-nitrogen, and other stoichiometric or non-stoichiometric combinations of silicon, nitrogen, oxygen, hydrogen and even carbon. Exemplary methods to deposit silicon nitride stressed material are described herein to illustrate the invention; however, it should be understood that these methods can also be used to deposit other types of materials, including stressed silicon oxide, stressed dielectric layers, and others. Thus, the scope of the present invention should not be limited to the illustrative stressed silicon nitride embodiment described herein.

Although exemplary embodiments of the present invention are shown and described, those of ordinary skill in the art may devise other embodiments which incorporate the present invention, and which are also within the scope of the present invention. For example, other radiation treatments, such as infrared radiation or selected wavelengths of visible light may also be used to treat the deposited film. Also, a combination of different radiation exposures can also be used. Furthermore, the terms below, above, bottom, top, up, down, first and second and other relative or positional terms are shown with respect to the exemplary embodiments in the FIGS. and are interchangeable. Therefore, the appended claims should not be limited to the descriptions of the preferred versions, materials, or spatial arrangements described herein to illustrate the invention.

What is claimed is:

1. A method of forming silicon nitride, the method comprising:
   disposing a substrate including a surface in a processing chamber;
   exposing the surface to a pre-treatment plasma in the absence of deposition conditions to remove contamination, wherein the pre-treatment plasma is formed in the absence of a hydrogen gas flow; and
   depositing silicon nitride layer over the plasma-treated surface by a chemical reaction in a deposition plasma between a silicon-containing precursor and a nitrogen-containing precursor in the presence of a hydrogen gas flow.

2. The method of claim 1 wherein the pre-treatment plasma is formed from an ambient comprising at least one component selected from ammonia, oxygen, and $N_2O$.

3. The method of claim 1 wherein the silicon nitride is deposited in the presence of the deposition plasma.

4. The method of claim 1 wherein the silicon nitride exhibits a compressive stress of 2.8 GPa or higher.

5. The method of claim 1 further comprising forming a buffer layer over the treated surface prior to deposition of the silicon nitride.

6. The method of claim 5 wherein the silicon nitride is deposited as a film stack comprising an initiation layer formed in the absence of the hydrogen gas flow, followed by a high compressive stress layer formed in the presence of the hydrogen gas flow.

7. A method of forming silicon nitride, the method comprising:
   disposing a substrate including a surface in a processing chamber;
   forming a silicon oxide buffer layer over the surface; and
   depositing silicon nitride over the buffer layer by a chemical reaction in a plasma between a silicon-containing precursor and a nitrogen-containing precursor in the presence of a hydrogen gas flow, wherein the silicon nitride is deposited as a film stack comprising an initiation layer formed in the absence of the hydrogen gas flow, followed by a high compressive stress layer formed in the presence of the hydrogen gas flow.

8. The method of claim 7 wherein forming the buffer layer comprises depositing the silicon oxide layer.

9. The method of claim 7 wherein the silicon nitride exhibits a compressive stress of 2.8 GPa or higher.

10. A method of preventing defects in a device, the method comprising:
    depositing a silicon nitride initiation layer on a surface in the absence of a flow of hydrogen gas;
    depositing a high compressive stress silicon nitride layer on the silicon nitride initiation layer by reaction between a silicon-containing precursor and a nitrogen-containing precursor in a plasma in a presence of a flow of hydrogen gas; and
    etching back the high compressive stress silicon nitride layer with a diluted $NF_3$ plasma.

11. The method of claim 10 wherein the etch back process is performed in the same chamber as the high compressive stress deposition process.

12. The method of claim 10 wherein the etch back process is modulated so that a higher etch rate occurs on isolated areas.

13. The method of claim 10 wherein the high compressive stress silicon nitride layer exhibits a compressive stress of 2.8 GPa or higher.

* * * * *